United States Patent
Koezuka et al.

(10) Patent No.: US 9,923,097 B2
(45) Date of Patent: Mar. 20, 2018

(54) SEMICONDUCTOR DEVICE

(71) Applicant: SEMICONDUCTOR ENERGY LABORATORY CO., LTD., Atsugi-shi, Kanagawa-ken (JP)

(72) Inventors: Junichi Koezuka, Tochigi (JP); Masami Jintyou, Tochigi (JP); Yukinori Shima, Gunma (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 61 days.

(21) Appl. No.: 14/558,857

(22) Filed: Dec. 3, 2014

(65) Prior Publication Data

US 2015/0162452 A1    Jun. 11, 2015

(30) Foreign Application Priority Data

Dec. 6, 2013 (JP) ................................ 2013-253473
Mar. 17, 2014 (JP) ................................ 2014-053865
Jul. 1, 2014 (JP) ................................ 2014-135737

(51) Int. Cl.
*H01L 29/78* (2006.01)
*H01L 29/786* (2006.01)
(Continued)

(52) U.S. Cl.
CPC ...... *H01L 29/78606* (2013.01); *H01L 29/045* (2013.01); *H01L 29/42384* (2013.01);
(Continued)

(58) Field of Classification Search
CPC ....... H01L 29/04; H01L 29/045; H01L 29/49; H01L 29/423; H01L 29/786; H01L 29/78;
(Continued)

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Yang.J et al., "A New Process and Structure for Oxide Semiconductor LCDs", SID Digest '14 : SID International Symposium Digest of Technical Papers, Jun. 3, 2014, pp. 469-472.
(Continued)

*Primary Examiner* — Fazli Erdem
(74) *Attorney, Agent, or Firm* — Fish & Richardson P.C.

(57) ABSTRACT

A semiconductor device includes an oxide semiconductor film, a gate electrode overlapping the oxide semiconductor film with a gate insulating film therebetween, a nitride insulating film in contact with the oxide semiconductor film, and a conductive film in contact with the oxide semiconductor film. The oxide semiconductor film includes a first region in contact with the gate insulating film and a second region in contact with the conductive film. The second region contains an impurity element. The impurity element concentration of the second region is different from that of the first region.

22 Claims, 31 Drawing Sheets

(51) Int. Cl.
*H01L 29/04* (2006.01)
*H01L 29/423* (2006.01)
*H01L 29/49* (2006.01)

(52) U.S. Cl.
CPC ...... *H01L 29/4908* (2013.01); *H01L 29/4966* (2013.01); *H01L 29/7869* (2013.01); *H01L 29/78618* (2013.01); *H01L 29/78693* (2013.01)

(58) Field of Classification Search
CPC ......... H01L 29/78606; H01L 29/42384; H01L 29/4908; H01L 29/4966; H01L 29/78618; H01L 29/7869; H01L 29/78693
See application file for complete search history.

(56) References Cited

U.S. PATENT DOCUMENTS

| | | | |
|---|---|---|---|
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,164,090 B2 | 4/2012 | Iwasaki et al. | |
| 8,293,661 B2 * | 10/2012 | Yamazaki ............ | H01L 21/3003 438/585 |
| 8,344,374 B2 | 1/2013 | Yamazaki et al. | |
| 8,384,076 B2 | 2/2013 | Park et al. | |
| 8,624,240 B2 | 1/2014 | Sato et al. | |
| 8,664,036 B2 * | 3/2014 | Yamazaki ......... | H01L 21/02472 257/E21.46 |
| 8,796,681 B2 | 8/2014 | Yamade et al. | |
| 8,835,918 B2 | 9/2014 | Yamazaki et al. | |
| 8,883,556 B2 | 11/2014 | Yamazaki et al. | |
| 8,969,867 B2 * | 3/2015 | Yamazaki ........... | H01L 29/7869 257/347 |
| 9,087,908 B2 * | 7/2015 | Honda ................ | H01L 29/7869 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0163874 A1 * | 7/2010 | Koyama ................ | H01L 27/12 257/57 |
| 2011/0079778 A1 | 4/2011 | Yamazaki et al. | |
| 2011/0084267 A1 | 4/2011 | Yamazaki et al. | |
| 2011/0089416 A1 * | 4/2011 | Yamazaki ......... | H01L 21/02565 257/43 |
| 2011/0114944 A1 * | 5/2011 | Yamazaki ............... | C04B 35/01 257/43 |
| 2011/0140109 A1 * | 6/2011 | Yamazaki ........... | H01L 27/1225 257/57 |
| 2011/0240998 A1 | 10/2011 | Morosawa et al. | |
| 2012/0001167 A1 * | 1/2012 | Morosawa .......... | H01L 29/7869 257/43 |
| 2012/0161125 A1 * | 6/2012 | Yamazaki ........... | H01L 29/7869 257/43 |
| 2012/0161127 A1 * | 6/2012 | Kato ...................... | G11C 11/404 257/43 |
| 2012/0315730 A1 | 12/2012 | Koezuka et al. | |
| 2012/0315735 A1 | 12/2012 | Koezuka et al. | |
| 2013/0069054 A1 | 3/2013 | Isobe et al. | |
| 2013/0069055 A1 | 3/2013 | Yamazaki et al. | |
| 2013/0181214 A1 * | 7/2013 | Yamazaki ........... | H01L 29/7869 257/43 |
| 2013/0187150 A1 * | 7/2013 | Yamazaki ......... | H01L 29/78696 257/43 |

(56) References Cited

U.S. PATENT DOCUMENTS

| | | | | |
|---|---|---|---|---|
| 2013/0193431 A1* | 8/2013 | Yamazaki | ......... | H01L 29/78693 257/43 |
| 2013/0228775 A1* | 9/2013 | Noda | ................. | H01L 29/7869 257/43 |
| 2013/0292675 A1* | 11/2013 | Tsubuku | ........... | H01L 29/66969 257/57 |
| 2014/0001468 A1 | 1/2014 | Yamazaki et al. | | |
| 2014/0225104 A1* | 8/2014 | Yamazaki | ........... | H01L 29/7869 257/43 |
| 2014/0362317 A1* | 12/2014 | Kubota | ............. | G02F 1/133707 349/39 |
| 2015/0053973 A1* | 2/2015 | Yamazaki | ........... | H01L 27/1225 257/43 |
| 2015/0084045 A1* | 3/2015 | Yamazaki | ........... | H01L 27/1222 257/43 |
| 2015/0108474 A1* | 4/2015 | Yamazaki | ......... | H01L 29/78606 257/43 |
| 2015/0115259 A1* | 4/2015 | Yamazaki | ........... | H01L 27/1225 257/43 |
| 2015/0144945 A1* | 5/2015 | Kusunoki | ............. | H01L 27/124 257/43 |
| 2015/0144946 A1* | 5/2015 | Kusunoki | ......... | G02F 1/133621 257/43 |
| 2015/0155169 A1* | 6/2015 | Oota | ....................... | H01L 28/20 438/104 |
| 2015/0155313 A1* | 6/2015 | Yamazaki | ........... | H01L 27/1255 257/43 |
| 2015/0155505 A1* | 6/2015 | Yamazaki | ........... | H01L 27/1266 257/40 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-220817 A | 8/2007 |
| JP | 2009-278115 A | 11/2009 |
| JP | 2011-228622 A | 11/2011 |
| JP | 2012-033836 A | 2/2012 |
| WO | WO-2004/114391 | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using Castep", Zeitschrift fur Kristallographie, 2005, vol. 220, pp. 567-570.

Coates.D et al., "Optical Studies of the Amorphous Liquid-Cholesteric Liquid Crystal Transition:The 'Blue Phase'", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZNO Thin-Film Transistors Produced At Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZNO TFTS) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl. Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display On Plastic Film And Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 As A Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites For Display Applications", SID Digest '09 : SID International Symposium Digest of Technical Papers, May 31, 2009, pp. 578-581.

(56) References Cited

OTHER PUBLICATIONS

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Spinel,YbFe2O4, and Yb2Fe3O7 Types of Structures for Compounds In The In2O3 and Sc2O3-A2O3-BO System [A; Fe, Ga, or Al; B: Mg, Mn, Fe, Ni, Cu, or Zn] At Temperatures Over 1000° C.", Journal of Solid State Chemistry, 1985, vol. 60, pp. 383-384.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In, Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", JPN. J. Appl. Phys. (Japanese Journal of Applied Physics) , 2006, vol. 45, No. 5B, pp. 4303-4308.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With A Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure To Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of The 16th International Display Workshops, 2009, pp. 689-692.

Son.K et al., "42.4L: Late-News Paper: 4 Inch QVGA AMOLED Driven by the Threshold Voltage Controlled Amorphous GIZO

(56) References Cited

OTHER PUBLICATIONS (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of The 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

\* cited by examiner

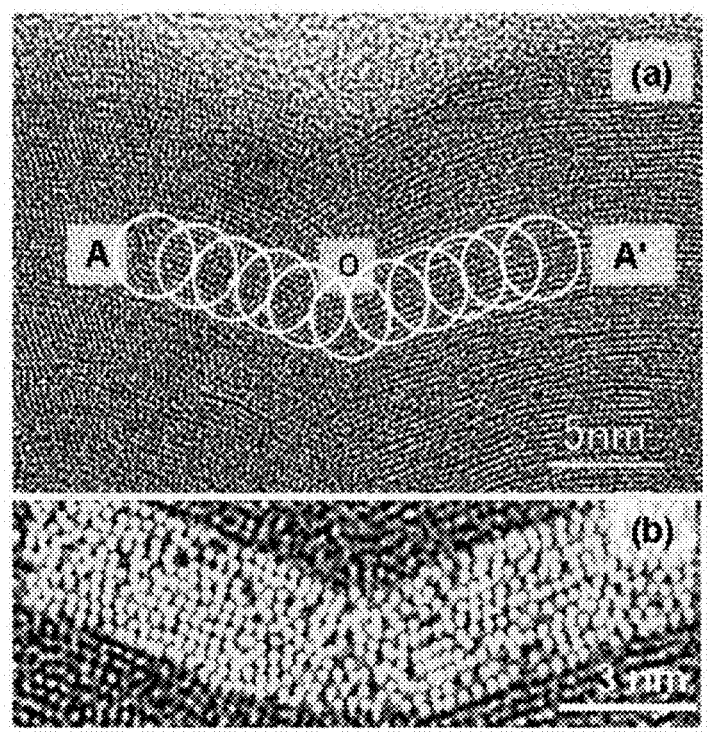
FIG. 13A
FIG. 13B
FIG. 13C
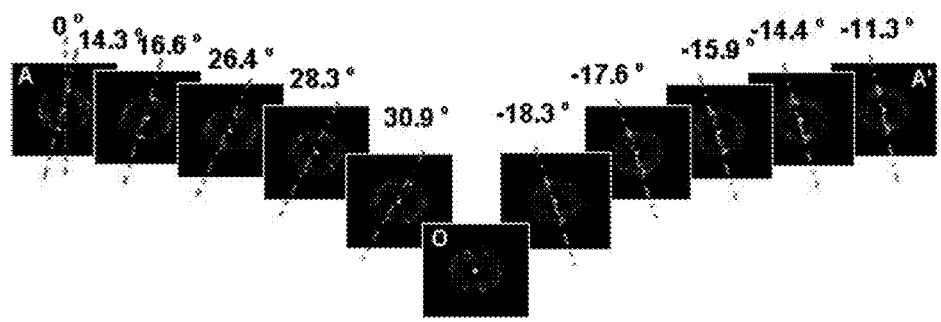

CAAC-OS nc-OS

☐ proportion of non-CAAC   ☰ proportion of CAAC as-sputtered after the heat treatment at 450°C

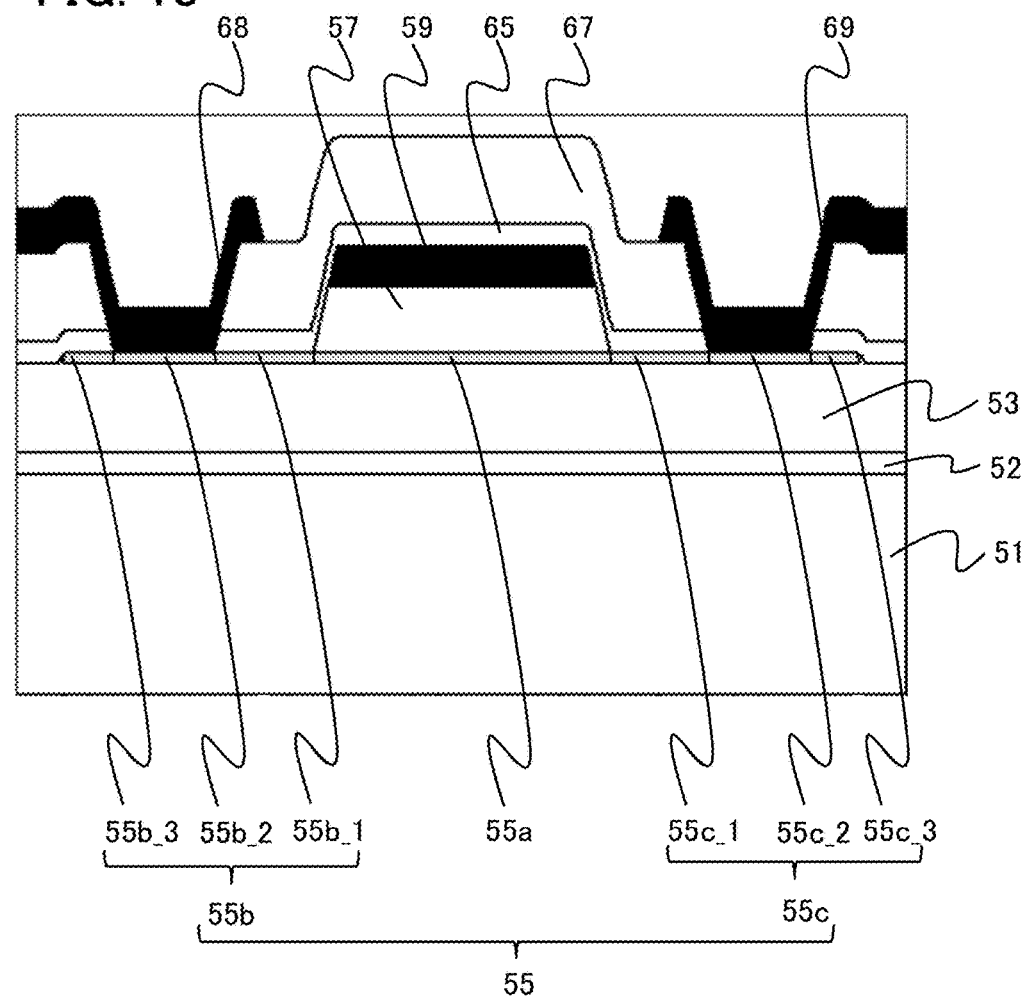

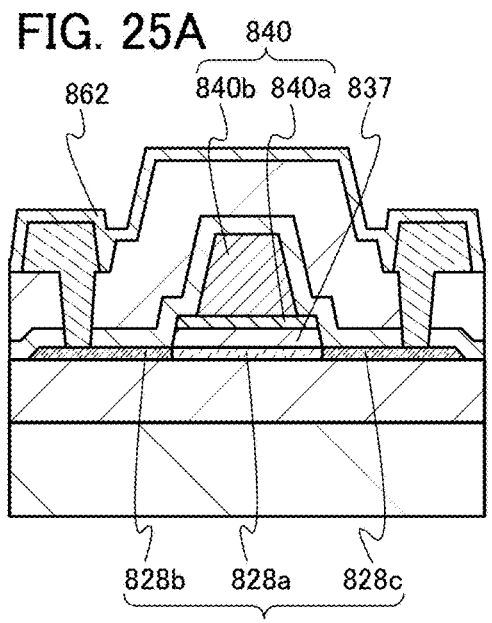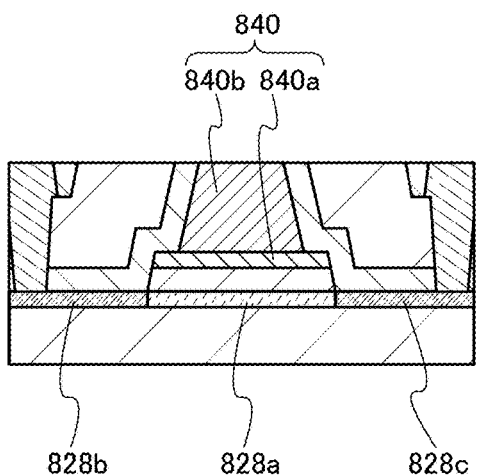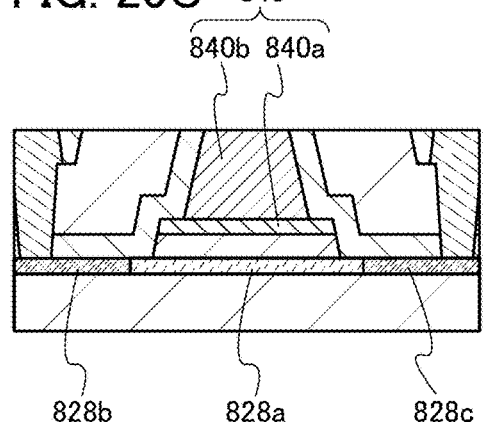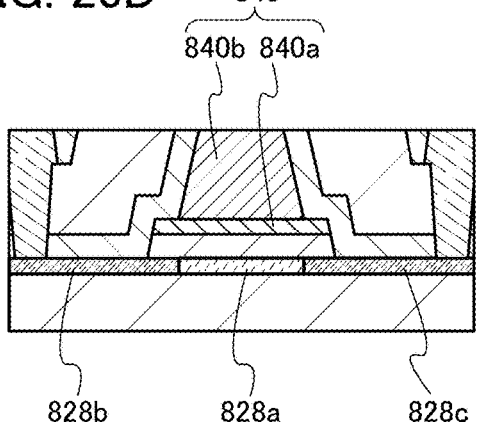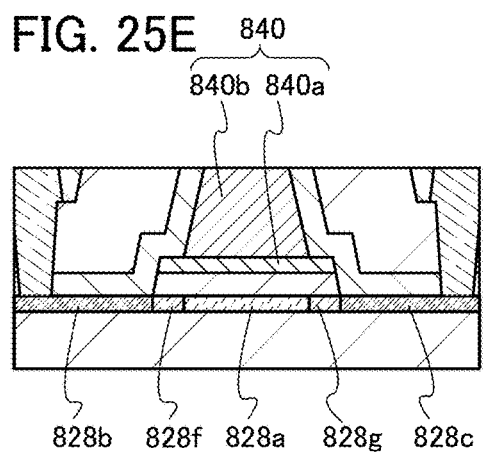

FIG. 29A
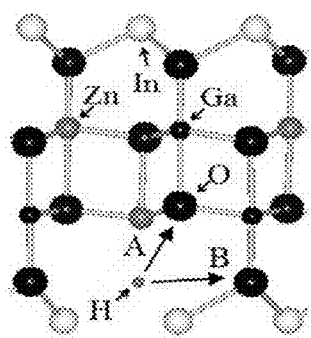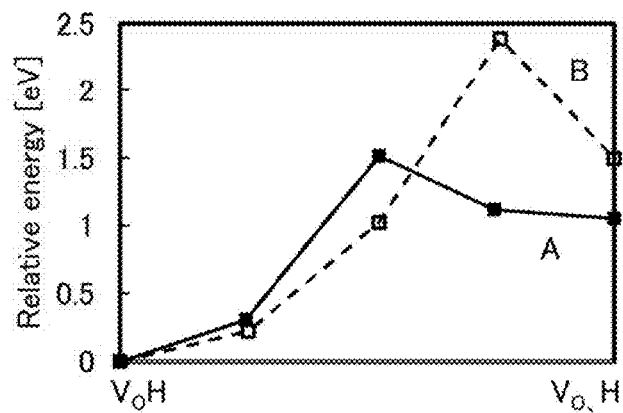
FIG. 29B
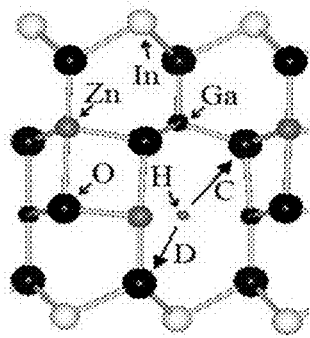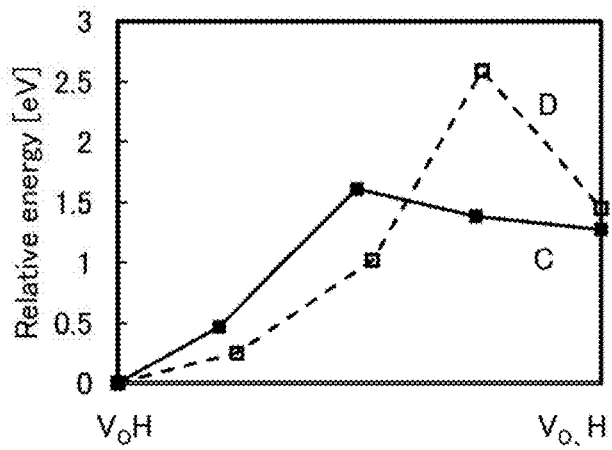

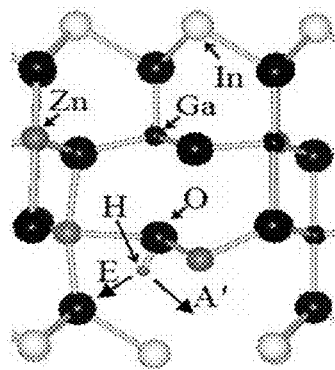
FIG. 30A
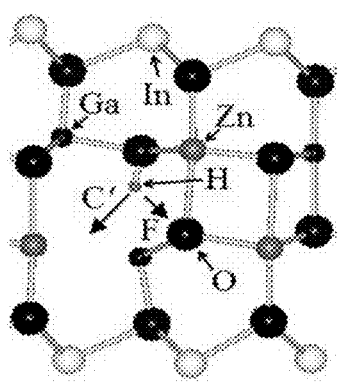
FIG. 30B
FIG. 30C
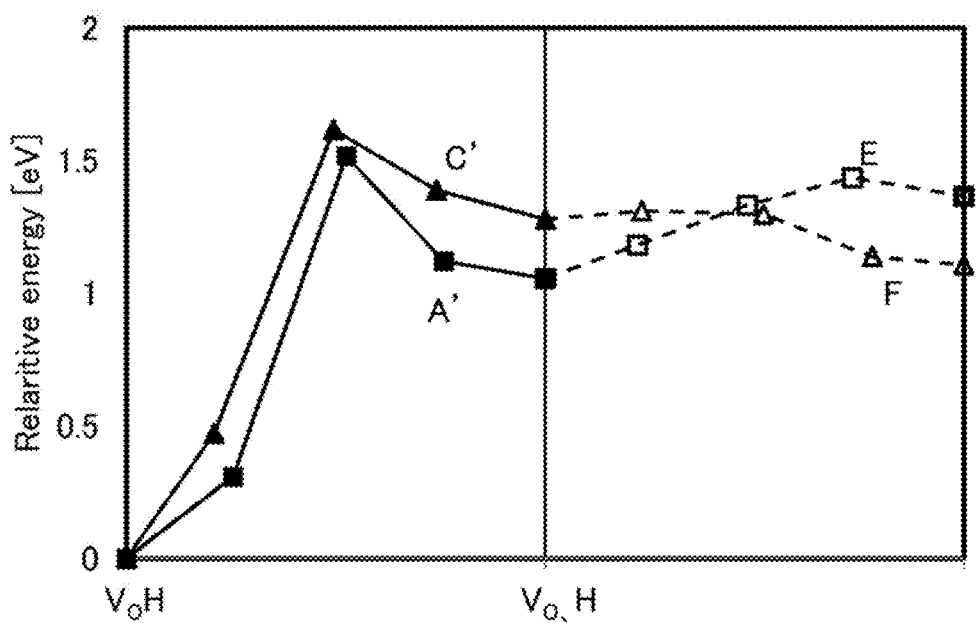

SEMICONDUCTOR DEVICE

BACKGROUND OF THE INVENTION

1. Field of the Invention

The present invention relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a memory device, a driving method thereof, or a manufacturing method thereof. Furthermore in particular, one embodiment of the present invention relates to a semiconductor device including a field-effect transistor.

In this specification and the like, a semiconductor device generally means a device that can function by utilizing semiconductor characteristics. A semiconductor element such as a transistor, a semiconductor circuit, an arithmetic device, and a memory device are each one embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Attention has been focused on a technique for forming a transistor using a semiconductor thin film formed over a substrate having an insulating surface (also referred to as thin film transistor (TFT)). The transistor is used in a wide range of electronic devices such as an integrated circuit (IC) or an image display device (display device). A semiconductor material typified by silicon is widely known as a material for a semiconductor thin film that can be used for a transistor. As another material, an oxide semiconductor has been attracting attention.

A transistor including an oxide semiconductor is required to have better electrical characteristics in order to be used in semiconductor devices with higher performance. For example, a transistor having a self-aligned structure, in which a gate electrode and a gate insulating film are formed over a region of an oxide semiconductor film serving as a channel formation region of the transistor, and a source region and a drain region are formed in such a manner that the resistance of a region of the oxide semiconductor film that is covered with neither the gate electrode nor the gate insulating film is reduced, is reported (see, for example, Patent Document 1).

REFERENCE

Patent Document 1: Japanese Published Patent Application No. 2007-220817
Patent Document 2: Japanese Published Patent Application No. 2011-228622

SUMMARY OF THE INVENTION

In Patent Document 1, in order to form the low-resistance source region and drain region in a self-aligned manner, a silicon nitride film is formed as an interlayer insulating film by a plasma CVD method over the region of the oxide semiconductor film that is covered with neither the gate electrode nor the gate insulating film, and hydrogen included in the silicon nitride film is introduced into the oxide semiconductor film; thus, the low-resistance regions are formed. However, in this method, hydrogen might diffuse to the channel formation region and it is difficult to obtain stable semiconductor characteristics.

In view of the above, an object of one embodiment of the present invention is to provide a self-aligned transistor including an oxide semiconductor film that has excellent electrical characteristics. Another object of one embodiment of the present invention is to provide a method for manufacturing a transistor with small variations in electrical characteristics. Another object of one embodiment of the present invention is to provide a method for manufacturing a display device with low power consumption. Another object of one embodiment of the present invention is to provide a novel method for manufacturing a novel display device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device that includes a transistor including an oxide semiconductor film over an insulating film; a gate insulating film in contact with a first region in the oxide semiconductor film, a gate electrode overlapping the oxide semiconductor film with the gate insulating film therebetween, a nitride insulating film in contact with a second region in the oxide semiconductor film, and a pair of conductive films in contact with the second region in the oxide semiconductor film. The first region and the second region have different impurity element concentrations. Note that the impurity element concentration of the second region is higher than the impurity element concentration of the first region.

Note that the impurity element is a rare gas element and contained in the first region and the second region. Alternatively, the impurity element is any of hydrogen, boron, nitrogen, fluorine, aluminum, and phosphorus and contained in the second region.

The nitride insulating film may be a silicon nitride film.

An oxide insulating film may be provided between the gate electrode and the nitride insulating film. The gate electrode may contain the same metal element as the oxide semiconductor film. In that case, the gate electrode is formed of a conductive oxide semiconductor film.

One embodiment of the present invention can provide a self-aligned transistor including an oxide semiconductor film that has excellent electrical characteristics. One embodiment of the present invention can provide a method for manufacturing the transistor with small variations in electrical characteristics. One embodiment of the present invention can provide a method for manufacturing a display device with low power consumption. One embodiment of the present invention can provide a novel method for manufacturing a novel display device.

Note that the description of these effects does not disturb the existence of other effects. In one embodiment of the present invention, there is no need to obtain all the above effects. Other effects will be apparent from and can be derived from the description of the specification, the drawings, the claims, and the like.

BRIEF DESCRIPTION OF THE DRAWINGS

FIGS. 13A to 13C are cross-sectional TEM images and a local Fourier transform image of an oxide semiconductor.

FIG. 18 is a diagram illustrating a model used for calculation.

FIGS. 25A to 25E are a cross-sectional view and enlarged views each illustrating a structure of a transistor.

FIGS. 29A and 29B show paths through which hydrogen is released from $V_O$ and energy changes.

FIGS. 30A and 30B show paths through which hydrogen is diffused, and FIG. 30C shows energy changes.

DETAILED DESCRIPTION OF THE INVENTION

Figure 1:
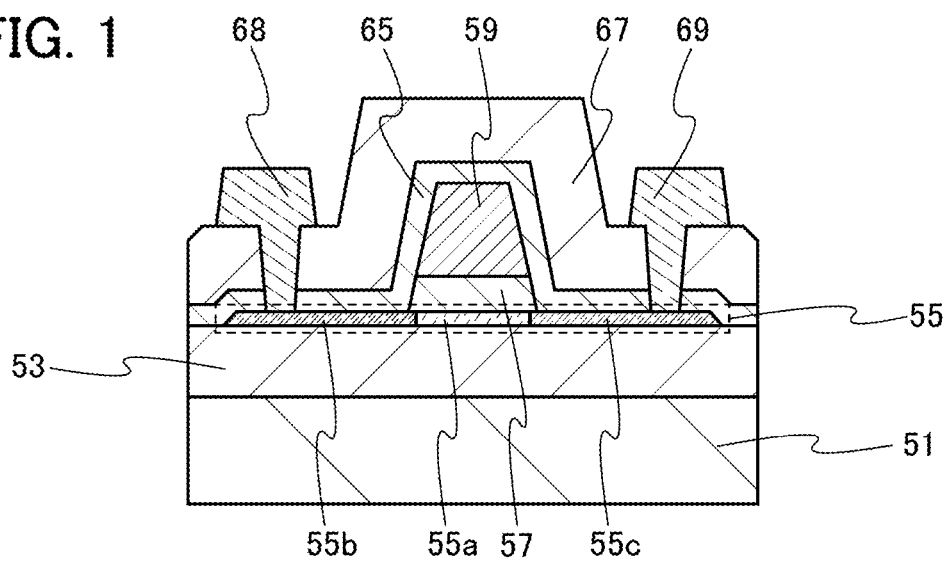
FIG. 1 is a cross-sectional view illustrating one embodiment of a semiconductor device.

Embodiments of the invention disclosed in this specification will be described below with reference to the accompanying drawings. Note that the present invention is not limited to the following description and it is easily understood by those skilled in the art that modes and details of the present invention can be modified in various ways without departing from the spirit and scope of the present invention. Therefore, the present invention disclosed in this specification is not construed as being limited to the description of the following embodiments.

Note that the position, size, range, or the like of each structure illustrated in drawings and the like is not accurately represented in some cases for easy understanding. Therefore, the disclosed invention is not necessarily limited to the position, the size, the range, or the like disclosed in the drawings and the like.

Note that in this specification and the like, ordinal numbers such as "first", "second", and "third" are used in order to avoid confusion among components and do not limit the components numerically.

The term such as "over" or "under" in this specification and the like does not necessarily mean that a component is placed "directly on" or "directly under" another component. For example, the expression "a gate electrode over a gate insulating film" can mean the case where there is an additional component between the gate insulating film and the gate electrode.

In addition, in this specification and the like, the term such as an "electrode" or a "wiring" does not limit a function of a component. For example, an "electrode" is used as part of a "wiring" in some cases, and vice versa. In addition, the term "electrode" or "wiring" can also mean a combination of a plurality of "electrodes" and "wirings" formed in an integrated manner.

Furthermore, functions of a source and a drain might be switched when transistors having different polarities are employed or a direction of current flow is changed in circuit operation, for example. Therefore, the terms "source" and "drain" can be replaced with each other in this specification and the like.

Note that in this specification and the like, the term "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Embodiment 1

In this embodiment, one embodiment of a semiconductor device and one embodiment of a method for manufacturing the semiconductor device are described with reference to FIG. 1, FIGS. 2A to 2D, FIGS. 3A to 3C, and FIG. 4.

FIG. 1 is a cross-sectional view of a top-gate self-aligned transistor that is an example of a transistor in a semiconductor device.

The transistor illustrated in FIG. 1 includes an insulating film 53 over a substrate 51, an oxide semiconductor film 55 over the insulating film 53, a gate insulating film 57 in contact with the oxide semiconductor film 55, and a gate electrode 59 in contact with the gate insulating film 57 and overlapping the oxide semiconductor film 55. Note that the oxide semiconductor film 55 includes a first region 55a and second regions 55b and 55c between which the first region 55a is interposed. The gate electrode 59 overlaps the first region 55a in the oxide semiconductor film 55. A nitride insulating film 65 that is in contact with the second regions 55b and 55c is provided in the transistor.

An insulating film 67 that is in contact with the nitride insulating film 65 may be provided in the transistor. Conductive films 68 and 69 in contact with the second regions 55b and 55c in the oxide semiconductor film 55, respectively, in openings formed in the nitride insulating film 65 and the insulating film 67 may be provided in the transistor.

The first region 55a and the second regions 55b and 55c in the oxide semiconductor film 55 have different impurity element concentrations. Typical examples of the impurity elements are hydrogen, boron, nitrogen, fluorine, aluminum, phosphorus, and rare gas elements. Typical examples of rare gas elements are helium, neon, argon, krypton, and xenon.

In the case where the impurity element is a rare gas element and the oxide semiconductor film 55 is formed by a sputtering method, the first region 55a and the second regions 55b and 55c each contain a rare gas element. In addition, the rare gas element concentrations of the second regions 55b and 55c is higher than that of the first region 55a. The reasons are as follows: in the case where the oxide semiconductor film 55 is formed by a sputtering method, a rare gas is used as a sputtering gas, so that the oxide semiconductor film 55 contains the rare gas; and a rare gas is intentionally added to the second regions 55b and 55c in order to form oxygen vacancies in the second regions 55b and 55c. Note that a gas different from that added to the first region 55a may be added to the second regions 55b and 55c.

In the case where the impurity element is hydrogen, boron, nitrogen, fluorine, aluminum, or phosphorus, the impurity element is contained in only the second regions 55b and 55c. Thus, the impurity element concentrations of the second regions 55b and 55c are higher than the impurity element concentration of the first region 55a.

In addition, in the oxide semiconductor film 55, the first region 55a and the second regions 55b and 55c have different hydrogen concentrations. Specifically, the hydrogen concentrations of the second regions 55b and 55c are higher than that of the first region 55a.

The second regions 55b and 55c in the oxide semiconductor film 55 are in contact with the nitride insulating film 65, so that hydrogen contained in the nitride insulating film 65 is diffused to the second regions 55b and 55c in the oxide semiconductor film 55. Thus, the hydrogen concentrations of the second regions 55b and 55c are higher than that of the first region 55a.

The hydrogen concentration of each of the second regions 55b and 55c, which is measured by secondary ion mass spectrometry (SIMS), is higher than or equal to $8 \times 10^{19}$ atoms/cm$^3$, preferably higher than or equal to $1 \times 10^{20}$ atoms/cm$^3$, further preferably higher than or equal to $5 \times 10^{20}$ atoms/cm$^3$. The hydrogen concentration of the first region 55a, which is measured by SIMS, is lower than or equal to $5 \times 10^{19}$ atoms/cm$^3$, preferably lower than or equal to $1 \times 10^{19}$ atoms/cm$^3$, further preferably lower than or equal to $5 \times 10^{18}$ atoms/cm$^3$, still further preferably lower than or equal to $1 \times 10^{18}$ atoms/cm$^3$, still further preferably lower than or equal to $5 \times 10^{17}$ atoms/cm$^3$, still further preferably lower than or equal to $1 \times 10^{16}$ atoms/cm$^3$.

By setting the hydrogen concentration of the first region 55a in the range described above, generation of electrons serving as carriers in the first region 55a can be suppressed. As a result, the transistor has positive threshold voltage (i.e., normally-off characteristics).

The interaction between oxygen vacancies and hydrogen contained in the oxide semiconductor film reduces the resistivity of the oxide semiconductor film. Specifically, when hydrogen enters oxygen vacancies in the oxide semiconductor film, electrons serving as carriers are generated, which results in high conductivity. In the oxide semiconductor film 55, the second regions 55b and 55c have higher hydrogen concentrations than the first region 55a and have more oxygen vacancies than the first region 55a because of addition of impurity elements. Thus, the resistivity of the second regions 55b and 55c is greater than or equal to $1 \times 10^{-3}$ Ωcm and less than $1 \times 10^{4}$ Ωcm, preferably greater than or equal to $1 \times 10^{-3}$ Ωcm and less than $1 \times 10^{-1}$ Ωcm.

When hydrogen is added to an oxide semiconductor in which oxygen vacancies are formed by addition of impurity elements, hydrogen enters oxygen vacant sites and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. Oxide semiconductors generally have a visible light transmitting property because of their large energy gaps. An oxide conductor has a donor level in the vicinity of the conduction band. Thus, the influence of absorption due to the donor level is small, and an oxide conductor has a visible light-transmitting property comparable to that of an oxide semiconductor.

This means that, in the transistor, the second regions 55b and 55c are each formed of an oxide conductor. In addition, the second regions 55b and 55c each function as a low-resistance region. Thus, the transistor having the structure illustrated in FIG. 1 has high on-state current.

In the transistor described in this embodiment, oxygen vacancies are formed in the second regions 55b and 55c by addition of the impurity elements, and hydrogen is added to the second regions 55b and 55c. This enables the resistivity of the second regions 55b and 55c to be reduced and variations in the resistivity of the second regions 55b and 55c among transistors to be reduced. In other words, by addition of the impurity elements to the second regions 55b and 55c, the resistivity of the second regions 55b and 55c can be controlled.

The structure illustrated in FIG. 1 is described in detail below.

A variety of substrates can be used as the substrate 51 without limitation to a particular type of substrate. Examples of the substrate include semiconductor substrates (e.g., a single crystal substrate and a silicon substrate), an SOI substrate, a glass substrate, a quartz substrate, a plastic substrate, a metal substrate, a stainless steel substrate, a substrate containing stainless steel foil, a tungsten substrate, a substrate containing tungsten foil, a flexible substrate, an attachment film, paper containing a fibrous material, and a base material film. Examples of the glass substrate include a barium borosilicate glass substrate, an aluminoborosilicate glass substrate, and soda lime glass substrate. Examples of the flexible substrate, the attachment film, and the base material film include: plastics typified by polyethylene terephthalate (PET), polyethylene naphthalate (PEN), and polyether sulfone (PES); a synthetic resin such as acrylic;

polypropylene; polyester; polyvinyl fluoride; polyvinyl chloride; polyamide; polyimide; aramid; epoxy; an inorganic vapor deposition film; and paper. Specifically, when a transistor is formed using a semiconductor substrate, a single crystal substrate, an SOI substrate, or the like, it is possible to form a transistor with small variations in characteristics, size, shape, or the like, with high current supply capability, and with a small size. By forming a circuit with the use of such a transistor, power consumption of the circuit can be reduced or the circuit can be highly integrated.

Alternatively, a flexible substrate may be used as the substrate 51, and the transistor may be provided directly on the flexible substrate. Alternatively, a separation layer may be provided between the substrate 51 and the transistor. The separation layer can be used when part or the whole of a semiconductor device formed over the separation layer is completed and separated from the substrate 51 and transferred to another substrate. In such a case, the transistor can be transferred to a substrate having low heat resistance or a flexible substrate. For the above separation layer, a stack including inorganic films, which are a tungsten film and a silicon oxide film, or an organic resin film of polyimide or the like formed over a substrate can be used, for example.

Examples of a substrate to which a transistor is transferred include, in addition to the above substrates over which transistors can be formed, a paper substrate, a cellophane substrate, an aramid film substrate, a polyimide film substrate, a stone substrate, a wood substrate, cloth substrates (including a natural fiber (e.g., silk, cotton, and hemp), a synthetic fiber (e.g., nylon, polyurethane, and polyester), and a regenerated fiber (e.g., acetate, cupra, rayon, and regenerated polyester)), a leather substrate, and a rubber substrate. By using such a substrate, a transistor with excellent characteristics or a transistor with low power consumption can be formed, a device with high durability can be formed, heat resistance can be provided, or reduction in weight or thickness can be achieved.

The insulating film 53 can be formed to have a single-layer structure or a stacked-layer structure using an oxide insulating film or a nitride insulating film. Note that an oxide insulating film is preferably used as at least a region of the insulating film 53 that is in contact with the oxide semiconductor film 55, in order to improve characteristics of the interface with the oxide semiconductor film 55. An oxide insulating film that releases oxygen by being heated is preferably used as the insulating film 53, in which case oxygen contained in the insulating film 53 can be moved to the oxide semiconductor film 55 by heat treatment.

The insulating film 53 can be formed to have a single-layer structure or a stacked-layer structure using, for example, a silicon oxide film, a silicon oxynitride film, a silicon nitride oxide film, a silicon nitride film, an aluminum oxide film, a hafnium oxide film, a gallium oxide film, or a Ga—Zn oxide film.

The oxide semiconductor film 55 is typically formed of a metal oxide film such as an In—Ga oxide film, an In—Zn oxide film, or an In-M-Zn oxide film (M is Al, Ga, Y, Zr, Sn, La, Ce, or Nd). Note that the oxide semiconductor film 55 has a light-transmitting property.

Note that in the case where the oxide semiconductor film 55 contains an In-M-Zn oxide, the proportions of In and M when summation of In and M is assumed to be 100 atomic % are preferably as follows: the proportion of In is greater than 25 atomic % and the proportion of M is less than 75 atomic %, further preferably, the proportion of In is greater than 34 atomic % and the proportion of M is less than 66 atomic %.

The energy gap of the oxide semiconductor film 55 is 2 eV or more, preferably 2.5 eV or more, further preferably 3 eV or more.

The thickness of the oxide semiconductor film 55 is greater than or equal to 3 nm and less than or equal to 200 nm, preferably greater than or equal to 3 nm and less than or equal to 100 nm, further preferably greater than or equal to 3 nm and less than or equal to 50 nm.

In the case where the oxide semiconductor film 55 is an In-M-Zn oxide film (M is Al, Ga, Y, Zr, Sn, La, Ce, or Nd), it is preferable that the atomic ratio of metal elements of a sputtering target used for forming the In-M-Zn oxide film satisfy In≥M and Zn≥M. The sputtering target preferably contains In, M, and Zn at an atomic ratio of 1:1:1, 1:1:1.2, 2:1:1.5, 2:1:2.3, 2:1:3, 3:1:2, or the like. Note that the proportion of each metal element in the atomic ratio of the oxide semiconductor film 55 to be formed varies within a range of ±40% of that in the above atomic ratio of the sputtering target as an error.

When silicon or carbon that is an element belonging to Group 14 is contained in the oxide semiconductor film 55, oxygen vacancies are increased in the oxide semiconductor film 55, and the oxide semiconductor film 55 becomes an n-type film. Thus, the concentration of silicon or carbon in the oxide semiconductor film 55, which is measured by SIMS, is lower than or equal to $2\times10^{18}$ atoms/cm$^3$, preferably lower than or equal to $2\times10^{17}$ atoms/cm$^3$. As a result, the transistor has positive threshold voltage (normally-off characteristics).

The concentration of alkali metal or alkaline earth metal in the oxide semiconductor film 55, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Thus, it is preferable to reduce the concentration of alkali metal or alkaline earth metal in the oxide semiconductor film 55. As a result, the transistor has positive threshold voltage (normally-off characteristics).

In addition, when nitrogen is contained in the oxide semiconductor film 55, electrons serving as carriers are generated to increase the carrier density, so that the oxide semiconductor film 55 easily becomes an n-type film. Thus, a transistor that includes an oxide semiconductor containing nitrogen is likely to be normally on. For this reason, nitrogen in the oxide semiconductor film is preferably reduced as much as possible; the nitrogen concentration, which is measured by SIMS, is preferably set to, for example, lower than or equal to $5\times10^{18}$ atoms/cm$^3$.

When impurities in the oxide semiconductor film 55 are reduced, the carrier density of the oxide semiconductor film 55 can be lowered. The oxide semiconductor preferably has a carrier density of $1\times10^{17}$/cm$^3$ or less, further preferably $1\times10^{15}$/cm$^3$ or less, still further preferably $1\times10^{13}$/cm$^3$ or less, yet further preferably $1\times10^{11}$/cm$^3$ or less.

An oxide semiconductor film with a low impurity concentration and a low density of defect states can be used as the oxide semiconductor film 55, in which case the transistor can have more excellent electrical characteristics. The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor has few carrier generation sources, and thus can have a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and thus has a low density of trap states in some cases. Furthermore, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has small variations in electrical characteristics and high reliability in some cases.

The oxide semiconductor film 55 may have, for example, a non-single-crystal structure. Examples of non-single-crystal structures include a c-axis aligned crystalline oxide semiconductor (CAAC-OS) described later, a polycrystalline structure, a microcrystalline structure described later, and an amorphous structure. Among the non-single-crystal structures, the amorphous structure has the highest density of defect states, whereas CAAC-OS has the lowest density of defect states.

Note that the oxide semiconductor film 55 may be a mixed film including two or more of the following: a region having an amorphous structure, a region having a microcrystalline structure, a region having a polycrystalline structure, a region of CAAC-OS described later, and a region having a single-crystal structure. The mixed film has a single-layer structure including, for example, two or more of a region having an amorphous structure, a region having a microcrystalline structure, a region having a polycrystalline structure, a CAAC-OS region, and a region having a single crystal structure in some cases. Furthermore, the mixed film has a stacked-layer structure including, for example, layers of two or more of a region having an amorphous structure, a region having a microcrystalline structure, a region having a polycrystalline structure, a CAAC-OS region, and a region having a single crystal structure in some cases.

The gate insulating film 57 can be formed to have a single-layer structure or a stacked-layer structure using an oxide insulating film or a nitride insulating film. Note that an oxide insulating film is preferably used as at least a region of the gate insulating film 57 that is in contact with the oxide semiconductor film 55, in order to improve characteristics of the interface with the oxide semiconductor film 55. The gate insulating film 57 can be formed to have a single-layer structure or a stacked-layer structure using, for example, a silicon oxide film, a silicon oxynitride film, a silicon nitride oxide film, a silicon nitride film, an aluminum oxide film, a hafnium oxide film, a gallium oxide film, or a Ga—Zn oxide film.

Furthermore, it is possible to prevent outward diffusion of oxygen from the oxide semiconductor film 55 and entry of hydrogen, water, or the like into the oxide semiconductor film 55 from the outside by providing an insulating film having a blocking effect against oxygen, hydrogen, water, and the like as the gate insulating film 57. Examples of the insulating film having a blocking effect against oxygen, hydrogen, water, and the like include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The gate insulating film 57 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

The thickness of the gate insulating film 57 is greater than or equal to 5 nm and less than or equal to 400 nm, preferably greater than or equal to 10 nm and less than or equal to 300 nm, further preferably greater than or equal to 50 nm and less than or equal to 250 nm.

The gate electrode 59 can be formed using a metal element selected from aluminum, chromium, copper, tantalum, titanium, molybdenum, nickel, iron, cobalt, and tungsten; an alloy containing any of these metal elements as a component; an alloy containing these metal elements in combination; or the like. Furthermore, one or more metal elements selected from manganese and zirconium may be used. The gate electrode 13 may have a single-layer structure or a layered structure of two or more layers. For example, any of the following can be used: a single-layer structure of an aluminum film containing silicon; a single-layer structure of a copper film containing manganese; two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; and a three-layer structure in which a copper film containing manganese, a copper film, and a copper film containing manganese are stacked in this order. Alternatively, an alloy film or a nitride film that contains aluminum and one or more elements selected from titanium, tantalum, tungsten, molybdenum, chromium, neodymium, and scandium may be used.

The gate electrode 59 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide. It is also possible to have a stacked-layer structure using the above light-transmitting conductive material and the above metal element.

The nitride insulating film 65 can be formed using silicon nitride, silicon nitride oxide, aluminum nitride, aluminum nitride oxide, or the like. The hydrogen concentration of the nitride insulating film 65 is preferably higher than or equal to $1\times10^{22}$ atoms/cm$^3$.

The pair of conductive films 68 and 69 is formed to have a single-layer structure or a stacked-layer structure using any of metals such as aluminum, titanium, chromium, nickel, copper, yttrium, zirconium, molybdenum, iron, cobalt, silver, tantalum, and tungsten and an alloy containing any of these metals as a main component. For example, the following structures are given: a single-layer structure of an aluminum film containing silicon; a single-layer structure of a copper film containing manganese; a two-layer structure in which an aluminum film is stacked over a titanium film; a two-layer structure in which an aluminum film is stacked over a tungsten film; a two-layer structure in which a copper film is stacked over a copper-magnesium-aluminum alloy film; a two-layer structure in which a copper film is stacked over a titanium film; a two-layer structure in which a copper film is stacked over a tungsten film; a two-layer structure in which a copper film is stacked over a copper film containing manganese; a three-layer structure in which a titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; and a three-layer structure in which a copper film containing manganese, a copper film, and a copper film containing manganese are stacked in this order. Note that a transparent conductive material containing indium oxide, tin oxide, or zinc oxide may be used.

The insulating film 67 can be formed using the same material as the insulating film 53 or the gate insulating film 57 as appropriate.

Next, a method for manufacturing the transistor illustrated in FIG. 1 is described with reference to FIGS. 2A to 2D and FIGS. 3A to 3C.

The films included in the transistor 10 (i.e., the insulating film, the oxide semiconductor film, the metal oxide film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the deposition method, a thermal CVD method may be used. As the thermal CVD method, for example, a metal organic chemical vapor deposition (MOCVD) method or an atomic layer deposition (ALD) method may be used.

Deposition by the thermal CVD method is performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method is performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute transistor.

Figure 2A:
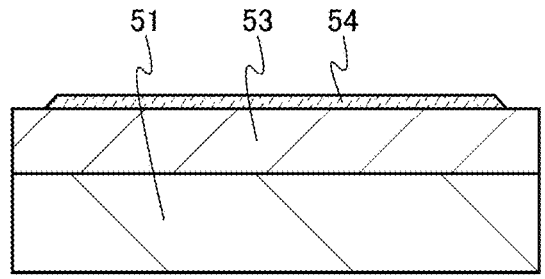
FIGS. 2A to 2D are cross-sectional views illustrating an example of a manufacturing process of a semiconductor device.

As illustrated in FIG. 2A, the insulating film 53 and an oxide semiconductor film 54 are formed over the substrate 51.

The insulating film 53 can be formed by a sputtering method, a CVD method, an evaporation method, a pulsed laser deposition (PLD) method, a printing method, a coating method, or the like as appropriate. The insulating film 53 can be formed in the following manner: an insulating film is formed over the substrate 51, and then oxygen is added to the insulating film. Examples of oxygen added to the insulating film include an oxygen radical, an oxygen atom, an oxygen atomic ion, and an oxygen molecular ion. Oxygen can be added to the insulating film by, for example, an ion doping method, an ion implantation method, or plasma treatment.

A formation method of the oxide semiconductor film 54 is described below. An oxide semiconductor film is formed over the insulating film 53 by a sputtering method, a coating method, a pulsed laser deposition method, a laser ablation method, a thermal CVD method, or the like. Then, after a mask is formed over the oxide semiconductor film by lithography, the oxide semiconductor film is partly etched using the mask. Thus, the oxide semiconductor film 54 illustrated in FIG. 2A can be formed. After that, the mask is removed.

Alternatively, by using a printing method for forming the oxide semiconductor film 54, the oxide semiconductor film 54 subjected to element isolation can be formed directly.

As a power supply device for generating plasma in the case of forming the oxide semiconductor film by a sputtering method, an RF power supply device, an AC power supply device, a DC power supply device, or the like can be used as appropriate.

As a sputtering gas, a rare gas (typically argon), oxygen, or a mixed gas of a rare gas and oxygen is used as appropriate. In the case of using the mixed gas of a rare gas and oxygen, the proportion of oxygen is preferably higher than that of a rare gas.

A target may be selected as appropriate in accordance with the composition of an oxide semiconductor film to be formed.

For example, in the case where the oxide semiconductor film is formed by a sputtering method at a substrate temperature higher than or equal to 150° C. and lower than or equal to 750° C., preferably higher than or equal to 150° C. and lower than or equal to 450° C., more preferably higher than or equal to 200° C. and lower than or equal to 350° C., the oxide semiconductor film can be a CAAC-OS film.

For the deposition of the CAAC-OS film described later, the following conditions are preferably employed.

By suppressing entry of impurities into the CAAC-OS film during the deposition, the crystal state can be prevented from being broken by the impurities. For example, the concentration of impurities (e.g., hydrogen, water, carbon dioxide, or nitrogen) that exist in a deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol. %, preferably 100 vol. %.

After the oxide semiconductor film is formed, dehydrogenation or dehydration may be performed by heat treatment. The temperature of the heat treatment is typically higher than or equal to 150° C. and lower than the strain point of the substrate, preferably higher than or equal to 250° C. and lower than or equal to 450° C., further preferably higher than or equal to 300° C. and lower than or equal to 450° C.

The heat treatment is performed under an inert gas atmosphere containing nitrogen or a rare gas such as helium, neon, argon, xenon, or krypton. Alternatively, the heat treatment may be performed in an inert gas atmosphere first, and then in an oxygen atmosphere. It is preferable that the above inert gas atmosphere and the above oxygen atmosphere not contain hydrogen, water, and the like. The treatment time is longer than or equal to 3 minutes and shorter than or equal to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By forming the oxide semiconductor film while it is heated or performing heat treatment after the formation of the oxide semiconductor film, the hydrogen concentration of the oxide semiconductor film can be lower than or equal to $5\times10^{19}$ atoms/cm$^3$, preferably lower than or equal to $1\times10^{19}$ atoms/cm$^3$, further preferably lower than $5\times10^{18}$ atoms/cm$^3$, still further preferably lower than or equal to $1\times10^{18}$ atoms/cm$^3$, still further preferably lower than or equal to $5\times10^{17}$ atoms/cm$^3$, still further preferably lower than or equal to $1\times10^{16}$ atoms/cm$^3$.

In the case where an oxide semiconductor film, for example, an In—Ga—Zn—O film is formed with a deposition apparatus employing ALD, an In(CH$_3$)$_3$ gas and an O$_3$ gas are sequentially introduced plural times to form an In—O layer, a Ga(CH$_3$)$_3$ gas and an O$_3$ gas are introduced at a time to form a Ga—O layer, and then a Zn(CH$_3$)$_2$ gas and an O$_3$ gas are introduced at a time to form a Zn—O layer. Note that the order of these layers is not limited to this example. A mixed compound layer such as an In—Ga—O layer, an In—Zn—O layer, or a Ga—Zn—O layer may be formed by mixing of these gases. Note that although an H$_2$O gas that is obtained by bubbling with an inert gas such as Ar may be used instead of an O$_3$ gas, it is preferable to use an O$_3$ gas that does not contain H. Instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Alternatively, a Zn (CH$_3$)$_2$ gas may be used.

Here, a 35-nm-thick oxide semiconductor film is formed by a sputtering method, a mask is formed over the oxide semiconductor film, and then part of the oxide semiconductor film is selectively etched. Then, after the mask is removed, heat treatment is performed in a mixed atmosphere containing nitrogen and oxygen. Thus, the oxide semiconductor film 54 is formed.

When the heat treatment is performed at a temperature higher than 350° C. and lower than or equal to 650° C., preferably higher than or equal to 450° C. and lower than or equal to 600° C., it is possible to obtain an oxide semiconductor film whose proportion of CAAC, which is described later, is greater than or equal to 60% and less than 100%, preferably greater than or equal to 80% and less than 100%, further preferably greater than or equal to 90% and less than 100%, still further preferably greater than or equal to 95% and less than or equal to 98%. Furthermore, it is possible to obtain an oxide semiconductor film having a low content of hydrogen, water, and the like. That is, an oxide semiconductor film with a low impurity concentration and a low density of defect states can be formed.

Figure 2B:
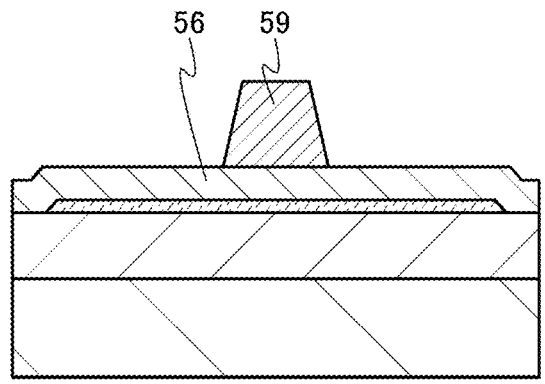

Next, as illustrated in FIG. 2B, an insulating film 56 is formed, and then the gate electrode 59 is formed.

The insulating film 56 becomes a gate insulating film in a later step. The insulating film 56 is formed by a sputtering method, a CVD method, a vacuum evaporation method, a pulsed laser deposition (PLD) method, a thermal CVD method, or the like.

In the case of forming a silicon oxide film or a silicon oxynitride film as the insulating film 56, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

In the case of forming a gallium oxide film as the insulating film 56, a metal organic chemical vapor deposition (MOCVD) method can be employed.

In the case where a hafnium oxide film is formed as the insulating film 56 by a thermal CVD method such as an MOCVD method or an ALD method, two kinds of gases, i.e., ozone (O$_3$) as an oxidizer and a source material gas that is obtained by vaporizing liquid containing a solvent and a hafnium precursor compound (a hafnium alkoxide solution, which is typified by tetrakis(dimethylamide)hafnium (TDMAH)), are used. Note that the chemical formula of tetrakis (dimethylamide)hafnium is Hf[N(CH$_3$)$_2$]$_4$. Examples of another material liquid include tetrakis(ethylmethylamide) hafnium.

In the case where an aluminum oxide film is formed as the insulating film 56 by a thermal CVD method such as an MOCVD method or an ALD method, two kinds of gases, i.e., H$_2$O as an oxidizer and a source material gas that is obtained by vaporizing liquid containing a solvent and an aluminum precursor compound (e.g., trimethylaluminum (TMA)) are used. Note that the chemical formula of trimethylaluminum is Al(CH$_3$)$_3$. Examples of another material liquid include tris(dimethylamide)aluminum, triisobutylaluminum, and aluminum tris(2,2,6,6-tetramethyl-3,5-heptanedionate). Note that the ALD method enables the insulating film 56 to have excellent coverage and small thickness.

In the case where a silicon oxide film is formed as the insulating film 56 by thermal CVD such as an MOCVD method or an ALD method, hexachlorodisilane is adsorbed on a deposition surface, chlorine contained in adsorbate is removed, and radicals of an oxidizing gas (e.g., O$_2$ or dinitrogen monoxide) are supplied to react with the adsorbate.

Here, as the insulating film 56, a silicon oxynitride film is formed by a plasma CVD method.

A formation method of the gate electrode 59 is described below. First, a conductive film is formed by a sputtering method, a vacuum evaporation method, a pulsed laser deposition (PLD) method, a thermal CVD method, or the like, and then a mask is formed over the conductive film by photolithography. Then, part of the conductive film is etched using the mask to form the gate electrode 59. After that, the mask is removed.

Note that the gate electrode 59 may be formed by an electrolytic plating method, a printing method, an inkjet method, or the like instead of the above formation methods.

Alternatively, a tungsten film can be formed as the conductive film with a deposition apparatus employing ALD. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

Figure 2C:
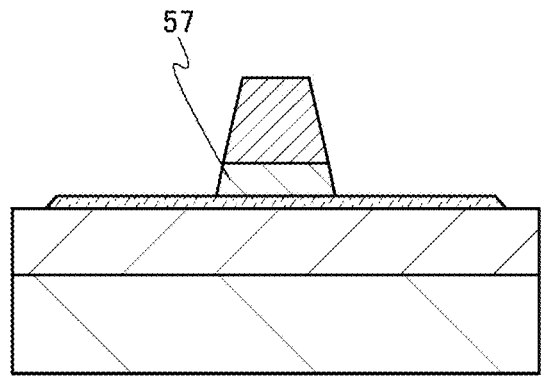

Next, as illustrated in FIG. 2C, the insulating film 56 is etched using the gate electrode 59 as a mask to form the gate insulating film 57.

Figure 2D:
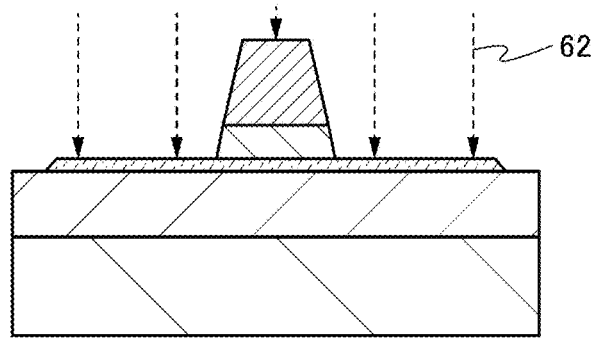

Next, as illustrated in FIG. 2D, an impurity element 62 is added to the oxide semiconductor film 54, using the gate electrode 59 as a mask. As a result, the impurity element 62 is added to a region that is not covered with the gate electrode 59 in the oxide semiconductor film. Note that defects, typically, oxygen vacancies, are formed in the oxide semiconductor film because of damage due to the addition of the impurity element 62.

The impurity element 62 is added by, for example, an ion doping method, an ion implantation method, or plasma treatment.

The addition of the impurity element 62 may be controlled by setting, as appropriate, the implantation conditions such as the accelerated voltage and the dose. For example, in the case where argon is added by an ion implantation method, the acceleration voltage may be set to 10 kV and the dose may be set to greater than or equal to $1 \times 10^{13}$ ions/cm$^2$ and less than or equal to $1 \times 10^{16}$ ions/cm$^2$, for example, $1 \times 10^{14}$ ions/cm$^2$. In the case where phosphorus ions are added by an ion implantation method, the acceleration voltage may be set to 30 kV and the dose may be set to greater than or equal to $1 \times 10^{13}$ ions/cm$^2$ and less than or equal to $5 \times 10^{16}$ ions/cm$^2$, for example, $1 \times 10^{15}$ ions/cm$^2$.

Note that oxygen vacancies may be formed in the oxide semiconductor film 54 by, instead of the addition of the impurity element 62, irradiating the oxide semiconductor film 54 with ultraviolet light or the like. Alternatively, oxygen vacancies may be formed in the oxide semiconductor film 54 by irradiating the oxide semiconductor film 54 with laser.

Figure 3A:
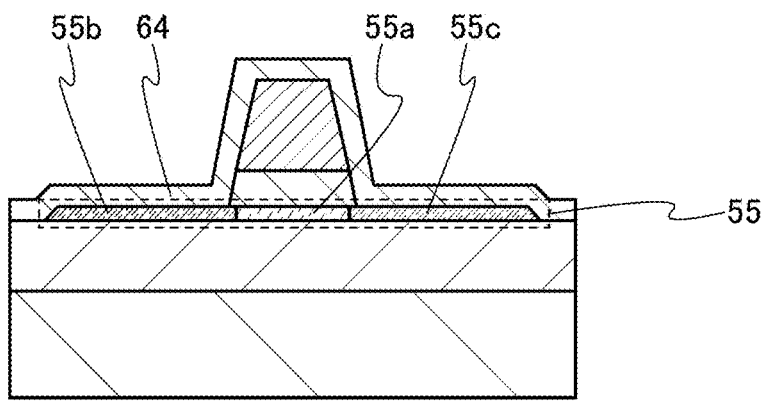
FIGS. 3A to 3C are cross-sectional views illustrating an example of a manufacturing process of a semiconductor device.

Next, as illustrated in FIG. 3A, a nitride insulating film 64 is formed over the oxide semiconductor film 54, the gate insulating film 57, and the gate electrode 59. The nitride insulating film 64 is formed by a sputtering method, a CVD method, a vacuum evaporation method, a pulsed laser deposition (PLD) method, or the like.

Hydrogen is contained in the nitride insulating film 64. Thus, when the nitride insulating film 64 is in contact with the region to which the impurity element is added in the oxide semiconductor film 54, hydrogen contained in the nitride insulating film 64 moves to the region to which the impurity element is added in the oxide semiconductor film. As a result, the oxide semiconductor film 55 that includes the first region 55a to which the impurity element is not added and the second regions 55b and 55c containing the impurity element and hydrogen is formed. Note that since hydrogen contained in the second regions 55b and 55c is partly diffused, parts of the second regions 55b and 55c are overlapped with the gate insulating film 57 in some cases.

The first region 55a is interposed between the second regions 55b and 55c.

The second regions 55b and 55c contain hydrogen and oxygen vacancies formed by the addition of the impurity element. The second regions 55b and 55c have high conductivity because of the interaction between the oxygen vacancies and hydrogen. That is, the second regions 55b and 55c are low-resistance regions.

Next, heat treatment may be performed. The temperature of the heat treatment is typically higher than or equal to 150° C. and lower than the strain point of the substrate, preferably higher than or equal to 200° C. and lower than or equal to 450° C., further preferably higher than or equal to 300° C. and lower than or equal to 450° C. The heat treatment further increases the conductivity of the second regions 55b and 55c.

Figure 3B:
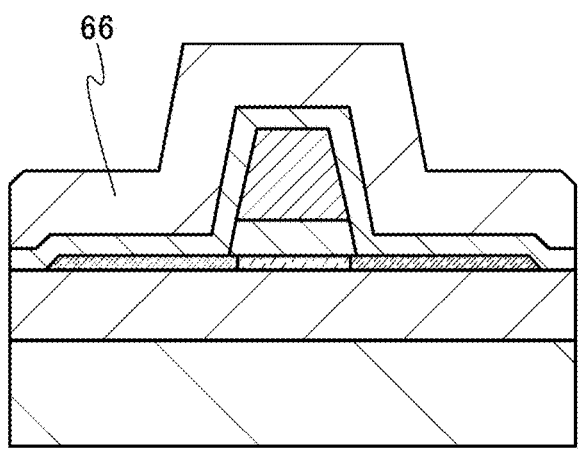

Next, an insulating film 66 may be formed as illustrated in FIG. 3B. The insulating film 66 can reduce the parasitic capacitance between the gate electrode 59 and a pair of conductive films formed later.

Figure 3C:
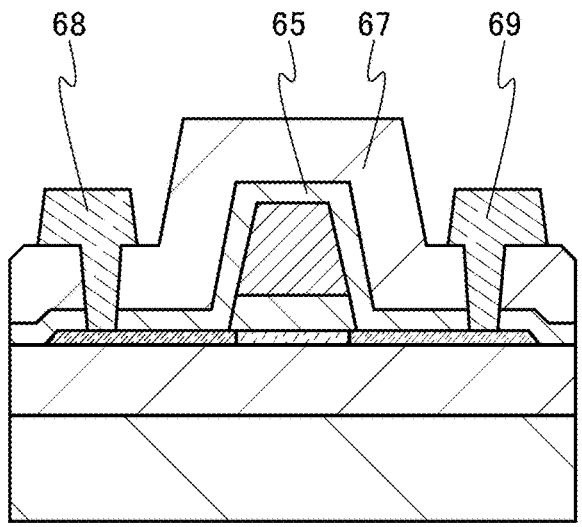

Next, openings are formed in the nitride insulating film 64 and the insulating film 66 to expose parts of the second regions 55b and 55c, and then the pair of conductive films 68 and 69 is formed (see FIG. 3C).

The pair of conductive films 68 and 69 can be formed by a method similar to that of the gate electrode 59 as appropriate.

Through the above-described steps, the transistor can be manufactured.

Since the transistor described in this embodiment does not include a region where the gate electrode 59 overlaps the conductive films 68 and 69, the parasitic capacitance can be reduced and the on-state current is high. In addition, since a low-resistance region can be formed stably in the transistor described in this embodiment, the transistor has higher on-state current and smaller variations in electrical characteristics than a conventional transistor.

<$I_d$-$V_g$ Characteristics of Transistor and Donor Density of Offset Region>

Calculation results of $I_d$-$V_g$ characteristics of a transistor and donor density of an offset region are described here.

FIG. 18 illustrates a model used for the calculation. A transistor illustrated in FIG. 18 includes the substrate 51, an insulating film 52 over the substrate 51, the insulating film 53 over the insulating film 52, the oxide semiconductor film 55 over the insulating film 53, the gate insulating film 57 in contact with the oxide semiconductor film 55, and the gate electrode 59 in contact with the gate insulating film 57. Note that the oxide semiconductor film 55 includes the first region 55a and the second regions 55b and 55c between which the first region 55a is interposed. The gate electrode 59 overlaps the first region 55a in the oxide semiconductor film 55. The second region 55b includes a source or drain region (hereinafter, S/D region) 55b_2 that is in contact with the conductive film 68, an offset region (hereinafter, $L_{off}$ region) 55b_1 between the first region 55a and the S/D region 55b_2, and a region 55b_3. The second region 55c includes an S/D region 55c_2 in contact with the conductive film 69, an $L_{off}$ region 55c_1 between the first region 55a and the S/D region 55c_2, and a region 55c_3. The $L_{off}$ regions 55b_1 and 55c_1 are not overlapped with the gate electrode 59. The nitride insulating film 65 that is in contact with the second regions 55b and 55c is provided in the transistor.

In addition, the insulating film 67 that is in contact with the nitride insulating film 65 is provided in the transistor. In the transistor, the conductive films 68 and 69 in contact with the second regions 55b and 55c in the oxide semiconductor film 55, respectively, is formed in openings in the nitride insulating film 65 and the insulating film 67.

Table 1 shows parameters used for the calculation.

TABLE 1

| Parameters of transistor | Channel length | 6 μm |
|---|---|---|
| | $L_{off}$-length | 2 μm |
| | Channel width | 50 μm |
| Insulating film 67 | Thickness | 400 nm |
| | Dielectric constant | 4.1 |
| Nitride insulating film 65 | Thickness | 100 nm |
| | Dielectric constant | 7.5 |
| Gate electrode 59 | Work function | 5 eV |
| Gate insulating film 57 | Thickness | 50 nm |
| | Dielectric constant | 4.1 |
| Pair of electrodes 68 and 69 | Work function | 4.6 eV |
| Oxide semiconductor film 55 | Thickness | 50 nm |
| | Mobility | 10 cm$^2$/V · sec |
| | Donor density (first region 55a) | 6.60E−09 1/cm$^3$ |
| | Donor density (regions 55b_1, 55c_1) | 1E+14~1E+19 1/cm$^3$ |
| | Donor density (regions 55b_2, 55c_2) | 1.00E+19 1/cm$^3$ |
| | Dielectric constant | 15 |
| | Energy band gap | 3.2 eV |
| | Electron affinity | 4.6 eV |
| Insulating film 53 | (SiOx) Thickness | 400 nm |
| | (SiOx) Dielectric constant | 3.9 |
| Insulating film 52 | (SiNx) Thickness | 100 nm |
| | (SiNx) Dielectric constant | 7.5 |

Figure 19:
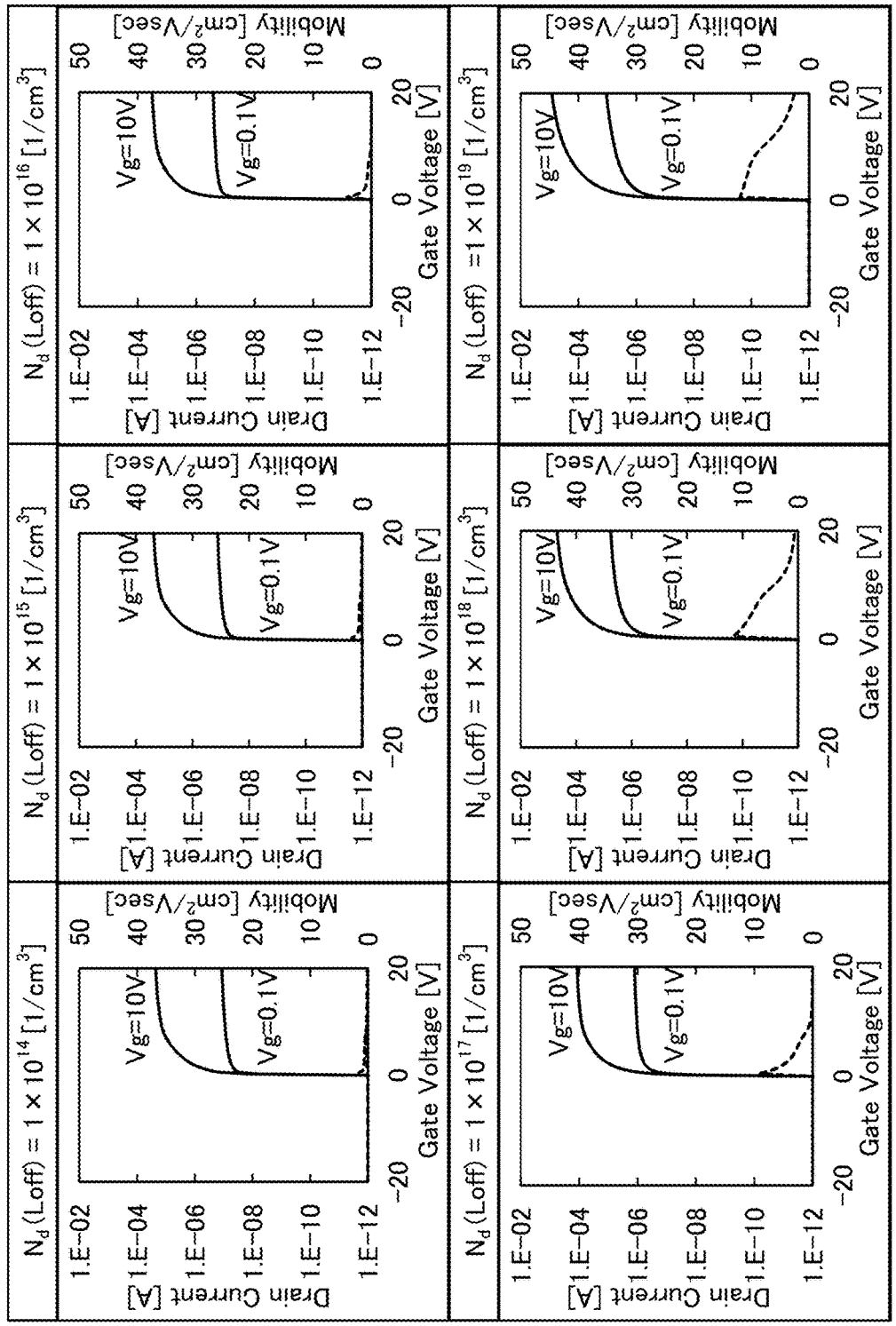
FIG. 19 shows relations between donor density of $L_{off}$ regions and $I_d$-$V_g$ characteristics.

The transistor includes the $L_{off}$ regions 55b_1 and 55c_1. When the $L_{off}$ regions 55b_1 and 55c_1 have low donor density, the $L_{off}$ regions 55b_1 and 55c_1 serve as parasitic resistance, which decreases on-state current. The relation between the $I_d$-$V_g$ characteristics of the transistor and the donor density of the $L_{off}$ regions 55b_1 and 55c_1 and was calculated using the model illustrated in FIG. 18 and the parameters shown in Table 1. FIG. 19 shows calculation results of the $I_d$-$V_g$ characteristics of the transistors in the case where the donor densities of the $L_{off}$ regions are 1×10$^{14}$ [1/cm$^3$], 1×10$^{15}$ [1/cm$^3$], 1×10$^{16}$ [1/cm$^3$], 1×10$^{17}$ [1/cm$^3$], 1×10$^{18}$ [1/cm$^3$], and 1×10$^{19}$ [1/cm$^3$].

As shown in graphs in FIG. 19, when the donor density of the $L_{off}$ region is low, the on-state current and the mobility are low. In contrast, when the donor density of the $L_{off}$ region is high, the on-state current and the mobility are high, and excellent $I_d$-$V_g$ characteristics are obtained.

Figure 20:
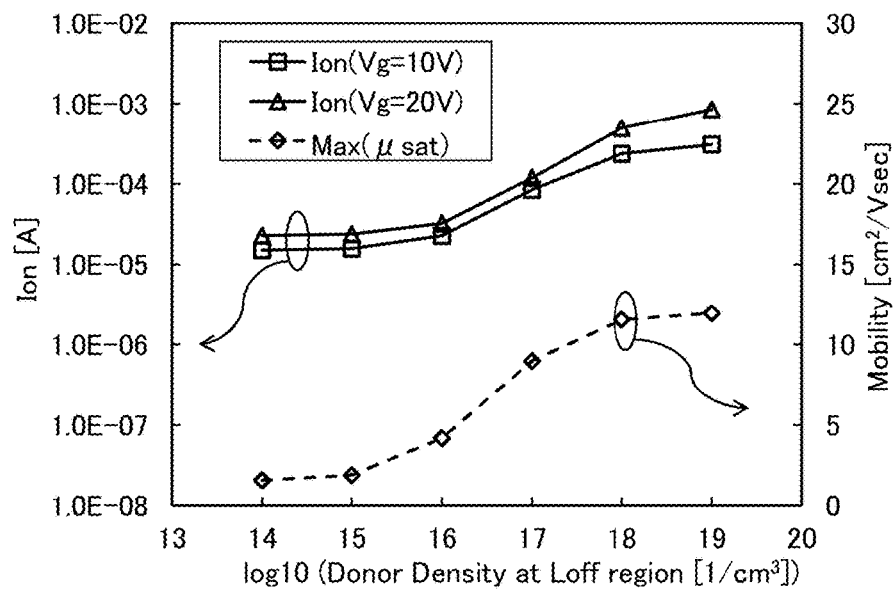
FIG. 20 shows relations of donor density of $L_{off}$ regions to on-state current and field-effect mobility.

FIG. 20 is a graph showing plotted values of on-state current and mobility (maximum saturation mobility) with donor density. In FIG. 20, the left vertical axis represents on-state current, the right vertical axis represents mobility, and the horizontal axis represents the index of the donor density of the $L_{off}$ region. In FIG. 20, a square represents on-state current at a gate voltage of 10 V, a triangle represents on-state current at a gate voltage of 20 V, and a diamond represents mobility at a gate voltage of 10 V.

FIG. 20 indicates that in order to obtain excellent on-state current and mobility, a donor needs to be added to an $L_{off}$ region in an ideal transistor such that the $L_{off}$ region has a donor density of at least 1×10$^{18}$ [1/cm$^3$].

Figure 21:
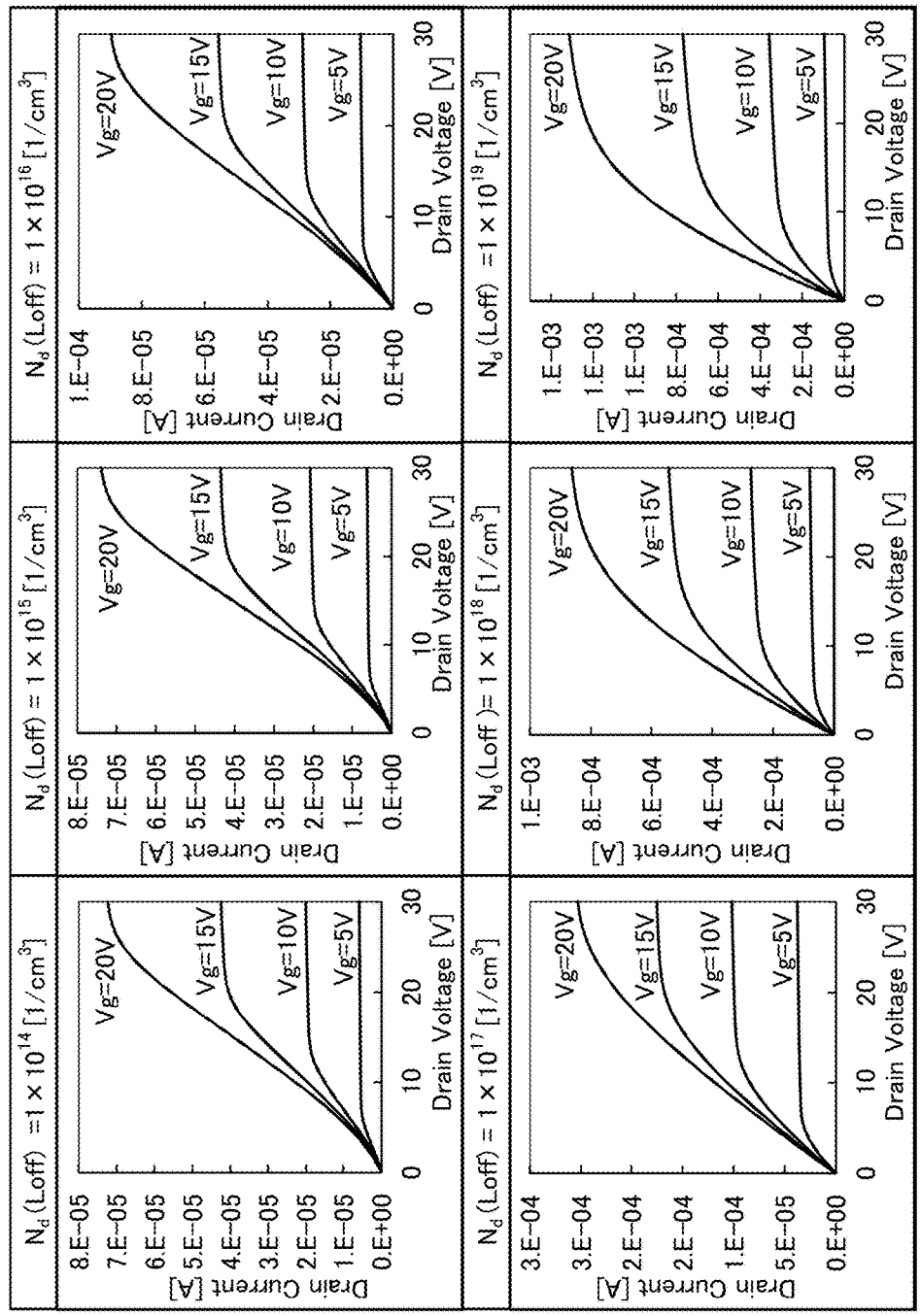
FIG. 21 shows relations between donor density of $L_{off}$ regions and $I_d$-$V_g$ characteristics.

FIG. 21 shows results of calculation of $I_d$-$V_d$ characteristics performed in order to examine saturation characteristics of the transistor. Note that graphs in FIG. 21 have different scales on the vertical axes.

As shown in FIG. 21 showing the $I_d$-$V_d$ characteristics, the shapes of the $I_d$-$V_d$ curves in linear regions of the models having $L_{off}$ regions with a donor density of 1×10$^{17}$ [1/cm$^3$] or lower are different from those of normal FETs. In contrast, the models having $L_{off}$ regions with a donor density of 1×10$^{18}$ [1/cm$^3$] or higher have excellent characteristics in linear regions and saturation regions.

The above calculation results demonstrate that a transistor with excellent $I_d$-$V_d$ characteristics can be manufactured by adding a donor to an $L_{off}$ region such that the $L_{off}$ region has a donor density of at least 1×10$^{18}$ [1/cm$^3$].

<Oxide Conductor Film>

The temperature dependence of the resistivity of a film formed of an oxide conductor (hereinafter, oxide conductor film) is described with reference to FIG. 22.

Samples each including an oxide conductor film are fabricated. As the oxide conductor film, the following are formed: an oxide conductor film (OC_SiN$_x$) formed in such a manner that an oxide semiconductor film is made in contact with a silicon nitride film; an oxide conductor film (OC_Ar dope+SiN$_x$) formed in such a manner that argon is added to an oxide semiconductor film with a doping apparatus and the oxide semiconductor film is made in contact with a silicon nitride film; and an oxide conductor film (OC_Ar plasma+SiN$_x$) formed in such a manner that an oxide semiconductor film is exposed to argon plasma in a plasma treatment apparatus and the oxide semiconductor film is made in contact with a silicon nitride film. Note that the silicon nitride films contain hydrogen.

A method for fabricating the sample including the oxide conductor film (OC_SiN$_x$) is described below. A 400-nm-thick silicon oxynitride film is formed over a glass substrate by a plasma CVD method and then exposed to oxygen plasma to add oxygen ions to the silicon oxynitride film, so that the silicon oxynitride film can release oxygen by being heated. Then, a 100-nm-thick In—Ga—Zn oxide film is formed over the silicon oxynitride film by a sputtering method using an In—Ga—Zn oxide with an atomic ratio of In:Ga:Zn=1:1:1.2 as a sputtering target, subjected to heat treatment at 450° C. in a nitrogen atmosphere, and then subjected to heat treatment at 450° C. in a mixed gas atmosphere of nitrogen and oxygen. After that, a 100-nm-thick silicon nitride film is formed by a plasma CVD method. Then, heat treatment is performed at 350° C. in a mixed gas atmosphere of nitrogen and oxygen.

A method for fabricating the sample including the oxide conductor film (OC_Ar dope+SiN$_x$) is described below. A 400-nm-thick silicon oxynitride film is formed over a glass substrate by a plasma CVD method and then exposed to oxygen plasma to add oxygen ions to the silicon oxynitride film, so that the silicon oxynitride film can release oxygen by being heated. Then, a 100-nm-thick In—Ga—Zn oxide film is formed over the silicon oxynitride film by a sputtering method using an In—Ga—Zn oxide with an atomic ratio of In:Ga:Zn=1:1:1.2 as a sputtering target, subjected to heat treatment at 450° C. in a nitrogen atmosphere, and then subjected to heat treatment at 450° C. in a mixed gas atmosphere of nitrogen and oxygen. Then, argon is added to the In—Ga—Zn oxide film at an acceleration voltage of 10 kV and a dose of $5 \times 10^{14}/cm^2$ with a doping apparatus, whereby oxygen vacancies are formed in the In—Ga—Zn oxide film. After that, a 100-nm-thick silicon nitride film is formed by a plasma CVD method. Then, heat treatment is performed at 350° C. in a mixed gas atmosphere of nitrogen and oxygen.

A method for fabricating the sample including the oxide conductor film (OC_Ar plasma+$SiN_x$) is described below. A 400-nm-thick silicon oxynitride film is formed over a glass substrate by a plasma CVD method and then exposed to oxygen plasma, so that the silicon oxynitride film can release oxygen by being heated. Then, a 100-nm-thick In—Ga—Zn oxide film is formed over the silicon oxynitride film by a sputtering method using an In—Ga—Zn oxide with an atomic ratio of In:Ga:Zn=1:1:1.2 as a sputtering target, subjected to heat treatment at 450° C. in a nitrogen atmosphere, and then subjected to heat treatment at 450° C. in a mixed gas atmosphere of nitrogen and oxygen. Then, in a plasma treatment apparatus, argon plasma is generated and accelerated argon ions are made to collide with the In—Ga—Zn oxide film, whereby oxygen vacancies are formed. After that, a 100-nm-thick silicon nitride film is formed by a plasma CVD method. Then, heat treatment is performed at 350° C. in a mixed gas atmosphere of nitrogen and oxygen.

Figure 22:
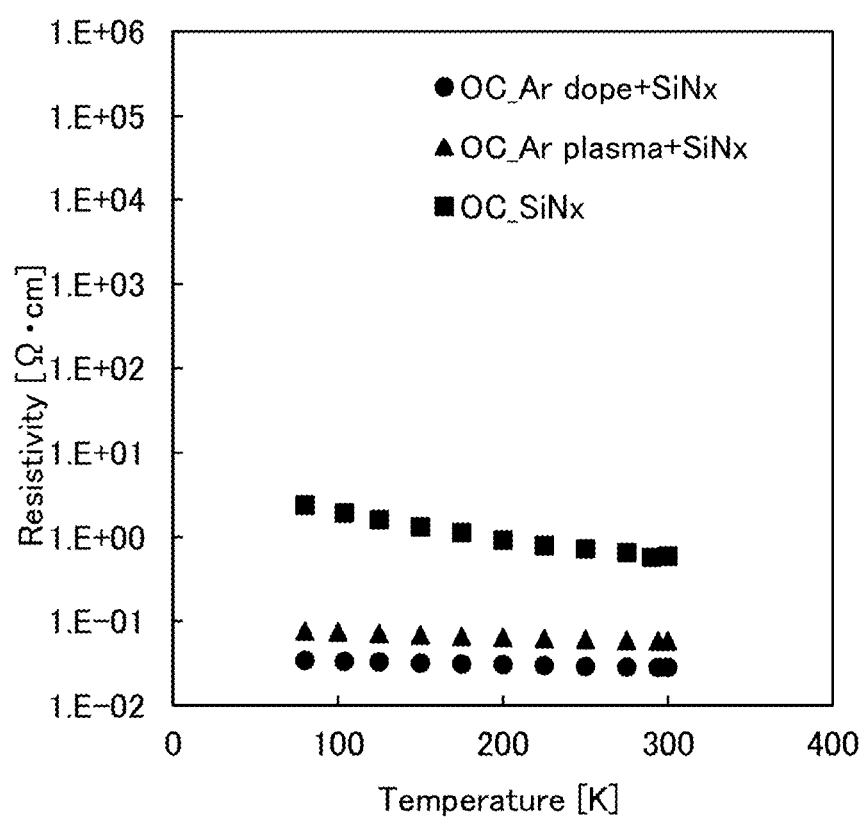
FIG. 22 shows temperature dependence of resistivity.

FIG. 22 shows measured resistivity of each sample. Here, the resistivity is measured by the four-probe Van der Pauw method. In FIG. 22, the horizontal axis represents measurement temperature, and the vertical axis represents resistivity. A square represents the measurement result of the oxide conductor film (OC_$SiN_x$), a circle represents the measurement result of the oxide conductor film (OC_Ar dope+$SiN_x$), and a triangle represents the measurement result of the oxide conductor film (OC_Ar plasma+$SiN_x$).

Note that although not shown in the graph, an oxide semiconductor film that is not in contact with a silicon nitride film has high resistivity that is difficult to measure. This indicates that the oxide conductor film has lower resistivity than the oxide semiconductor film.

As shown in FIG. 22, the oxide conductor film (OC_Ar dope+$SiN_x$) and the oxide conductor film (OC_Ar plasma+$SiN_x$) have small variations in resistivity because the oxide conductor films contain oxygen vacancies and hydrogen. Typically, the range of the variations in resistivity of the oxide conductor films at temperatures from 80 K to 290 K is from more than −20% to less than +20%. Alternatively, the range of the variations in resistivity of the oxide conductor films at temperatures from 150 K to 250 K is from more than −10% to less than +10%. In other words, the oxide conductor is a degenerate semiconductor and it is suggested that the conduction band edge agrees with or substantially agrees with the Fermi level. Thus, when the oxide conductor film is used for a source region and a drain region of a transistor, an ohmic contact is made between the oxide conductor film and conductive films functioning as a source electrode and a drain electrode, so that the contact resistance between the oxide conductor film and the conductive films functioning as a source electrode and a drain electrode can be reduced. In addition, since the temperature dependence of the resistivity of an oxide conductor is low, the amount of change in the contact resistance between the oxide conductor film and the conductive films functioning as a source electrode and a drain electrode is small; thus, a highly reliable transistor can be manufactured.

Modification Example 1

Modification examples of the transistors described in this embodiment are described with reference to FIGS. 23A to 23F, FIGS. 24A to 24F, and FIGS. 25A to 25E. Transistors illustrated in FIGS. 23A to 23F each include an oxide semiconductor film 828 over an insulating film 824 over a substrate 821, an insulating film 837 in contact with the oxide semiconductor film 828, and a conductive film 840 in contract with the insulating film 837 and overlapping the oxide semiconductor film 828. The insulating film 837 functions as a gate insulating film. The conductive film 840 functions as a gate electrode.

The transistors each include an insulating film 846 that is in contact with the oxide semiconductor film 828 and an insulating film 847 that is in contact with the insulating film 846. Conductive films 856 and 857 that are in contact with the oxide semiconductor film 828 in openings in the insulating film 846 and the insulating film 847. Note that the conductive films 856 and 857 function as a source electrode and a drain electrode. An insulating film 862 that is in contact with the insulating film 847 and the conductive films 856 and 857 are also provided.

Note that components of a transistor and a conductive film and an insulating film that are in contact with the components described in another embodiment can be used as appropriate as the components of the transistor and the conductive film and the insulating film that are in contact with the components described in this embodiment.

Figure 23A:
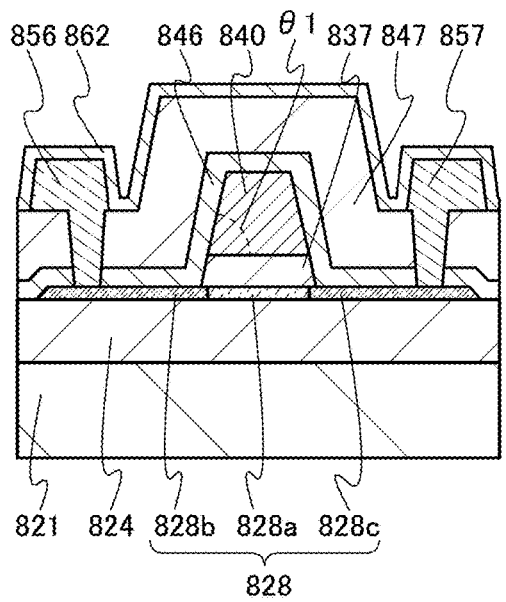
FIGS. 23A to 23F are cross-sectional views and enlarged views each illustrating a structure of a transistor.

In the transistor illustrated in FIG. 23A, the oxide semiconductor film 828 includes a region 828a overlapped with the conductive film 840 and regions 828b and 828c between which the region 828a is interposed. The conductive films 856 and 857 are in contact with regions 828b and 828c, respectively. The region 828a functions as a channel region. The regions 828b and 828c have lower resistivity than the region 828a and thus can be called a low-resistance region. In addition, the regions 828b and 828c function as a source region and a drain region.

Figure 23B:
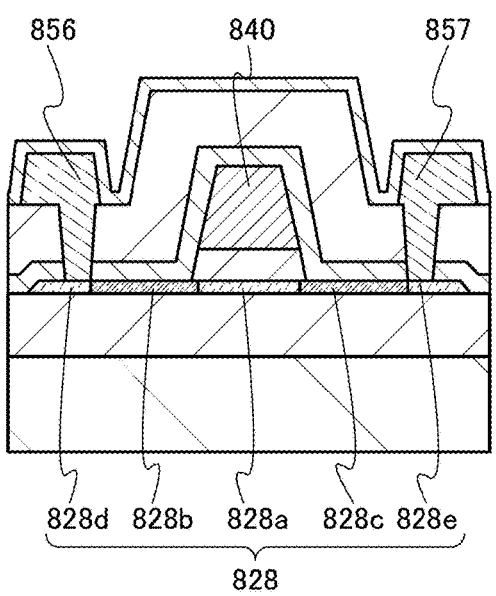

Alternatively, as in the transistor illustrated in FIG. 23B, impurity elements are not necessarily added to regions 828d and 828e in the oxide semiconductor film 828 that are in contact with the conductive films 856 and 857, respectively. In that case, the regions 828b and 828c that contain impurity elements are provided between the region 828a and the regions 828d and 828e that are in contact with the conductive films 856 and 857, respectively. Note that the regions 828d and 828e have conductivity when voltage is applied to the conductive films 856 and 857 and thus function as a source region and a drain region.

Note that the transistor illustrated in FIG. 23B can be manufactured in such a manner that the conductive films 856 and 857 are formed and then impurity elements are added to an oxide semiconductor film using the conductive film 840 and the conductive films 856 and 857 as masks.

An end portion of the conductive film 840 may have a tapered shape. The angle θ1 formed between a surface where the insulating film 837 and the conductive film 840 are in contact with each other and a side surface of the conductive film 840 may be less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°. When the angle θ1 is less than 90°, greater than or equal to 10° and less than or equal to 85°, greater than or equal to 15° and less than or equal to 85°, greater than or equal to 30° and less than or equal to 85°, greater than or equal to 45° and less than or equal to 85°, or greater than or equal to 60° and less than or equal to 85°, the coverage of the side surfaces of the insulating film 837 and the conductive film 840 with the insulating film 846 can be improved.

Next, modification examples of the regions 828b and 828c are described. FIGS. 23C to 23F are each an enlarged view of the oxide semiconductor film 828 illustrated in FIG. 23A and the vicinity thereof. The channel length L indicates the distance between a pair of regions containing impurity elements.

Figure 23C:
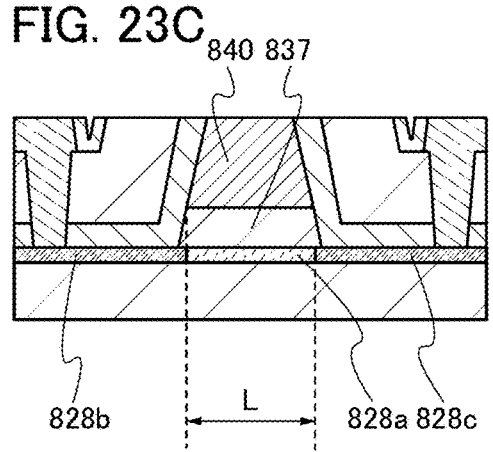

As illustrated in FIG. 23C, in a cross-sectional view in the channel length direction, the boundaries between the region 828a and the regions 828b and 828c are aligned or substantially aligned with the end portion of the conductive film 840 with the insulating film 837 therebetween. In other words, when seen from above, the boundaries between the region 828a and the regions 828b and 828c are aligned or substantially aligned with the end portion of the conductive film 840.

Figure 23D:
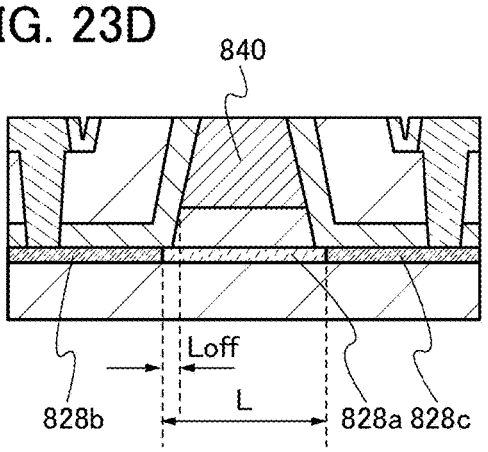

Alternatively, as illustrated in FIG. 23D, in a cross-sectional view in the channel length direction, the region 828a has a region that is not overlapped with the end portion of the conductive film 840. The region functions as an offset region. The length of the offset region in the channel length direction is referred to as $L_{off}$. Note that in the case where a plurality of offset regions are provided, $L_{off}$ indicates the length of one offset region. $L_{off}$ is included in the channel length L. Note that $L_{off}$ is smaller than 20%, smaller than 10%, smaller than 5%, or smaller than 2% of the channel length L.

Figure 23E:
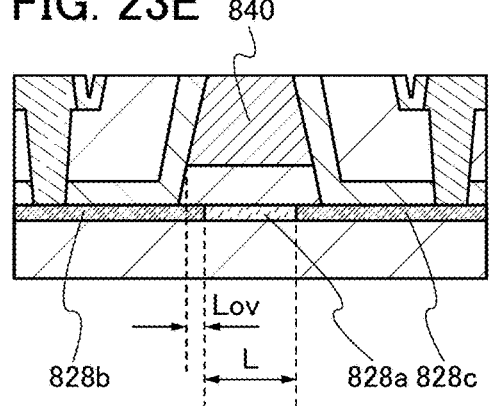

Alternatively, as illustrated in FIG. 23E, in a cross-sectional view in the channel length direction, the regions 828b and 828c each have a region overlapped with the conductive film 840 with the insulating film 837 therebetween. The regions function as an overlap region. The overlap region in the channel length direction is referred to as $L_{ov}$. $L_{ov}$ is smaller than 20%, smaller than 10%, smaller than 5%, or smaller than 2% of the channel length L.

Figure 23F:
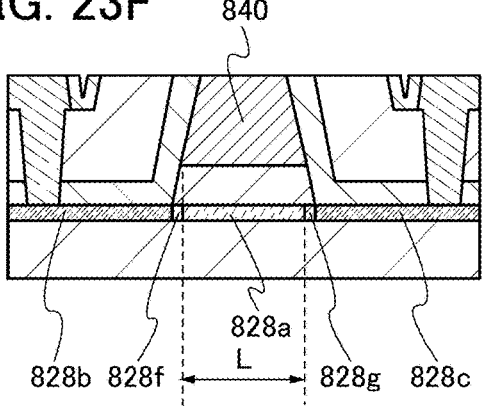

Alternatively, as illustrated in FIG. 23F, in a cross-sectional view in the channel length direction, a region 828f is provided between the region 828a and the region 828b, and a region 828g is provided between the region 828a and the region 828c. The regions 828f and 828g have lower impurity element concentrations and higher resistivity than the regions 828b and 828c. Although the regions 828f and 828g are overlapped with the insulating film 837 in this case, the regions 828f and 828g may be overlapped with the insulating film 837 and the conductive film 840.

Note that although the transistor illustrated in FIG. 23A is described with reference to FIGS. 23C to 23F, the transistor illustrated in FIG. 23B can employ any of the structures in FIGS. 23C to 23F as appropriate.

Figure 24A:
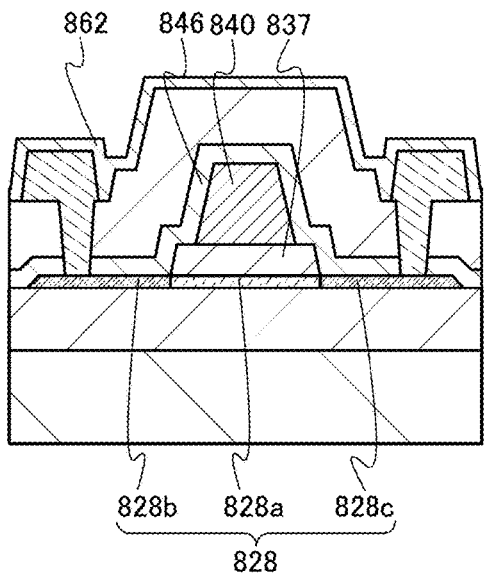
FIGS. 24A to 24F are cross-sectional views and enlarged views each illustrating a structure of a transistor.

In the transistor illustrated in FIG. 24A, the end portion of the insulating film 837 is positioned more on the outside than the end portion of the conductive film 840. In other words, the insulating film 837 has such a shape that the end portion extends beyond the end portion of the conductive film 840. The insulating film 846 can be distanced from the region 828a; thus, nitrogen, hydrogen, and the like contained in the insulating film 846 can be prevented from entering the region 828a functioning as a channel region.

Figure 24B:
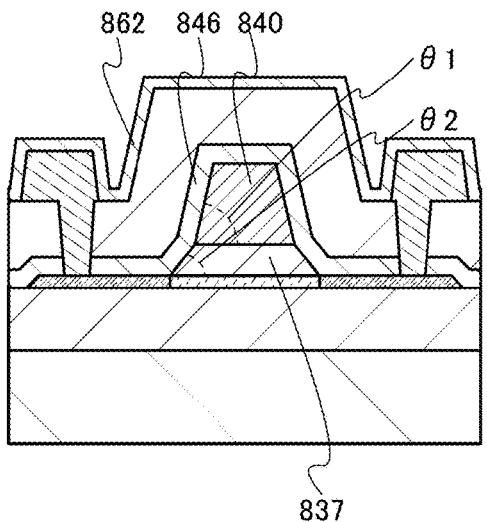

In a transistor illustrated in FIG. 24B, the insulating film 837 and the conductive film 840 have tapered shapes, and the angles of tapered portions of the insulating film 837 and the conductive film 840 are different. That is, angle θ1 between a surface where the insulating film 837 and the conductive film 840 are in contact with each other and a side surface of the conductive film 840 is different from angle θ2 between a surface where the oxide semiconductor film 828 and the insulating film 837 are in contact with each other and a side surface of the insulating film 837. Angle θ2 may be less than 90°, greater than or equal to 30° and less than or equal to 85°, or greater than or equal to 45° and less than or equal to 70°. For example, when angle θ2 is larger than angle θ1, the region 828a can be distanced from the insulating film 846. This can prevent entry of nitrogen, hydrogen, or the like contained in the insulating film 846 into the region 828a functioning as a channel region and can increase the coverage with the insulating film 846. In contrast, when angle θ2 is smaller than angle θ1, the transistor can be miniaturized.

Next, modification examples of the regions 828b and 828c are described with reference to FIGS. 24C to 24F. Note that FIGS. 24C to 24F are each an enlarged view of the oxide semiconductor film 828 illustrated in FIG. 24A and the vicinity thereof.

Figure 24C:
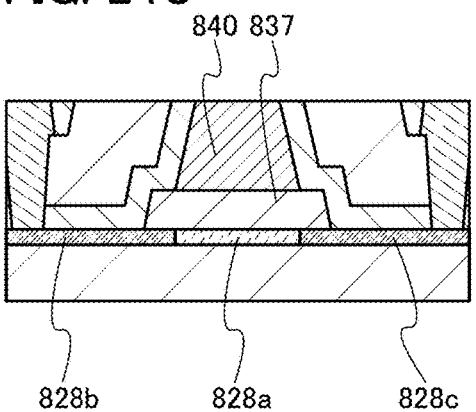

As illustrated in FIG. 24C, in a cross-sectional view in the channel length direction, the boundaries between the region 828a and the regions 828b and 828c are aligned or substantially aligned with the end portion of the conductive film 840 with the insulating film 837 therebetween. In other words, when seen from above, the boundaries between the region 828a and the regions 828b and 828c are aligned or substantially aligned with the end portion of the conductive film 840.

Figure 24D:
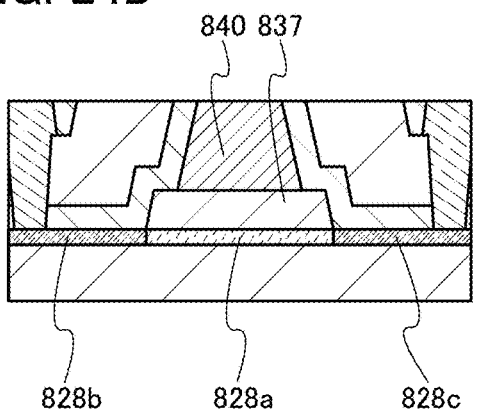

As illustrated in FIG. 24D, in a cross-sectional view in the channel length direction, the region 828a has a region that is not overlapped with the conductive film 840. The region functions as an offset region. In other words, when seen from above, the end portions of the regions 828b and 828c are aligned or substantially aligned with the end portion of the insulating film 837 and are not overlapped with the end portion of the conductive film 840.

Figure 24E:
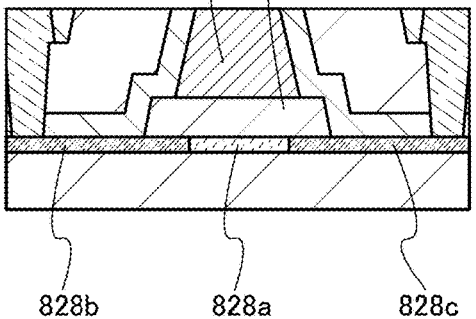

As illustrated in FIG. 24E, in a cross-sectional view in the channel length direction, the regions 828b and 828c each have a region overlapped with the conductive film 840 with the insulating film 837 therebetween. The region is referred to as an overlap region. In other words, when seen from above, the end portions of the regions 828b and 828c are overlapped with the conductive film 840.

Figure 24F:
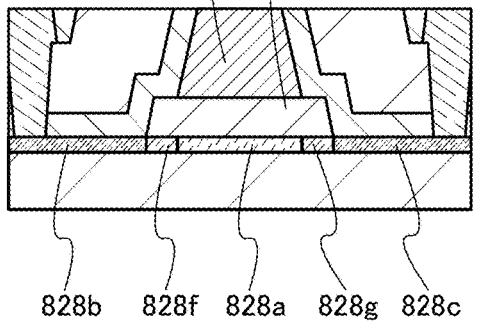

As illustrated in FIG. 24F, in a cross-sectional view in the channel length direction, the region 828f is provided between the region 828a and the region 828b, and the region 828g is provided between the region 828a and the region 828c. The regions 828f and 828g have lower impurity element concentrations and higher resistivity than the regions 828b and 828c. Although the regions 828f and 828g are overlapped with the insulating film 837 in this case, the regions 828f and 828g may be overlapped with the insulating film 837 and the conductive film 840.

Note that although the transistor illustrated in FIG. 24A is described with reference to FIGS. 24C to 24F, the transistor illustrated in FIG. 24B can employ any of the structures in FIGS. 24C to 24F as appropriate.

In the transistor illustrated in FIG. 25A, the conductive film 840 has a stacked-layer structure including a conductive film 840a in contact with the insulating film 837 and a conductive film 840b in contact with the conductive film 840a. The end portion of the conductive film 840a is positioned more on the outside than the end portion of the conductive film 840b. In other words, the conductive film 840a has such a shape that the end portion extends beyond the end portion of the conductive film 840b.

Next, modification examples of the regions 828b and 828c are described. Note that FIGS. 25B to 25E are each an enlarged view of the oxide semiconductor film 828 illustrated in FIG. 25A and the vicinity thereof.

As illustrated in FIG. 25B, in a cross-sectional view in the channel length direction, the boundaries between the region 828a and the regions 828b and 828c are aligned or substantially aligned with the end portion of the conductive film 840a in the conductive film 840 with the insulating film 837 therebetween. In other words, when seen from above, the boundaries between the region 828a and the regions 828b and 828c are aligned or substantially aligned with the end portion of the conductive film 840.

As illustrated in FIG. 25C, in a cross-sectional view in the channel length direction, the region 828a has a region that is not overlapped with the conductive film 840. The region functions as an offset region. In other words, when seen from above, the end portions of the regions 828b and 828c are not overlapped with the end portion of the conductive film 840.

As illustrated in FIG. 25D, in a cross-sectional view in the channel length direction, the regions 828b and 828c each have a region overlapped with the conductive film 840, specifically the conductive film 840a. The region is referred to as an overlap region. In other words, when seen from above, the end portions of the regions 828b and 828c are overlapped with the conductive film 840a.

As illustrated in FIG. 25E, in a cross-sectional view in the channel length direction, the region 828f is provided between the region 828a and the region 828b, and the region 828g is provided between the region 828a and the region 828c. Impurity elements are added to the regions 828f and 828g through the conductive film 840a; thus, the regions 828f and 828g have lower impurity element concentrations and higher resistivity than the regions 828b and 828c. Although the regions 828f and 828g are overlapped with the conductive film 840a, the regions 828f and 828g may be overlapped with both the conductive film 840a and the conductive film 840b.

The end portion of the insulating film 837 may be positioned more on the outside than the end portion of the conductive film 840a.

Alternatively, the side surface of the insulating film 837 may be curved.

Alternatively, the insulating film 837 may have a tapered shape. In other words, the angle formed between a surface where the oxide semiconductor film 828 and the insulating film 837 are in contact with each other and the side surface of the insulating film 837 may be less than 90°, preferably greater than or equal to 30° and less than 90°.

As described with FIG. 25E, the oxide semiconductor film 828 includes the regions 828f and 828g that have lower impurity element concentrations and higher resistivity than the regions 828b and 828c, whereby the electric field of a drain region can be relaxed. Thus, deterioration of the transistor due to the electric field of the drain region, such as a shift of the threshold voltage of the transistor, can be inhibited.

Modification Example 2

Figure 4:
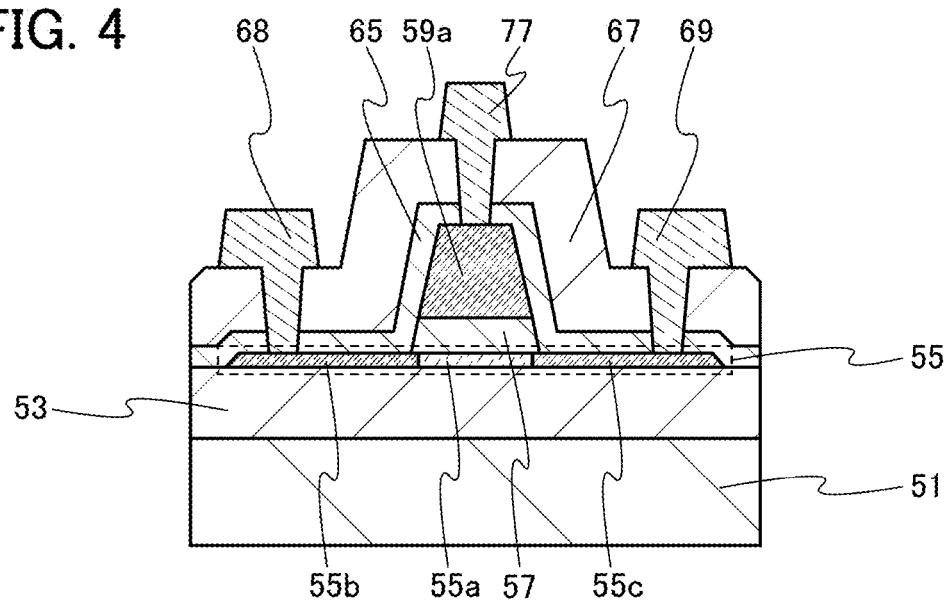
FIG. 4 is a cross-sectional view illustrating one embodiment of a semiconductor device.

Although the gate electrode 59 is formed of a conductive film in this embodiment, a gate electrode 59a may be formed of a conductive oxide semiconductor film similarly to the second regions 55b and 55c in the oxide semiconductor film 55 (see FIG. 4). The conductive oxide semiconductor film has a light-transmitting property like the oxide semiconductor film 55. This enables a transistor with a light-transmitting property to be manufactured.

Note that the conductive oxide semiconductor film has higher resistivity than a conductive film formed of a metal; thus, a conductive film 77 connected to the gate electrode 59a is preferably formed over the insulating film 67 in the case where a large substrate is used as the substrate 51.

Next, a method for manufacturing the transistor illustrated in FIG. 4 is described with reference to FIGS. 2A to 2D and FIGS. 3A to 3C.

In a step illustrated in FIG. 2B, an oxide semiconductor film is formed instead of the gate electrode 59.

After that, the gate insulating film 57 is formed as illustrated in FIG. 2C, and then the impurity element 62 is added to the oxide semiconductor film 54 and the oxide semiconductor film over the gate insulating film 57.

Then, the nitride insulating film 64 is formed as illustrated in FIG. 3A, so that the gate electrode 59a can be formed of the conductive oxide semiconductor film (see FIG. 4) similarly to the second regions 55b and 55c in the oxide semiconductor film 55.

After that, the insulating film 67 having openings is formed, and then the conductive film 77 connected to the gate electrode 59a (see FIG. 4) and the pair of conductive films 68 and 69 are formed in a similar manner.

Through the above-described steps, a self-aligned transistor can be manufactured.

Modification Example 3

Figure 5A:
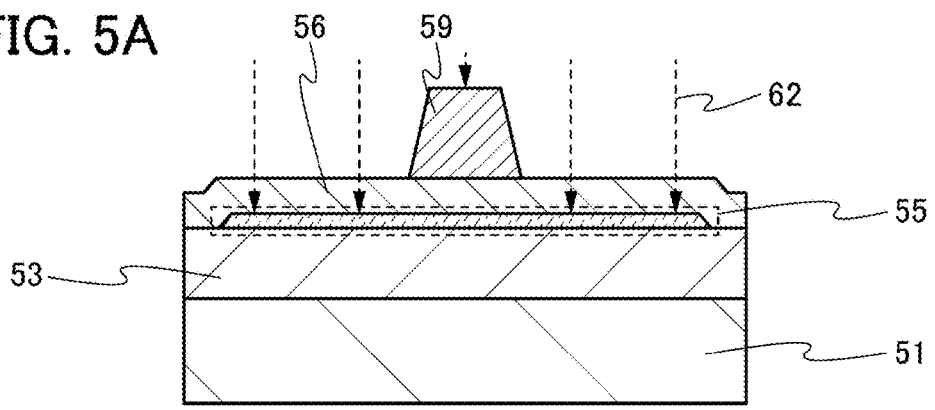
FIGS. 5A and 5B are cross-sectional views illustrating an example of a manufacturing process of a semiconductor device.
Figure 5B:
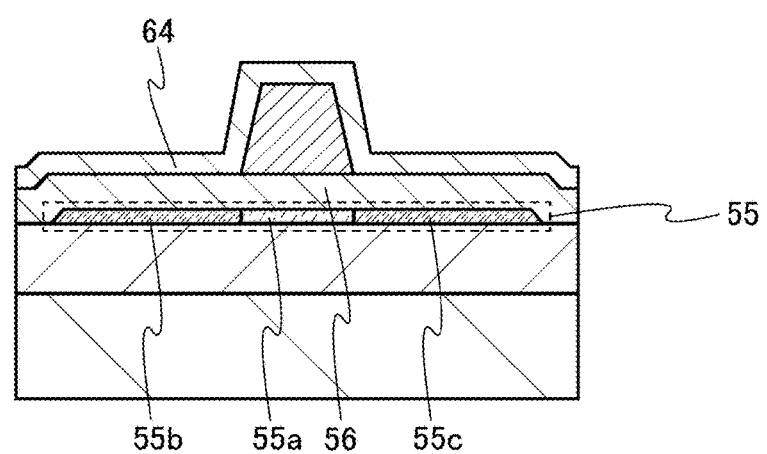

Although the nitride insulating film 65 is in contact with the oxide semiconductor film 55 in this embodiment, the insulating film 56 may be provided between the nitride insulating film 64 and the oxide semiconductor film 55 as illustrated in FIG. 5B. The insulating film 56 illustrated in FIG. 5B functions as a gate insulating film. The insulating film 56 preferably has a thickness with which hydrogen contained in the nitride insulating film 64 is diffused to the oxide semiconductor film 55, and the thickness is typically greater than or equal to 1 nm and less than or equal to 100 nm, greater than or equal to 5 nm and less than or equal to 50 nm, or greater than or equal to 10 nm and less than or equal to 30 nm. A manufacturing method is described below.

Through the steps illustrated in FIGS. 2A and 2B, the insulating film 53, the oxide semiconductor film 55, the insulating film 56, and the gate electrode 59 are formed over the substrate 51 as illustrated in FIG. 5A. Then, the impurity element 62 is added to the oxide semiconductor film 55. It is preferable that the impurity element 62 be added such that, in a concentration profile, a peak of the impurity element 62 is located in the oxide semiconductor film 55.

Next, the nitride insulating film 64 is formed as illustrated in FIG. 5B, so that the oxide semiconductor film 55 that includes the first region 55a to which the impurity element is not added and the second regions 55b and 55c containing the impurity element and hydrogen can be formed.

After that, the insulating film 67 and the pair of conductive films 68 and 69 may be formed as in Embodiment 1.

Modification Example 4

A method for manufacturing a transistor that is different from the manufacturing method in this embodiment is described. The timing of addition of impurities is different in the manufacturing method in this modification example and the manufacturing methods illustrated in FIGS. 2A to 2D and FIGS. 3A to 3C.

Figure 6A:
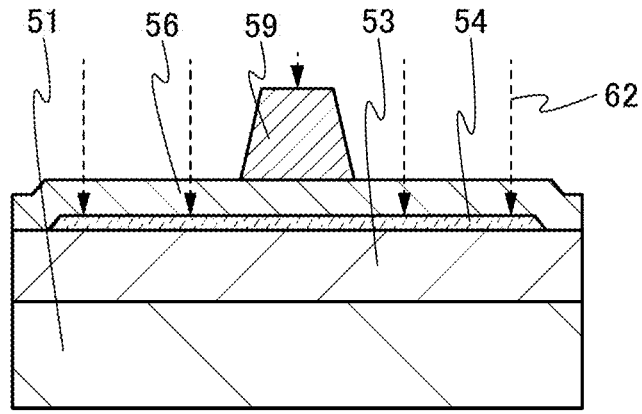
FIGS. 6A to 6C are cross-sectional views illustrating an example of a manufacturing process of a semiconductor device.

Through the steps illustrated in FIGS. 2A and 2B, the insulating film 53, the oxide semiconductor film 54, the insulating film 56, and the gate electrode 59 are formed over the substrate 51 as illustrated in FIG. 6A. Then, the impurity element 62 is added to the oxide semiconductor film 54. It is preferable that the impurity element 62 be added such that, in a concentration profile, a peak of the impurity element 62 is located in the oxide semiconductor film 54.

Figure 6B:
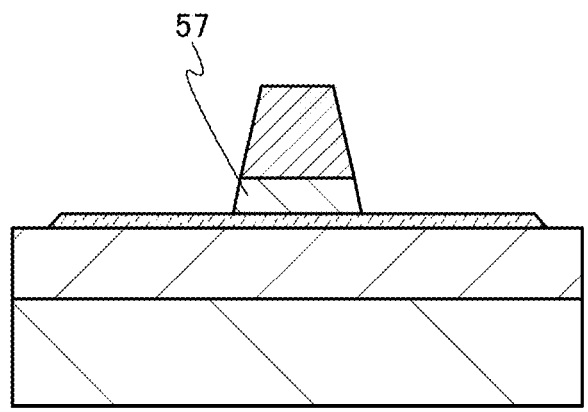

Next, as illustrated in FIG. 6B, the insulating film 56 is etched using the gate electrode 59 as a mask to form the gate insulating film 57.

Figure 6C:
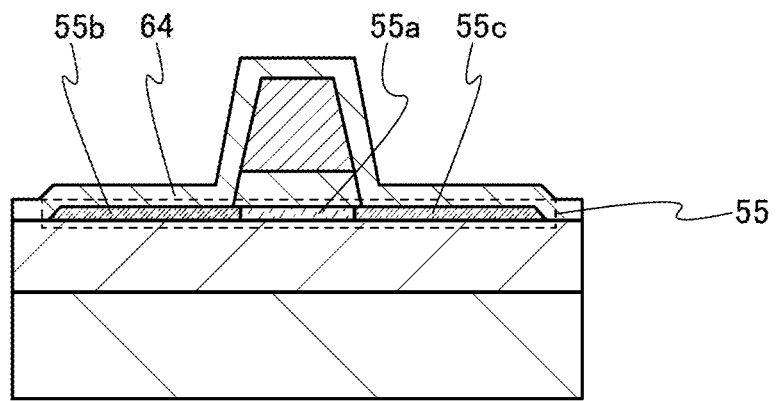

Next, the nitride insulating film 64 is formed as illustrated in FIG. 6C, so that the oxide semiconductor film 55 that includes the first region 55a to which the impurity element is not added and the second regions 55b and 55c containing the impurity element and hydrogen can be formed.

After that, the insulating film 67 and the pair of conductive films 68 and 69 may be formed as in Embodiment 1.

Modification Example 5

A method for manufacturing a transistor that is different from the manufacturing method in this embodiment is described. The timing of addition of impurities is different in the manufacturing method in this modification example and the manufacturing methods illustrated in FIGS. 2A to 2D, FIGS. 3A to 3C, and FIGS. 6A to 6C in.

Figure 7A:
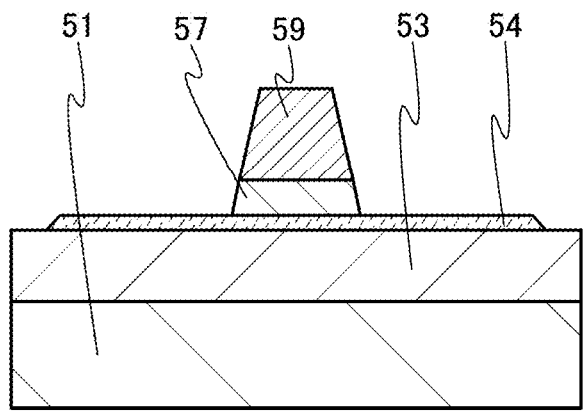
FIGS. 7A to 7C are cross-sectional views illustrating an example of a manufacturing process of a semiconductor device.

Through the steps illustrated in FIGS. 2A to 2C, the insulating film 53, the oxide semiconductor film 54, the gate insulating film 57, and the gate electrode 59 are formed over the substrate 51 as illustrated in FIG. 7A.

Figure 7B:
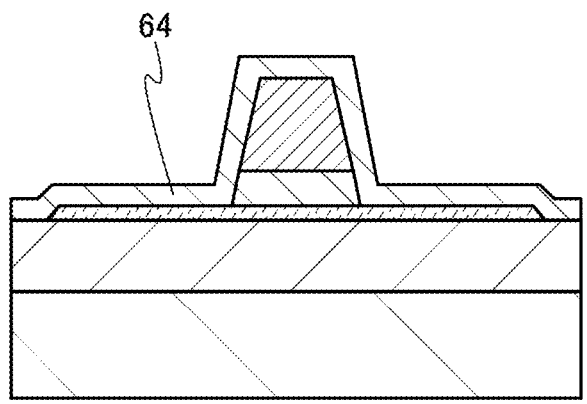

Then, the nitride insulating film 64 is formed as illustrated in FIG. 7B. As a result, hydrogen moves to part of the oxide semiconductor film 54.

Figure 7C:
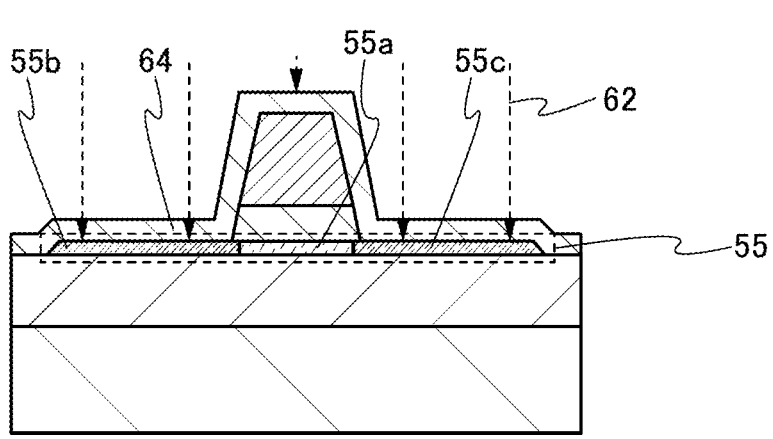

Then, the impurity element 62 is added to the oxide semiconductor film 54 as illustrated in FIG. 7C. It is preferable that the impurity element 62 be added such that, in a concentration profile, a peak of the impurity element 62 is located in the oxide semiconductor film 54. Through the above-described steps, the oxide semiconductor film 55 that includes the first region 55a to which the impurity element is not added and the second regions 55b and 55c containing the impurity element and hydrogen can be formed.

After that, the insulating film 67 and the pair of conductive films 68 and 69 may be formed as in Embodiment 1.

The structures, methods, and the like described in this embodiment can be combined as appropriate with any of the structures, methods, and the like described in the other embodiments.

Embodiment 2

In this embodiment, a transistor having a structure different from the transistors in Embodiment 1 and a method for manufacturing the transistor are described with reference to FIG. 8, FIGS. 9A to 9C, and FIGS. 10A to 10C.

Figure 8:
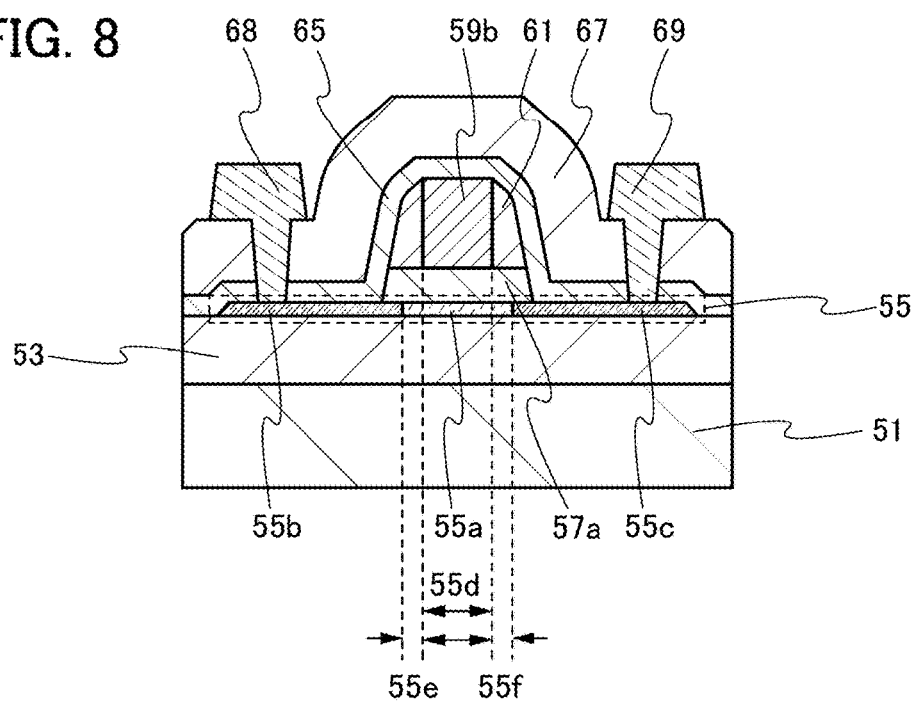
FIG. 8 is a cross-sectional view illustrating one embodiment of a semiconductor device.

FIG. 8 is a cross-sectional view of a transistor described in this embodiment. The transistor is different from the transistors described in Embodiment 1 in that sidewall insulating films 61 are provided on side surfaces of a gate electrode 59b.

The transistor illustrated in FIG. 8 includes the substrate 51, the insulating film 53 over the substrate 51, the oxide semiconductor film 55 over the insulating film 53, a gate insulating film 57a in contact with the oxide semiconductor film 55, and the gate electrode 59b in contact with the gate insulating film 57a. Note that the oxide semiconductor film 55 includes the first region 55a and the second regions 55b and 55c between which the first region 55a is interposed. The gate electrode 59b overlaps the first region 55a in the oxide semiconductor film 55. The nitride insulating film 65 that is in contact with the second regions 55b and 55c is provided in the transistor. In addition, in the cross section in the channel length direction, the sidewall insulating films 61 are provided between the side surfaces of the gate electrode 59b and the nitride insulating film 65.

The angle between a bottom surface (i.e., a surface in contact with the gate insulating film 57a) and the side surface of the gate electrode 59b is preferably greater than or equal to 70° and less than or equal to 90°. This enables the sidewall insulating films 61 to be easily formed on the side surfaces of the gate electrode 59b. In addition, a transistor having a minute structure with a short channel length can be manufactured.

Any of the materials for the gate electrodes 59 and 59a given in Embodiment 1 can be used as appropriate for the gate electrode 59b.

The sidewall insulating film 61 can be formed of a silicon oxide film, a silicon oxynitride film, a silicon nitride film, a silicon nitride oxide film, or the like.

A transistor including an oxide semiconductor is known to have a lower off-state current at room temperature than a transistor including a silicon semiconductor. This is probably attributed to a small number of carriers generated by thermal excitation, i.e., low carrier density. Even in a transistor including a material with low carrier density, a threshold voltage shift or the like might occur when the channel length is shortened.

Thus, the sidewall insulating film 61 is provided as in the transistor described in this embodiment, so that regions that are not overlapped with the gate electrode 59b can be provided in the first region 55a. That is, offset regions 55e and 55f can be provided between a channel region 55d in the first region 55a and the second regions 55b and 55c that are low-resistance regions. The offset regions 55e and 55f provided on both sides of the channel region 55d can decrease an electric field applied between the second regions 55b and 55c in the oxide semiconductor film 55, particularly, electric field concentration in the vicinity of the second region in contact with a drain electrode; thus, a threshold voltage shift or the like can be suppressed. In addition, owing to the decrease in the electric field concentration, the transistor can be prevented from being broken by the electric field concentration. In other words, the transistor has high withstand voltage and electrical characteristics that are not easily degraded. In addition, the offset regions 55e and 55f can reduce deterioration due to a voltage-temperature stress test in which voltage is applied to the drain electrode or deterioration due to current stress.

A method for manufacturing the transistor illustrated in FIG. 8 is described with reference to FIGS. 9A to 9C and FIGS. 10A and 10C.

Figure 9A:
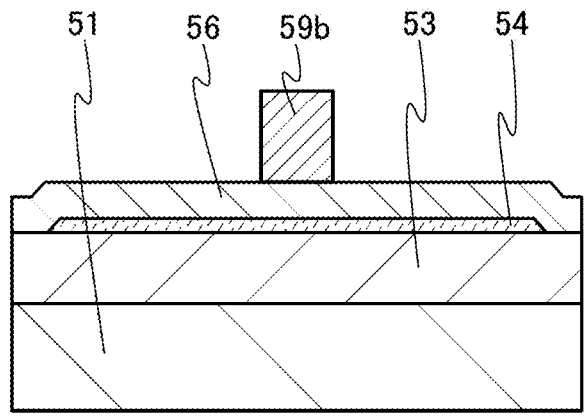
FIGS. 9A to 9C are cross-sectional views illustrating an example of a manufacturing process of a semiconductor device.

In a manner similar to that in Embodiment 1, the insulating film 53, the oxide semiconductor film 54, the insulating film 56, and the gate electrode 59b are formed over the substrate 51 as illustrated in FIG. 9A.

Figure 9B:
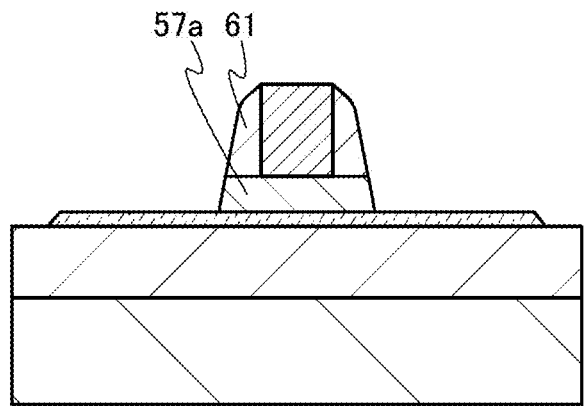

Next, an insulating film is formed over the insulating film 56 and the gate electrode 59b, and then the insulating film is processed by anisotropic etching such as reactive ion etching (RIE), whereby the sidewall insulating film 61 in contact with the side surface of the gate electrode 59b can be formed in a self-aligned manner (see FIG. 9B). In addition, the insulating film 56 is etched to form the gate insulating film 57a in this step.

Figure 9C:
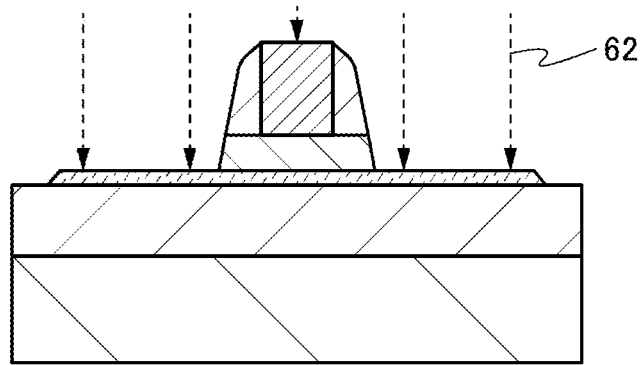

Then, as illustrated in FIG. 9C, the impurity element 62 is added to the oxide semiconductor film 54 using the gate electrode 59b and the sidewall insulating films 61 as masks to form regions including oxygen vacancies in parts of the oxide semiconductor film 54.

Figure 10A:
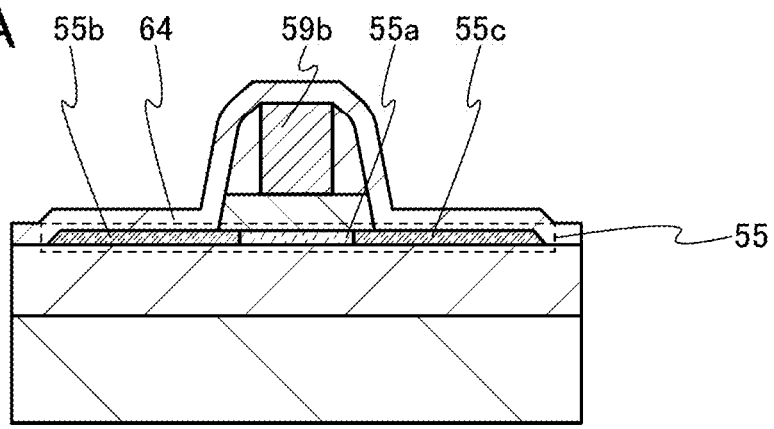
FIGS. 10A to 10C are cross-sectional views illustrating an example of a manufacturing process of a semiconductor device.

After that, as illustrated in FIG. 10A, the nitride insulating film 64 is formed over the oxide semiconductor film 54, the gate insulating film 57a, and the gate electrode 59b. As a result, the oxide semiconductor film 55 that includes the first region 55a to which the impurity element is not added and the second regions 55b and 55c containing the impurity element and hydrogen is formed. After that, heat treatment may be performed.

Figure 10B:
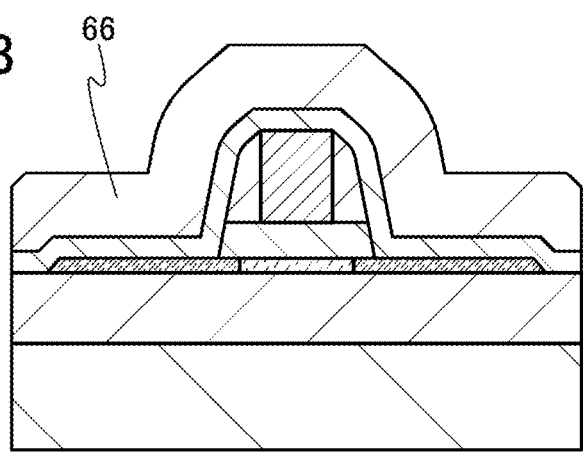

Then, the insulating film 66 may be formed as illustrated in FIG. 10B.

Figure 10C:
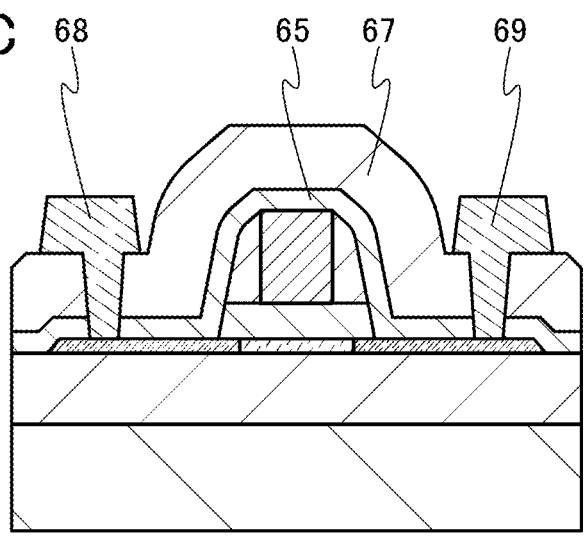

Next, openings are formed in the nitride insulating film 64 and the insulating film 66 to expose parts of the second regions 55b and 55c, and then the pair of conductive films 68 and 69 is formed (see FIG. 10C).

Through the above-described steps, a self-aligned transistor can be manufactured.

The structures, methods, and the like described in this embodiment can be combined as appropriate with any of the structures, methods, and the like described in the other embodiments.

Embodiment 3

In this embodiment, a structure of an oxide semiconductor film that can be used in Embodiment 1 and Embodiment 2 is described with reference to FIGS. 11A to 11D. Note that although description is made here using the transistor described in Embodiment 1, this embodiment can be applied as appropriate to the transistor described in Embodiment 2.

Figure 11A:
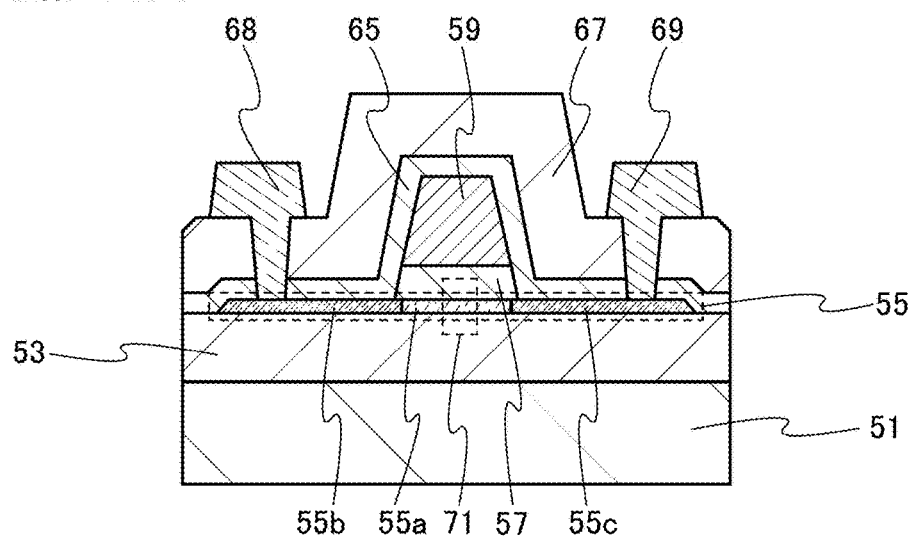
FIGS. 11A to 11D are a cross-sectional view and enlarged views illustrating one embodiment of a semiconductor device.
Figure 11B:
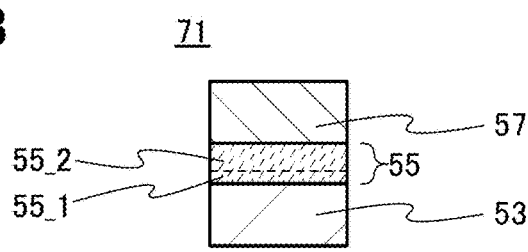
Figure 11C:
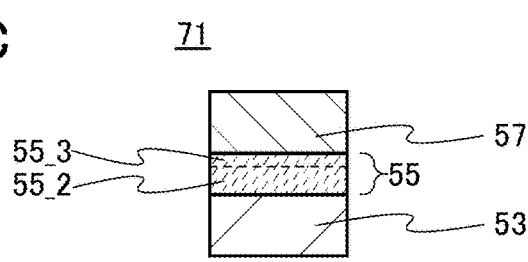
Figure 11D:
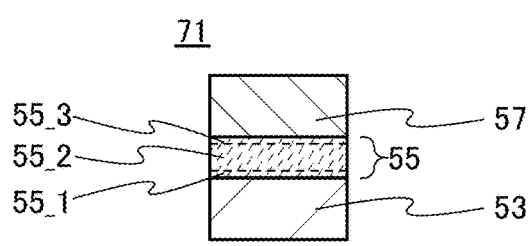

The transistor illustrated in FIG. 11A has the same structure as the transistor illustrated in FIG. 1, which is described in Embodiment 1, but differs from the transistor in the structure of the oxide semiconductor film 55. FIGS. 11B to 11D are enlarged views of part of the oxide semiconductor film 55 and a region in the vicinity thereof, which are surrounded by a dashed line 71 in FIG. 11A.

As illustrated in FIG. 11B, the oxide semiconductor film 55 includes a first oxide semiconductor film 55_1 that is in contact with the insulating film 53 and a second oxide semiconductor film 55_2 that is in contact with the first oxide semiconductor film 55_1 and the gate insulating film 57.

Alternatively, as illustrated in FIG. 11C, the oxide semiconductor film 55 includes the second oxide semiconductor film 55_2 that is in contact with the insulating film 53 and a third oxide semiconductor film 55_3 that is in contact with the second oxide semiconductor film 55_2 and the gate insulating film 57.

Alternatively, as illustrated in FIG. 11D, the oxide semiconductor film 55 includes the first oxide semiconductor film 55_1 that is in contact with the insulating film 53, the second oxide semiconductor film 55_2 that is in contact with the first oxide semiconductor film 55_1, and the third oxide semiconductor film 55_3 that is in contact with the second oxide semiconductor film 55_2 and the gate insulating film 57.

In the case where the first oxide semiconductor film 55_1, the second oxide semiconductor film 55_2, and the third oxide semiconductor film 55_3 are each an In-M-Zn oxide film (M is Al, Ti, Ga, Y, Zr, Sn, La, Ce, Nd, or Hf), when In:M:Zn=$x_1$:$y_1$:$z_1$ [atomic ratio] is satisfied in the first oxide semiconductor film 55_1 and the third oxide semiconductor film 55_3 and In:M:Zn=$x_2$:$y_2$:$z_2$ [atomic ratio] is satisfied in the second oxide semiconductor film 55_2, $y_1/x_1$ is larger than $y_2/x_2$. It is preferable that $y_1/x_1$ be 1.5 or more times $y_2/x_2$. It is further preferable that $y_1/x_1$ be twice or more or three or more times $y_2/x_2$. In that case, $y_1$ is preferably larger than or equal to $x_1$ in the first oxide semiconductor film 55_1 and the third oxide semiconductor film 55_3, in which case a transistor including the second oxide semiconductor film 55_2 can have stable electrical characteristics. However, when $y_1$ is three or more times $x_1$, the field-effect mobility of the transistor including the second oxide semiconductor film 55_2 is reduced. Thus, it is preferable that $y_1$ be less than three times $x_1$.

In the case where the second oxide semiconductor film 55_2 is an In-M-Zn oxide film (M is Ga, Y, Zr, La, Ce, or Nd) and a target having an atomic ratio of metal elements of In:M:Zn=$x_1$:$y_1$:$z_1$ is used for forming the second oxide semiconductor film 55_2, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film is easily formed as the second oxide semiconductor film 55_2. Typical examples of the atomic ratio of In to M and Zn (In:M:Zn) in the target are 1:1:1, 1:1:1.2, 2:1:1.5, 2:1:2.3, 2:1:3, and 3:1:2.

In the case where the first oxide semiconductor film 55_1 and the third oxide semiconductor film 55_3 are each an In-M-Zn oxide film (M is Ga, Y, Zr, La, Ce, or Nd) and a target having an atomic ratio of metal elements of In:M:Zn=$x_2$:$y_2$:$z_2$ is used for forming the first oxide semiconductor film 55_1 and the third oxide semiconductor film 55_3, $x_2/y_2$ is less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film is easily formed as the first oxide semiconductor film 55_1 and the third oxide semiconductor film 55_3. Typical examples of the atomic ratio of In to M and Zn (In:M:Zn) in the target are 1:3:2, 1:3:4, 1:3:6, 1:3:8, 1:4:3, 1:4:4, 1:4:5, 1:4:6, 1:6:3, 1:6:4, 1:6:5, 1:6:6, 1:6:7, 1:6:8, and 1:6:9.

Note that the proportion of each metal element in the atomic ratio of each of the first oxide semiconductor film 55_1, the second oxide semiconductor film 55_2, and the third oxide semiconductor film 55_3 varies within a range of ±40% of any of the above atomic ratios as an error.

The atomic ratio is not limited to the above, and the atomic ratio may be set as appropriate in accordance with needed semiconductor characteristics.

In FIG. 11D, the first oxide semiconductor film 55_1 and the third oxide semiconductor film 55_3 may have the same atomic ratio of metal elements. For example, an In—Ga—Zn oxide having an atomic ratio of In:Ga:Zn=1:3:2, 1:3:4, or 1:4:5 may be used for the first oxide semiconductor film 55_1 and the third oxide semiconductor film 55_3.

Alternatively, in FIG. 11D, the first oxide semiconductor film 55_1 and the third oxide semiconductor film 55_3 may have different atomic ratios of metal elements. For example, an In—Ga—Zn oxide having an atomic ratio of In:Ga:Zn=1:3:2 is used for the first oxide semiconductor oxide film 55_1, and an In—Ga—Zn oxide having an atomic ratio of In:Ga:Zn=1:3:4 or 1:4:5 may be used for the third oxide semiconductor film 55_3.

The thicknesses of the first oxide semiconductor film 55_1 and the third oxide semiconductor film 55_3 are each greater than or equal to 3 nm and less than or equal to 100 nm, preferably greater than or equal to 3 nm and less than or equal to 50 nm. The thickness of the second oxide semiconductor film 55_2 is greater than or equal to 3 nm and less than or equal to 200 nm, preferably greater than or equal to 3 nm and less than or equal to 100 nm, further preferably greater than or equal to 3 nm and less than or equal to 50 nm. Note that when the thickness of each of the first oxide semiconductor film 55_1 and the third oxide semiconductor film 55_3 is smaller than that of the second oxide semiconductor film 55_2, the amount of threshold voltage shift of the transistor can be reduced. The thickness of the third oxide semiconductor film 55_3 is preferably small in order to prevent oxygen contained in the third oxide semiconductor film 55_3 from diffusing to the pair of electrodes 68 and 69 and the pair of electrodes 68 and 69 from being oxidized.

The interface between the first oxide semiconductor film 55_1 and the second oxide semiconductor film 55_2 and the interface between the second oxide semiconductor film 55_2 and the third oxide semiconductor film 55_3 can be observed by scanning transmission electron microscopy (STEM).

Any of the crystal structures of the oxide semiconductor film 55 described in Embodiment 1 can be used as appropriate for the first oxide semiconductor film 55_1, the second oxide semiconductor film 55_2, and the third oxide semiconductor film 55_3.

By providing an oxide semiconductor film in which oxygen vacancies are less likely to be generated than in the second oxide semiconductor film 55_2 on and/or under the second oxide semiconductor film 55_2 so as to be in contact with the second oxide semiconductor film 55_2, oxygen vacancies in the second oxide semiconductor film 55_2 can be reduced. In addition, the second oxide semiconductor film 55_2 is in contact with the first oxide semiconductor film 55_1 and/or the third oxide semiconductor film 55_3 containing one or more metal elements contained in the second oxide semiconductor film 55_2; thus, the interface between the first oxide semiconductor film 55_1 and the second oxide semiconductor film 55_2 and the interface between the second oxide semiconductor film 55_2 and the third oxide semiconductor film 55_3 have extremely low interface state density. Thus, oxygen vacancies in the second oxide semiconductor film 55_2 can be reduced.

In the case where the second oxide semiconductor film 55_2 is in contact with an insulating film including a different constituent element (e.g., a gate insulating film including a silicon oxide film), an interface state might be formed and the interface state might form a channel. In that case, a second transistor having a different threshold voltage might be formed, which might vary the apparent threshold voltage of the transistor. However, since the first oxide semiconductor film 55_1 that contains one or more metal elements contained in the second oxide semiconductor film 55_2 is in contact with the second oxide semiconductor film 55_2, an interface state is not easily formed at the interface between the first oxide semiconductor film 55_1 and the second oxide semiconductor film 55_2. Thus, with the first oxide semiconductor film 55_1, variations in the electrical characteristics of the transistor, such as threshold voltage, can be reduced.

In the case where a channel is formed at the interface between the gate insulating film 57 and the second oxide semiconductor film 55_2, interface scattering occurs at the interface and the field-effect mobility of the transistor is decreased. However, since the third oxide semiconductor film 553 that contains one or more metal elements contained in the second oxide semiconductor film 55_2 is in contact with the second oxide semiconductor film 55_2, carrier scattering does not easily occur at the interface between the second oxide semiconductor film 55_2 and the third oxide semiconductor film 55_3 and the field-effect mobility of the transistor can be increased.

The first oxide semiconductor film 55_1 and the third oxide semiconductor film 55_3 also function as barrier films that prevent formation of an impurity state due to the entry of the constituent elements of the insulating film 53 and the gate insulating film 57 into the second oxide semiconductor film 55_2.

For example, in the case where an insulating film containing silicon is used as the insulating film 53 and the gate insulating film 57, silicon contained in the insulating film 53 and the gate insulating film 57 or carbon that might be contained in the insulating film 53 and the gate insulating film 57 might enter the first oxide semiconductor film 55_1 and/or the third oxide semiconductor film 55_3 at a depth of several nanometers from the interfaces. When an impurity such as silicon or carbon enters the second oxide semiconductor film 55_2, an impurity state is formed. The impurity state serves as a donor and generates an electron, so that the second oxide semiconductor film 55_2 might become an n-type.

However, when the thicknesses of the first oxide semiconductor film 55_1 and the third oxide semiconductor film 55_3 are larger than several nanometers, the impurity such as silicon or carbon that has entered the first oxide semiconductor film and the third oxide semiconductor film does not reach the second oxide semiconductor film 55_2, so that the influence of impurity states is reduced.

Thus, the transistor described in this embodiment is a transistor in which variations in the electrical characteristics such as threshold voltage are reduced.

The structures, methods, and the like described in this embodiment can be combined as appropriate with any of the structures, methods, and the like described in the other embodiments.

Embodiment 4

In this embodiment, a structure of an oxide semiconductor film that can be used in Embodiments 1 to 3 is described with reference to FIG. 12. Note that although description is made here using the transistor described in Embodiment 1, this embodiment can be applied as appropriate to the transistor described in Embodiment 2 or Embodiment 3.

Figure 12:
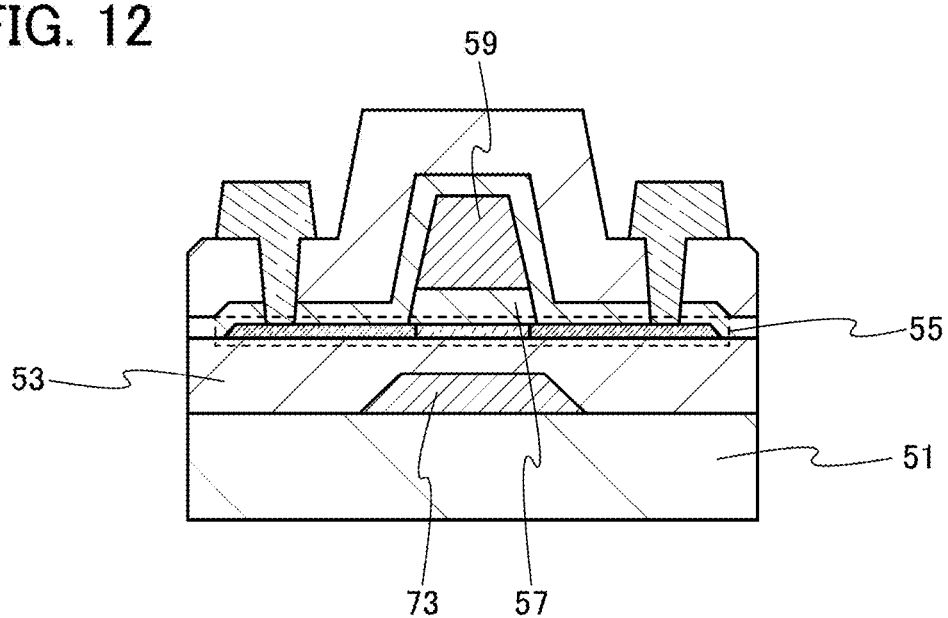
FIG. 12 is a cross-sectional view illustrating one embodiment of a semiconductor device.

As illustrated in FIG. 12, a transistor described in this embodiment includes a gate electrode 73 that is overlapped with the oxide semiconductor film 55 with the insulating film 53 provided therebetween.

By making the potential of the gate electrode 73 different from the potential of the gate electrode 59, the threshold voltage of the transistor can be controlled and the transistor can be a normally-off transistor. In contrast, by making the potential of the gate electrode 73 the same as the potential of the gate electrode 59, the on-state current of the transistor can be increased.

The structures, methods, and the like described in this embodiment can be combined as appropriate with any of the structures, methods, and the like described in the other embodiments.

Embodiment 5

In this embodiment, one embodiment of an oxide semiconductor film that can be applied to an oxide semiconductor film in any of the transistors described in the above embodiments is described.

The oxide semiconductor film may include one or more of the following: an oxide semiconductor having a single-crystal structure (hereinafter referred to as a single-crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). Alternatively, the oxide semiconductor film may include a CAAC-OS. Alternatively, the oxide semiconductor film may include an amorphous oxide semiconductor and an oxide semiconductor having a crystal grain. Described below are a CAAC-OS and a microcrystalline oxide semiconductor as typical examples.

<CAAC-OS>

First, a CAAC-OS film is described.

The CAAC-OS film is an oxide semiconductor film including a plurality of c-axis aligned crystal parts.

In a transmission electron microscope (TEM) image of the CAAC-OS film, it is difficult to clearly observe a boundary between crystal parts, that is, a grain boundary. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a shape reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

FIG. 13A is a cross-sectional TEM image of a CAAC-OS film. FIG. 13B is a cross-sectional TEM image obtained by enlarging the image of FIG. 13A. In FIG. 13B, atomic arrangement is highlighted for easy understanding.

FIG. 13C is Fourier transform images of regions each surrounded by a circle (the diameter is approximately 4 nm) between A and O and between O and A' in FIG. 13A. C-axis alignment can be observed in each region in FIG. 13C. The c-axis direction between A and O is different from that between O and A', which indicates that a grain in the region between A and O is different from that between O and A'. In addition, between A and O, the angle of the c-axis continuously and gradually changes, for example, 14.3°, 16.6°, and 26.4°. Similarly, the angle of the c-axis between O and A' continuously changes, for example, −18.3°, −17.6°, and −15.9°.

Note that in an electron diffraction pattern of the CAAC-OS film, spots (bright spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 14A).

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm² or more, 5 µm² or more, or 1000 µm² or more is observed in some cases in the plan TEM image.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

When the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of $InGaZnO_4$, six peaks appear. The six peaks are derived from crystal planes equivalent to the (110) plane. In contrast, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer that is arranged in a layered manner and observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where the shape of the CAAC-OS film is changed by etching or the like, the c-axis might not be necessarily parallel to a normal vector of a formation surface or a normal vector of a top surface of the CAAC-OS film.

Distribution of c-axis aligned crystal parts in the CAAC-OS film is not necessarily uniform. For example, in the case where crystal growth leading to the crystal parts of the CAAC-OS film occurs from the vicinity of the top surface of the CAAC-OS film, the proportion of the c-axis aligned crystal parts in the vicinity of the top surface is higher than that in the vicinity of the formation surface in some cases. When an impurity is added to the CAAC-OS film, a region to which the impurity is added is altered, and the proportion of the c-axis aligned crystal parts in the CAAC-OS film varies depending on regions, in some cases.

Note that when the CAAC-OS film with an $InGaZnO_4$ crystal is analyzed by an out-of-plane method, a peak may also be observed at 2θ of around 36°, in addition to the peak at 2θ of around 31°. The peak at 2θ of around 36° indicates that a crystal having no c-axis alignment is included in part of the CAAC-OS film. It is preferable that in the CAAC-OS film, a peak appear when 2θ is around 31° and that a peak not appear when 2θ is around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic order of the oxide semiconductor film by depriving the oxide semiconductor film of oxygen and causes a decrease in crystallinity. Furthermore, a heavy metal such as iron or nickel, argon, carbon dioxide, or the like has a large atomic radius (molecular radius), and thus disturbs the atomic order of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor that includes the oxide semiconductor film having high impurity concentration and a high density of defect states has unstable electrical characteristics in some cases.

In a transistor including the CAAC-OS film, changes in electrical characteristics of the transistor due to irradiation with visible light or ultraviolet light are small.

A semiconductor device that includes the transistor including the CAAC-OS film is less likely to be broken even when folded. For this reason, a flexible semiconductor device preferably includes the transistor including the CAAC-OS film.

<nc-OS>

Next, a microcrystalline oxide semiconductor film is described.

In an image of the microcrystalline oxide semiconductor film obtained with a TEM, crystal parts cannot be found easily and clearly in some cases. In most cases, the size of a crystal part included in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image of the nc-OS film obtained with a TEM, for example, a crystal grain boundary cannot be found easily and clearly in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order. The nc-OS film does not have regularity of crystal orientation between different crystal parts. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than that of a crystal part, a peak that shows a crystal plane does not appear. Furthermore, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Furthermore, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (see FIG. 14B).

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 14A:
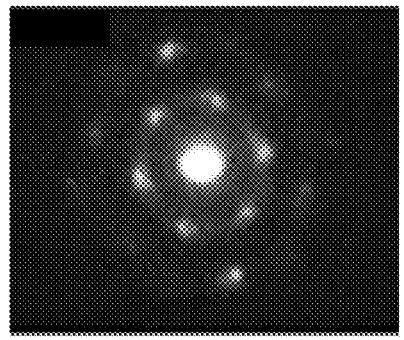
FIGS. 14A and 14B show nanobeam electron diffraction patterns of oxide semiconductor films.
Figure 14B:
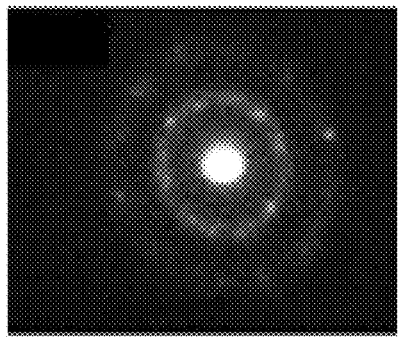
Figure 14C:
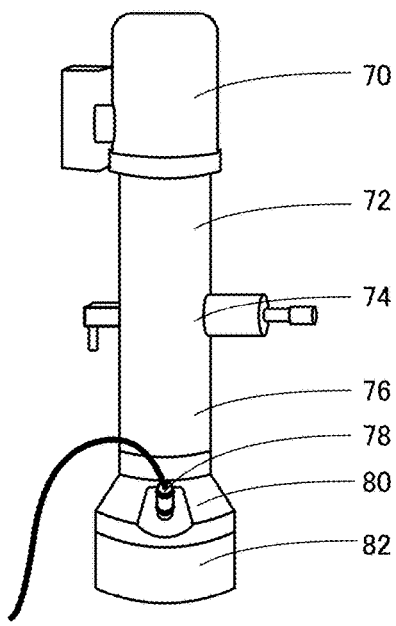
FIGS. 14C and 14D illustrate an example of a transmission electron diffraction measurement apparatus.

FIG. 14C illustrates a transmission electron diffraction measurement apparatus. The transmission electron diffraction measurement apparatus includes an electron gun chamber 70, an optical system 72 below the electron gun chamber 70, a sample chamber 74 below the optical system 72, an optical system 76 below the sample chamber 74, an observation chamber 80 below the optical system 76, a camera 78 provided for the observation chamber 80, and a film chamber 82 below the observation chamber 80. The camera 78 is provided to face toward the inside of the observation chamber 80. Note that the film chamber 82 is not necessarily provided.

Figure 14D:
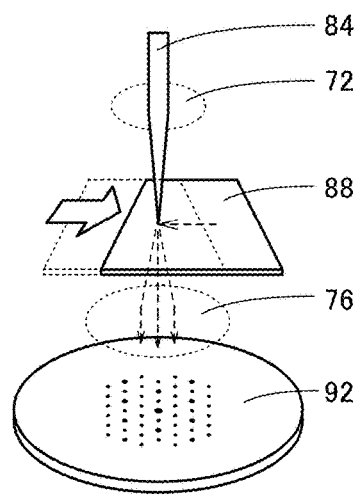

FIG. 14D illustrates the internal structure of the transmission electron diffraction measurement apparatus in FIG. 14C. In the transmission electron diffraction measurement apparatus, a substance 88 that is positioned in the sample chamber 74 is irradiated with electrons emitted from an electron gun installed in the electron gun chamber 70 through the optical system 72. Electrons passing through the substance 88 enter a fluorescent plate 92 provided in the observation chamber 80 through the optical system 76. On the fluorescent plate 92, a pattern corresponding to the intensity of the incident electron appears, which enables measurement of a transmission electron diffraction pattern.

The camera 78 is installed so as to face the fluorescent plate 92 and can take an image of a pattern appearing on the fluorescent plate 92. An angle formed by a straight line that passes through the center of a lens of the camera 78 and the center of the fluorescent plate 92 and an upper surface of the fluorescent plate 92 is, for example, 15° or more and 80° or less, 30° or more and 75° or less, or 45° or more and 70° or less. As the angle is reduced, distortion of the transmission electron diffraction pattern taken by the camera 78 becomes larger. Note that if the angle is obtained in advance, the distortion of an obtained transmission electron diffraction pattern can be corrected. Note that the film chamber 82 may be provided with the camera 78. For example, the camera 78 may be set in the film chamber 82 so as to be opposite to the incident direction of electrons 84. In that case, a transmission electron diffraction pattern with little distortion can be taken from a rear surface of the fluorescent plate 92.

A holder for fixing the substance 88 that is a sample is provided in the sample chamber 74. The holder transmits electrons passing through the substance 88. The holder may have, for example, a function of moving the substance 88 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably optimized depending on the structure of the substance 88.

Then, a method for measuring a transmission electron diffraction pattern of a substance by the transmission electron diffraction measurement apparatus described above will be described.

For example, changes in the structure of a substance can be observed by changing (scanning) the irradiation position of the electrons 84 that are a nanobeam on the substance, as illustrated in FIG. 14D. At this time, when the substance 88 is a CAAC-OS film, a diffraction pattern shown in FIG. 14A is observed. When the substance 88 is an nc-OS film, a diffraction pattern shown in FIG. 14B is observed.

Even when the substance 88 is a CAAC-OS film, a diffraction pattern similar to that of an nc-OS film or the like is partly observed in some cases. Therefore, whether a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%. Note that the proportion of a region where a diffraction pattern different from that of a CAAC-OS film is observed is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 15A:
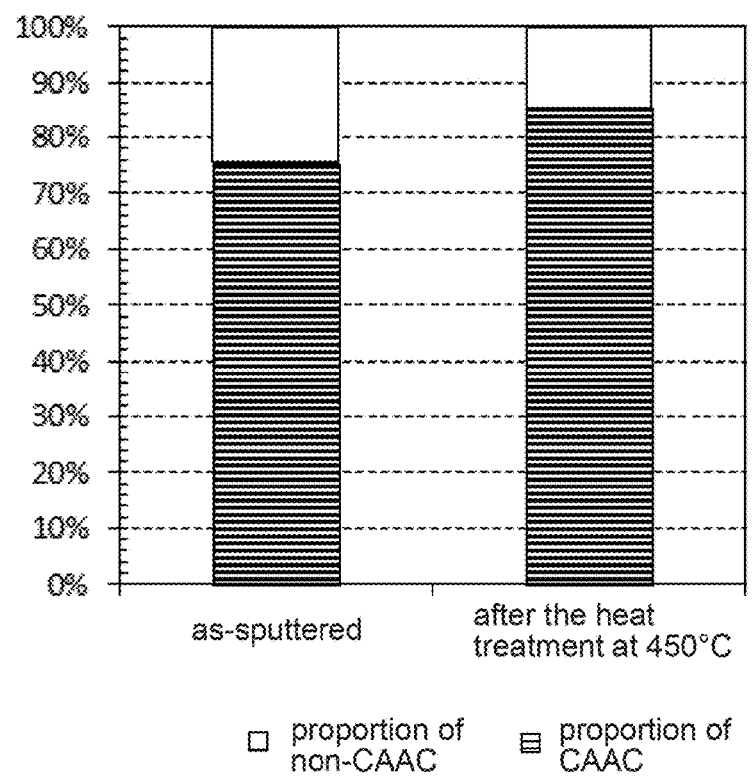
FIG. 15A shows an example of structural analysis by transmission electron diffraction measurement.

FIG. 15A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Furthermore, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Furthermore, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 15B:
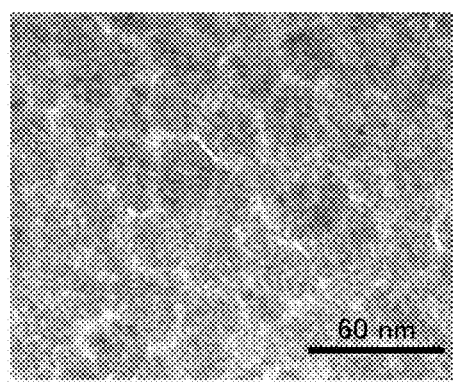
FIGS. 15B and 15C show plan-view TEM images.
Figure 15C:
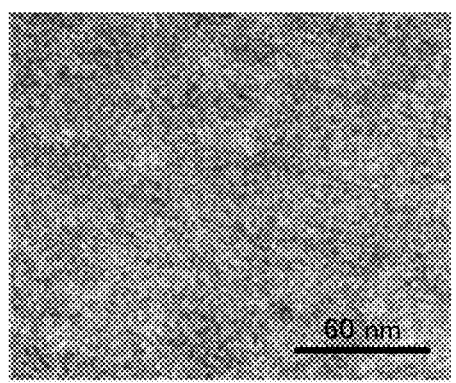

FIGS. 15B and 15C are plan-view TEM images of the CAAC-OS film obtained just after the deposition and the CAAC-OS film subjected to the heat treatment at 450° C., respectively. Comparison between FIGS. 15B and 15C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

Note that the structures, methods, and the like described in this embodiment can be combined as appropriate with any of the structures, methods, and the like described in the other embodiments.

Embodiment 6

In this embodiment, a structure example of a display device of one embodiment of the present invention is described.

Structure Example

Figure 16A:
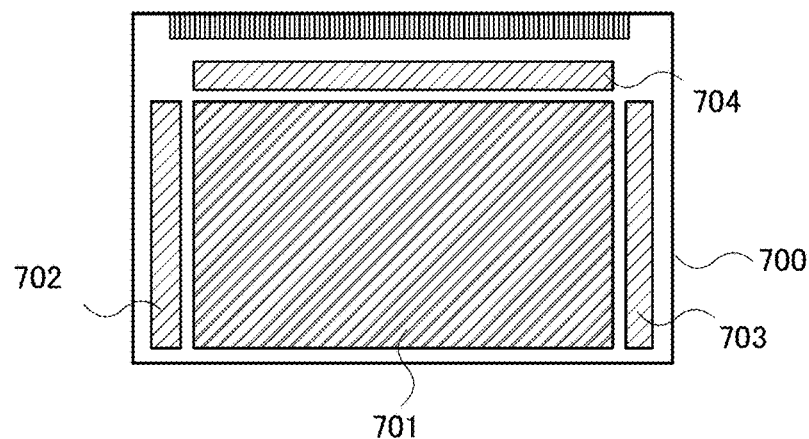
FIGS. 16A to 16C are a block diagram and circuit diagrams of a display device of an embodiment.
Figure 16B:
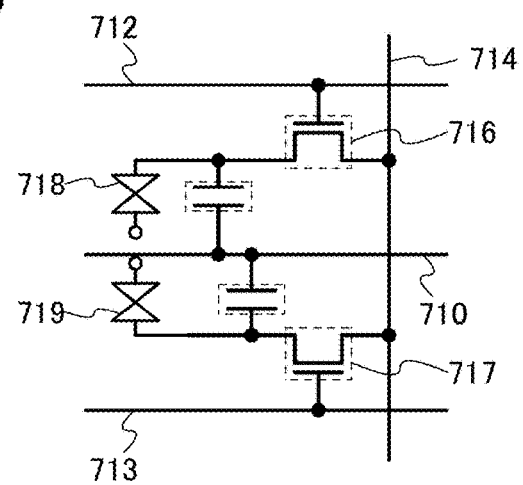
Figure 16C:
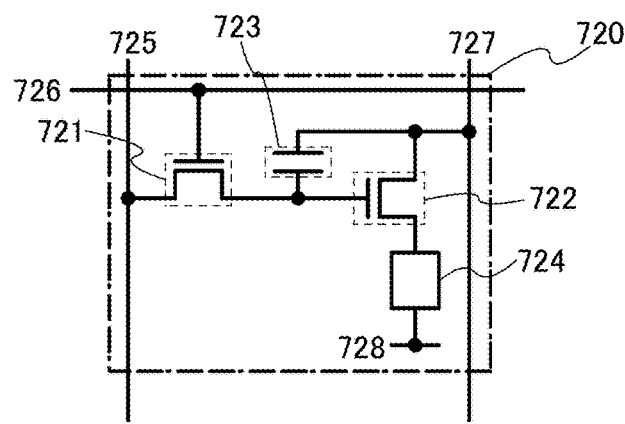

FIG. 16A is a top view of the display device of one embodiment of the present invention. FIG. 16B is a circuit diagram illustrating a pixel circuit that can be used in the case where a liquid crystal element is used in a pixel in the display device of one embodiment of the present invention. FIG. 16C is a circuit diagram illustrating a pixel circuit that can be used in the case where an organic EL element is used in a pixel in the display device of one embodiment of the present invention.

The transistor in the pixel portion can be formed in accordance with the above embodiment. The transistor can be easily formed as an n-channel transistor, and thus part of a driver circuit that can be formed using an n-channel transistor can be formed over the same substrate as the transistor of the pixel portion. With the use of any of the transistors described in the above embodiments for the pixel portion or the driver circuit in this manner, a highly reliable display device can be provided.

FIG. 16A is an example of a block diagram of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels that include display elements are provided in a matrix in the respective regions where the scan lines and the signal lines intersect with each other. The substrate 700 of the display device is connected to a timing control circuit (also referred to as a controller or a controller IC) through a connection portion such as a flexible printed circuit (FPC).

In FIG. 16A, the first scan line driver circuit 702, the second scan line driver circuit 703, and the signal line driver circuit 704 are formed over the substrate 700 where the pixel portion 701 is formed. Consequently, the number of components provided outside, such as a driver circuit, can be reduced, so that a reduction in cost can be achieved. Furthermore, if the driver circuit is provided outside the substrate 700, wirings would need to be extended and the number of wiring connections would increase. When the driver circuit is provided over the substrate 700, the number of connections of the wirings can be reduced. Consequently, an improvement in reliability or yield can be achieved.

<Liquid Crystal Display Device>

FIG. 16B illustrates an example of a circuit configuration of the pixel. Here, a pixel circuit that can be used in a pixel of a VA liquid crystal display device is illustrated.

This pixel circuit can be used in a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 712 of a transistor 716 and a gate wiring 713 of a transistor 717 are separated so that different gate signals can be supplied thereto. In contrast, a source or drain electrode 714 that functions as a data line is shared by the transistors 716 and 717. The transistor described in any of the above embodiments can be used as appropriate as each of the transistors 716 and 717. Thus, a highly reliable liquid crystal display device can be provided.

The shapes of a first pixel electrode electrically connected to the transistor 716 and a second pixel electrode electrically connected to the transistor 717 are described. The first pixel electrode and the second pixel electrode are separated by a slit. The first pixel electrode has a V shape and the second pixel electrode is provided so as to surround the first pixel electrode.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

A storage capacitor may be formed using a capacitor wiring 710, a gate insulating film functioning as a dielectric, and a capacitor electrode electrically connected to the first pixel electrode or the second pixel electrode.

The multi-domain pixel includes a first liquid crystal element 718 and a second liquid crystal element 719. The first liquid crystal element 718 includes the first pixel electrode, a counter electrode, and a liquid crystal layer therebetween. The second liquid crystal element 719 includes the second pixel electrode, a counter electrode, and a liquid crystal layer therebetween.

Note that a pixel circuit of the present invention is not limited to that illustrated in FIG. 16B. For example, a switch, a resistor, a capacitor, a transistor, a sensor, a logic circuit, or the like may be added to the pixel illustrated in FIG. 16B.

<Organic EL Display Device>

FIG. 16C illustrates another example of a circuit configuration of the pixel. Here, a pixel structure of a display device including an organic EL element is illustrated.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. On the basis of such a mechanism, this light-emitting element is referred to as a current-excitation light-emitting element.

FIG. 16C illustrates an example of a pixel circuit that can be used. In this example, one pixel includes two n-channel transistors. Note that the oxide semiconductor film of one embodiment of the present invention can be used for a channel formation region of an n-channel transistor. Digital time grayscale driving can be employed for the pixel circuit.

The configuration of the applicable pixel circuit and operation of a pixel employing digital time grayscale driving are described.

A pixel 720 includes a switching transistor 721, a driver transistor 722, a light-emitting element 724, and a capacitor 723. A gate electrode of the switching transistor 721 is connected to a scan line 726, a first electrode (one of a source electrode and a drain electrode) of the switching transistor 721 is connected to a signal line 725, and a second electrode (the other of the source electrode and the drain electrode) of the switching transistor 721 is connected to a gate electrode of the driver transistor 722. The gate electrode of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As the switching transistor 721 and the driver transistor 722, the transistor described in any of the above embodiments can be used as appropriate. In this manner, a highly reliable organic EL display device can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least forward threshold voltage.

Note that gate capacitance of the driver transistor 722 may be used as a substitute for the capacitor 723, so that the capacitor 723 can be omitted. The gate capacitance of the driver transistor 722 may be formed between the channel formation region and the gate electrode.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode of the driver transistor 722. Note that voltage higher than or equal to voltage that is the sum of power supply line voltage and the threshold voltage Vth of the driver transistor 722 is applied to the signal line 725.

In the case of performing analog grayscale driving, a voltage higher than or equal to a voltage that is the sum of the forward voltage of the light-emitting element 724 and the threshold voltage Vth of the driver transistor 722 is applied to the gate electrode of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that the configuration of the pixel circuit of the present invention is not limited to that illustrated in FIG. 16C. For example, a switch, a resistor, a capacitor, a sensor, a transistor, a logic circuit, or the like may be added to the pixel circuit illustrated in FIG. 16C.

In the case where the transistor described in any of the above embodiments is used for any of the circuits illustrated in FIGS. 16A to 16C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

For example, in this specification and the like, a display element, a display device that is a device including a display element, a light-emitting element, and a light-emitting device that is a device including a light-emitting element can employ a variety of modes or can include a variety of elements. A display element, a display device, a light-emitting element, or a light-emitting device includes, for example, at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. In addition, a display medium whose contrast, luminance, reflectance, transmittance, or the like is changed by electric action or magnetic action may be included. Examples of a display device having an EL element include an EL display. Examples of a display device having an electron emitter include a field emission display (FED) and an SED-type flat panel display (SED: surface-conduction electron-emitter display). Examples of a display device having a liquid crystal element include a liquid crystal display (e.g., a transmissive liquid crystal display, a transflective liquid crystal display, a reflective liquid crystal display, a direct-view liquid crystal display, or a projection liquid crystal display). Examples of display devices including electronic ink, electro liquid powder, or electrophoretic elements include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

At least part of this embodiment can be implemented in combination with any of the other embodiments described in this specification as appropriate.

Embodiment 7

In this embodiment, a reduction in resistivity of an oxide semiconductor film that occurs when the oxide semiconductor film contains oxygen vacancies and hydrogen is described. Specifically, $V_OH$ formed in the second regions 55b and 55c in the above-described oxide semiconductor film 55 is described. Note that in this embodiment, a state in which a hydrogen atom exists in an oxygen vacancy $V_O$ is expressed as $V_OH$.

<1-a: Calculation Method>

The influence of the coexistence of an oxygen vacancy (hereinafter, $V_O$) and hydrogen in an In—Ga—Zn oxide (hereinafter, IGZO) was investigated by first principles calculations. First, an oxygen site where $V_O$ is likely to be formed, and an existing form of a hydrogen atom were investigated. Then, the stability of the hydrogen atom inside or outside $V_O$ was investigated. Lastly, the transition level of a defect that easily exists stably was calculated.

The Vienna Ab initio Simulation Package (VASP) was used in the first principles calculations. The Heyd-Scuseria-Ernzerhof (HSE) functional was used as a hybrid functional, the Perdew-Burke-Ernzerhof (PBE) generalized gradient approximation (GGA) was used for an exchange-correlation potential, and a projector augmented-wave (PAW) method was used for a pseudopotential. GGA was used in the calculation for the stability of the hydrogen atom inside or outside $V_O$, and the HSE functional was used to calculate the formation energy and the transition level because the band gap value needs to be accurate. For GGA, the energy cutoff was 500 eV, and a 2×2×3 Monkhorst-Pack mesh was used for k-point sampling. For the HSE functional, the energy cutoff was 800 eV, and Γ-only k-point sampling was used. In addition, the screening parameter of the HSE functional was 2 nm$^{-1}$, and the fraction of the Hartree-Fock exchange term was 0.25.

<1-b: Formation Energy of Defect>

The defect concentration c is calculated using the formation energy ($E_{form}(D)$) of a defect D and Equation (1).

[Equation 1]

$$c = N_{sites} \exp\{-E_{form}(D)/k_B T\} \quad (1)$$

In the equation (1), $N_{sites}$ represents the number of sites where defects D can be formed, $k_B$ represents the Boltzmann constant, and T represents temperature. From Equation (1), the lower the formation energy is, the more likely it is that the defect D is formed. The formation energy was thus calculated from Equation (2).

[Equation 2]

$$E_{form}(D) = E_{tot}(D^q) - E_{tot}(\text{bulk}) + \sum_i \Delta n_i \mu_i + q(\varepsilon_{VBM} + \Delta V_q + E_F)$$

In Equation (2), $E_{tot}(D^q)$ represents the total energy of a cell containing the defect D with charge q, $E_{tot}(\text{bulk})$ represents the total energy of a perfect crystal, $\Delta n_i$ represents the difference in the number of atoms i, $\mu_i$ represents the chemical potential of an atom i, $\varepsilon_{VBM}$ represents the energy of the valence band maximum (VBM), $\Delta V_q$ represents the correction term related to a reference potential, and $E_F$ represents the Fermi energy. When the Fermi energy is 0 eV, the Fermi energy corresponds to VBM. The chemical potential depends on the environment. Thus, the upper limit of the chemical potential of oxygen ($\mu_O$), which corresponds to an oxygen-rich condition, was set at half of the total energy of an oxygen molecule. The chemical potential of hydrogen ($\mu_H$) under such a condition was set at half of a value obtained by subtracting the chemical potential of oxygen from the total energy of a water molecule.

Note that the oxygen-rich condition is, for example, a condition where oxygen easily enters an oxygen vacancy when the oxygen vacancy is generated, that is, formation of an oxygen vacancy is prevented.

On the other hand, the chemical potential of hydrogen ($\mu_H$) under a hydrogen-rich condition was set at half of the total energy of a hydrogen molecule. The chemical potential of oxygen under the hydrogen-rich condition was the lower limit (oxygen-poor condition), which was obtained by subtracting a value twice as large as $\mu_H$ from the total energy of a water molecule.

Note that the oxygen-poor condition is a condition where formation of an oxygen vacancy is promoted when the oxygen vacancy is generated.

<1-c: Transition Level of Defect>

A level involving transition to a different charge state, which is also called a transition level, exists in a band gap depending on the kind of defect. This causes capture or release of carriers depending on the depth of the level and the position of the Fermi level. The transition level ($\in(q/q')$) of the defect D was calculated from Equation (3).

[Equation 3]

$$\varepsilon(q/q') = \frac{E_{form}(D^q) - E_{form}(D^{q'})}{q' - q}$$

A value obtained from Equation (3) corresponds to the transition level when the valence band maximum is set to 0.0 eV. In other words, a value obtained by subtracting the transition level from the band gap equals the depth from the conduction band minimum (CBM). When the Fermi level is closer to the valence band than ($\in(q/q')$), the defect is stable in the charge state q. In contrast, when the Fermi level is closer to the conduction band than ($\in(q/q')$), the defect is stable in the charge state q'.

<1-d: Diffusion of Atoms>

Next, a pathway and an activation barrier in a diffusion process of atoms were investigated by a nudged elastic band (NEB) method. The NEB method is used to search a state in which required energy is the lowest between the initial state and the final state. A calculation for relaxing the atomic coordinates to reduce the force applied to the atoms to 0.5 eV/nm or lower was performed.

<1-e: Structure for Calculation>

Figure 26:
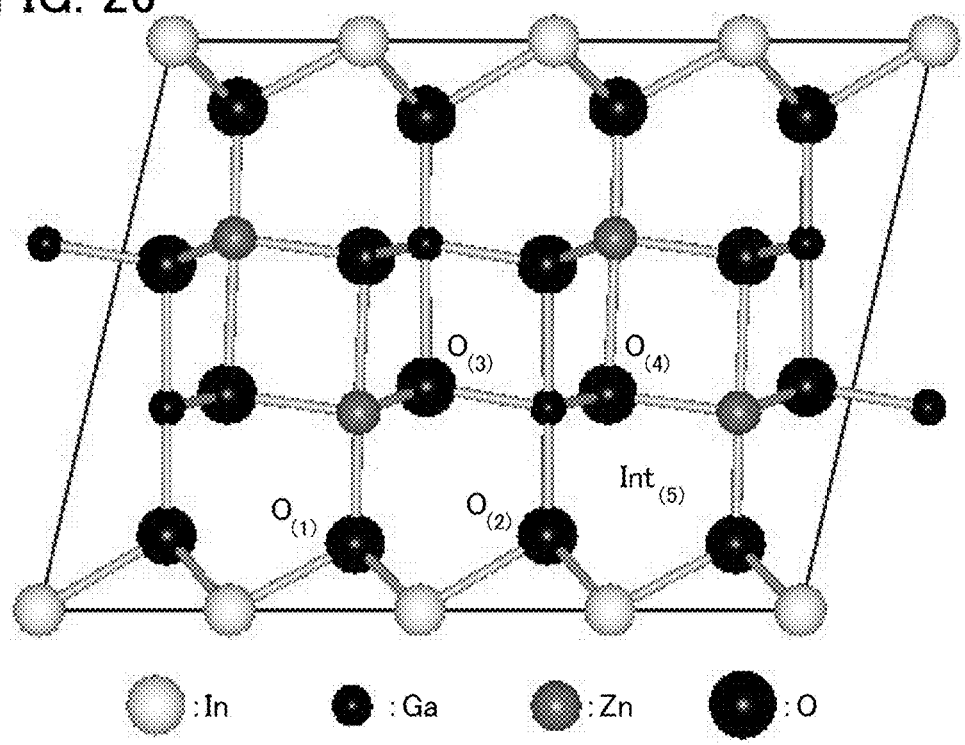
FIG. 26 illustrates a crystal structure of $InGaZnO_4$.

In general, a cell that includes a defect is formed such that one defect exists in a perfect crystal. To set a three-dimensional periodic boundary condition, the distance between defects, i.e., the lattice size needs to be increased in order to reduce the interaction between the defects. In an InGaO$_3$(ZnO)$_m$ crystal that has a homologous structure, the lattice constant a (and b) is much smaller than the lattice constant c. For that reason, rendering the lattice sizes in the a-axis direction and the b-axis direction substantially equal to the lattice constant c causes an extremely large number of atoms. Thus, a super cell (InGaZnO$_4$) with 112 atoms was prepared (see FIG. 26). The super cell was obtained by setting the lattice vectors at (420), (040) and (211) when m=1 and then reducing the lattice constant c to one-third. In that case, the distance between defects can be 0.8 nm or more in the direction of the shortest axis.

In InGaO$_3$(ZnO)$_m$ (m=1), two layers formed of Ga, Zn, and O (i.e., (Ga, Zn)O layers) exist between InO$_2$ layers. The arrangement of Ga and Zn in the two layers is determined such that the energy becomes the lowest. In that case, there are four types of oxygen sites, which are represented by O$_{(1)}$ to O$_{(4)}$ in FIG. 26, depending on the combination of the metal atoms closest to oxygen. The four sites are specifically, an O site (O$_{(1)}$) that is bonded to three In atoms and one Zn atom, an O site (O$_{(2)}$) that is bonded to three In atoms and one Ga atom, an O site (O$_{(3)}$) that is bonded to one Ga atom and two Zn atoms in the a-b plane direction, and an O site (O$_{(4)}$) that is bonded to two Ga atoms and one Zn atom in the a-b plane direction.

The lattice constant and the atomic coordinates of the perfect crystal were optimized by using GGA or the HSE functional. Table 2 shows the obtained lattice constants and band gaps. Table 2 also shows the lattice constants and the band gap obtained by an experiment for comparison. Compared to the experimental values, the lattice constants are overestimated and the band gap is underestimated when GGA is used. When the HSE functional is used, the lattice constants and the band gap are close to the experimental values. Note that a slight difference between the lattice constants a and b obtained by the calculation is attributed to the arrangement of Ga and Zn.

TABLE 2

|  | a [Å] | b [Å] | c [Å] | Band Gap [eV] |
|---|---|---|---|---|
| GGA | 3.337 | 3.372 | 26.260 | 1.10 |
| HSE | 3.300 | 3.327 | 25.868 | 3.08 |
| Experimental data |  | 3.295 | 26.071 | 3.15 |

<2-a: Site where $V_O$ is Likely to be Formed>

To investigate the influence of the coexistence of $V_O$ and hydrogen, findings of on $V_O$ and Hydrogen Needs to be Obtained First.

First, a site where $V_O$ is likely to be formed was investigated. A cell including $V_O$ was prepared by removing one oxygen atom from a perfect crystal, and relaxation of atomic arrangement was performed using the HSE functional. Table 3 shows the formation energies of $V_O$ calculated under oxygen-rich condition.

TABLE 3

| Oxygen site | $n_{In}$ | $n_{Ga}$ | $n_{Zn}$ | Formation energy [eV] | $\epsilon$ (2+/+) [eV] | $\epsilon$ (+/0) [eV] | $\epsilon$ (2+/0) [eV] |
|---|---|---|---|---|---|---|---|
| $O_{(1)}$ | 3 | 0 | 1 | 3.87 | 2.24 | 2.28 | 2.26 |
| $O_{(2)}$ | 3 | 1 | 0 | 4.09 | 2.47 | 2.69 | 2.56 |
| $O_{(3)}$ | 0 | 1 | 2 | 3.85 | 2.42 | 2.17 | 2.29 |
| $O_{(4)}$ | 0 | 2 | 1 | 4.27 | 2.34 | 2.14 | 2.24 |

In Table 3, $n_M$ represents the coordination number of a metal atom M (=In, Ga, and Zn) adjacent to oxygen.

The formation energy of $V_O$ in $O_{(1)}$ is lower than that in $O_{(2)}$. The oxygen atoms in $O_{(1)}$ and $O_{(2)}$ are each a tetracoordinate oxygen atom and bonded to three In atoms. The other bonding partner is Zn in $O_{(1)}$, and the other bonding partner is Ga in $O_{(2)}$. If this difference is a significant factor for the difference in the formation energy, it is assumed that Ga is more strongly bonded to oxygen than Zn. In addition, the formation energy of $V_O$ in $O_{(3)}$ is lower than that in $O_{(4)}$. The number of bonded Ga atoms in the a-b plane direction in $O_{(3)}$ is smaller than that in $O_{(4)}$; consequently, the bond between Ga and O is strong in $O_{(3)}$. Thus, $V_O$ is probably likely to be formed in $O_{(1)}$ and $O_{(3)}$ where the coordination number of Ga is small.

The transition levels of $V_O$ are shown in Table 3. In $O_{(3)}$ and $O_{(4)}$, the $\in$(2+/+) transition level of $V_O$ is closer to the conduction band than the $\in$(+/0) transition level. In $O_{(1)}$, the $\in$(2+/+) transition level of $V_O$ is substantially equal to the $\in$(+/0) transition level. This indicates that when the Fermi level is shifted from the valence band side to the conduction band side, the transition from $V_O^{2+}$ to $V_O^0$ occurs without passing through $V_O^+$. That is, $V_O$ exhibits negative-U behavior as in the case of ZnO. Furthermore, the $\in$(2+/0) transition levels of $V_O$ in $O_{(1)}$ and $O_{(3)}$ where the formation energies are low are as deep as approximately 0.8 eV below the conduction band minimum (the Fermi energy: 3.15 eV).

This indicates that $V_O$ in IGZO is a deep-level donor. The results agree with results of an $InGaO_3(ZnO)_m$ crystal (m=3).

<2-b: Existing Form of Hydrogen>

Next, existing forms of hydrogen were examined. In IGZO, hydrogen exists in three possible modes: a hydrogen atom in an interstitial site; a hydrogen molecule in an interstitial site; and hydrogen bonded to oxygen. In view of this, three cells were prepared: a cell in which a hydrogen atom ($H_{oct}$) was arranged at an octahedral interstitial site ($Int_{(5)}$ in FIG. 26) between the $InO_2$ layer and the (Ga, Zn)O layer; a cell in which a hydrogen molecule (($H_2)_{oct}$) was arranged at an octahedral interstitial site ($Int_{(5)}$ in FIG. 26) between the $InO_2$ layer and the (Ga, Zn)O layer; and a cell in which a hydrogen atom (bonded-H) was bonded to an oxygen atom of the Ga—O bond parallel to the c-axis on the side opposite to Ga. Atomic relaxation was performed using the HSE functional.

Figure 27A:
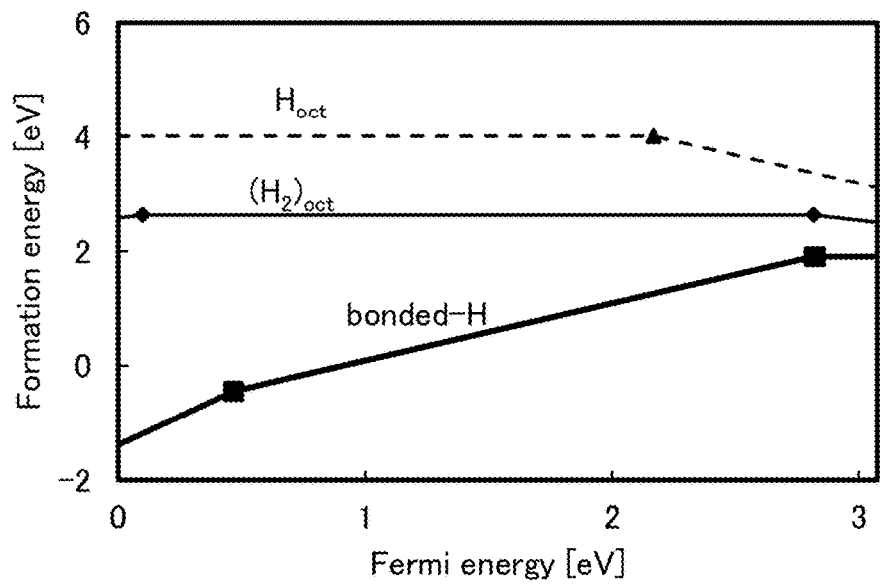
FIGS. 27A and 27B each show formation energies of defects due to hydrogen.
Figure 27B:
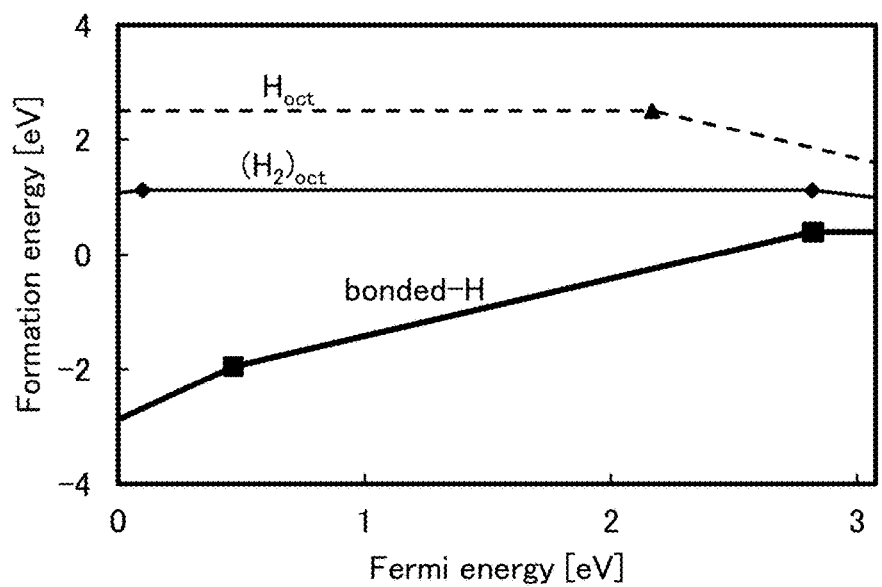

FIGS. 27A and 27B show changes in formation energy with respect to the Fermi energy. FIG. 27A shows the formation energies calculated under the oxygen-rich condition, and FIG. 27B shows the formation energies calculated under the oxygen-poor condition. For comparison of the formation energy per hydrogen atom, a half value of the formation energy of $(H_2)_{oct}$ is shown in each of FIGS. 27A and 27B. A Fermi energy of 0 eV corresponds to VBM, and a Fermi energy of 3.15 eV corresponds to CBM. In FIGS. 27A and 27B, a straight line with no slope indicates that the charge state of each defect is neutral, a straight line with a negative slope indicates that the charge state is negative, and a straight line with a positive slope indicates that the charge state is positive.

The hydrogen molecule $(H_2)_{oct}$ was neutrally charged from VBM to less than 2.82 eV and was negatively charged from greater than or equal to 2.82 eV to CBM.

The hydrogen molecule $H_{oct}$ was neutrally charged from VBM to less than 2.17 eV and was negatively charged from greater than or equal to 2.17 eV to CBM. Note that no stable $H_{oct}^+$ was observed.

The hydrogen atom (bonded-H) bonded to the oxygen atom was positively charged from VBM to less than 2.82 eV and was neutrally charged from greater than or equal to 2.82 eV to CBM.

The results of comparison of the formation energies indicate that hydrogen in IGZO is likely to exist stably as a hydrogen atom (bonded-H) bonded to an oxygen atom in all regions in the band gap regardless of the oxygen condition.

<2-c: Stable Structure for Coexistence of $V_O$ and H>

In Sections 2-a and 2-b, the stabilities of $V_O$ and hydrogen were examined individually. When $V_O$ and a hydrogen atom coexist in one cell, a state where $V_O$ and the hydrogen atom separately exist, and a state where the hydrogen atom is trapped in $V_O$ ($V_OH$) are considered. Here, which of the two states was more stable was determined.

Figure 28:
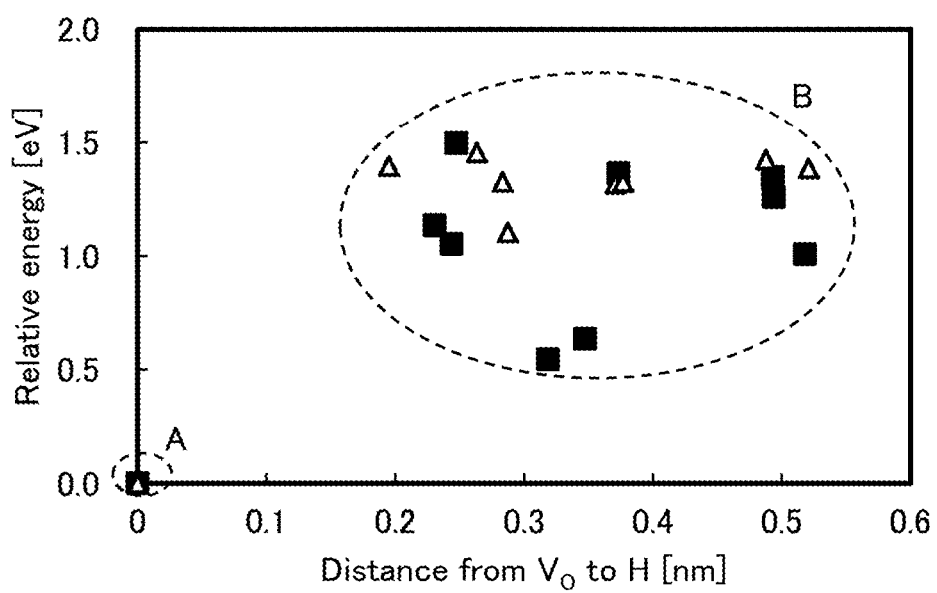
FIG. 28 shows relative energy to the $V_O$-H distance.

Cells where $V_O$ was located in $O_{(1)}$ and one hydrogen atom was located at any position and cells where $V_O$ was located in $O_{(3)}$ and one hydrogen atom was located at any position were prepared. Atomic relaxation was performed on each cell. Here, GGA was used for an exchange-correlation potential. In FIG. 28, relative values of the total energy are plotted as with respect to the distance from the center of $V_O$ to the hydrogen atom. Note that the center of $V_O$ corresponds to the position of the bonded oxygen atom before being released. The energy when a hydrogen atom entered $V_O$ ($V_OH$), i.e., when the distance is 0 nm, is used as a reference of the energy. In FIG. 28, a square represents the case where $V_O$ existed in $O_{(1)}$, and a triangle represents the case where $V_O$ existed in $O_{(3)}$. Relative values of the energies of cells where one hydrogen atom entered $V_O$ are surrounded by a dashed line A, and relative values of the energies of cells where one hydrogen atom was arranged near various oxygen atoms are surrounded by a dashed line B. The calculation results reveal that $V_OH$ was more stable than when $V_O$ and the hydrogen atom existed separately because the plotted energy surrounded by the dashed line A is lower than that surrounded by the dashed line B in both $O_{(1)}$ and $O_{(3)}$.

The bonding energy ($E_b$) was calculated from Equation (4) in order to examine which of the two states where $V_O$ and a hydrogen atom separately existed and where a hydrogen atom entered $V_O$ ($V_OH$) was more stable by a method different from the above calculation using GGA. Here, the HSE functional was used for an exchange-correlation potential.

[Equation 4]

$$E_b = E_{form}(V_O) + E_{form}(\text{bonded-H}) - E_{form}(V_OH) \quad (4)$$

In Equation (4), $E_{form}(V_O) + E_{form}(\text{bonded-H})$ is the formation energy in the state where $V_O$ and a hydrogen atom separately exist, and $E_{form}(V_OH)$ is the formation energy in the state where a hydrogen atom enters $V_O$ ($V_OH$).

Figure 31A:
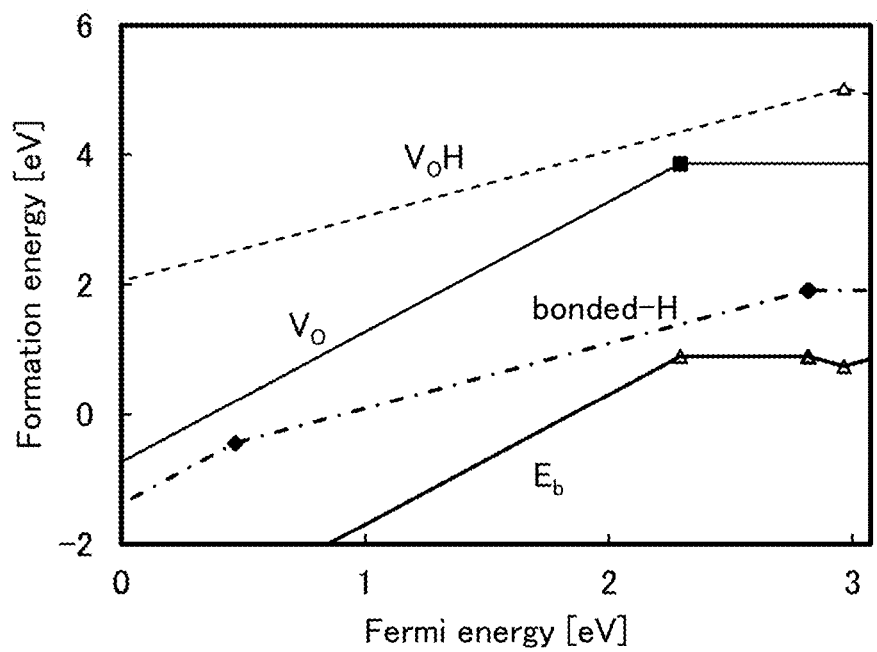
FIGS. 31A and 31B each show formation energies of defects due to hydrogen.
Figure 31B:
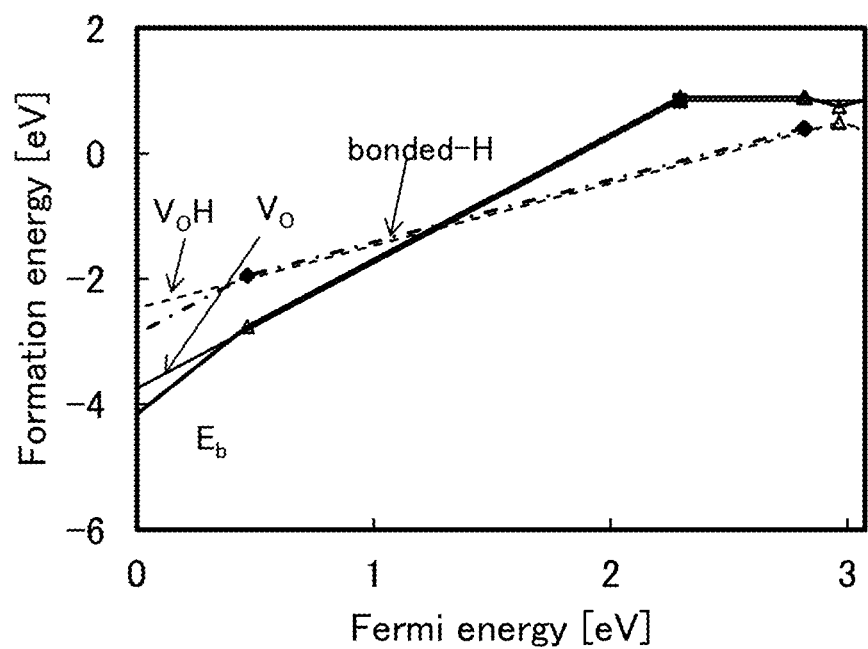

In FIGS. 31A and 31B, the formation energy of $V_O$ existing in $O_{(3)}$, which is represented by a thin solid line, the formation energy of a hydrogen atom (bonded-H) bonded to an oxygen atom, which is represented by a dashed-dotted line, the formation energy of $V_OH$ formed in $O_{(3)}$, which is represented by a dashed line, and the bonding energy (Eb), which is represented by a thick solid line, were plotted as a function of the Fermi energy. FIGS. 31A and 31B show results of calculations performed under the oxygen-rich condition and the oxygen-poor condition, respectively.

According to Equation (4), when the bonding energy $E_b$ is positive, the state where a hydrogen atom enters $V_O$ ($V_OH$) is stable. In FIGS. 31A and 31B, when the Fermi level is greater than or equal to 1.85 eV, $E_b$ is positive. In consideration of high carrier concentration, the Fermi level is close to the conduction band minimum and is greater than or equal to 1.85 eV. Thus, the state where a hydrogen atom enters $V_O$ ($V_OH$) is more stable than the state where a hydrogen atom and $V_O$ separately exist.

As shown in FIG. 28, when $V_O$ and a hydrogen atom coexist, they are stable in the form of $V_OH$. However, if a hydrogen atom in $V_OH$ is easily released from $V_O$, the hydrogen atom diffuses throughout a film without remaining in $V_O$. Thus, the diffusion pathway in which a hydrogen atom in $V_OH$ is released from $V_O$ to be bonded to oxygen near $V_O$ and the associated activation barrier were investigated by the NEB method. Here, GGA was used for an exchange-correlation potential.

Here, the initial state was defined by a cell including $V_OH$, and the final state was defined by a cell including $V_O$ and a hydrogen atom bonded to an oxygen atom near $V_O$ (i.e., the state where the hydrogen atom and $V_O$ separately exist in the calculation in FIG. 28). The activation barrier was calculated by subtracting the initial state or final state energy from the highest energy in the pathway. FIGS. 29A and 29B show pathways through which hydrogen is released from $V_O$ and changes in energy. In $O_{(1)}$, pathways A and B were assumed as diffusion pathways through which hydrogen is released from $V_O$ (see FIG. 29A). Calculation of the activation barriers of the pathways revealed that the activation barrier of the pathway A was 1.52 eV, which was lower than that of the pathway B.

In $O_{(3)}$, pathways C and D were assumed as diffusion pathways through which hydrogen is released from $V_O$ (see FIG. 29B). Calculation of the activation barriers of the pathways revealed that the activation barrier of the pathway C was 1.61 eV, which was lower than that of the pathway D.

After being released from $V_O$, hydrogen returns to $V_O$ or diffuses to another oxygen. Hydrogen returns to $V_O$ in directions opposite to A and C (A' and C' (see FIGS. 30A to 30C)). Pathways E and F through which hydrogen diffuses to another oxygen were calculated by the NEB method by setting the final states of the pathways A and C as the initial states. FIGS. 30A to 30C show the diffusion pathways and changes in energy.

The activation barriers of the pathways A', C', E, and F were 0.46 eV, 0.34 eV, 0.38 eV, and 0.03 eV, respectively.

Next, from the activation barriers obtained as described above, the reaction frequency Γ of hydrogen diffusion was calculated by Equation (5).

[Equation 5]

$$\Gamma = \nu \exp(-E_a/k_B T) \quad (5)$$

In Equation (5), ν is a frequency factor, and $E_a$ is an activation barrier.

Table 4 shows the frequency of release of hydrogen from $V_O$, the frequency of hydrogen entering $V_O$, and the frequency of diffusion of hydrogen to another oxygen at 350° C., assuming that ν is $1.0 \times 10^{13}$/sec.

TABLE 4

| Oxygen site | Diffusion pathway of hydrogen | $E_a$ [eV] | Γ (350° C.)[/sec] |
|---|---|---|---|
| Oxygen site $O_{(1)}$ | Release from $V_o$ (A) | 1.52 | $5.52 \times 10^0$ |
| | Enter in $V_o$ (A') | 0.46 | $1.82 \times 10^9$ |
| | Diffusion to another oxygen (E) | 0.38 | $8.30 \times 10^9$ |
| Oxygen site $O_{(3)}$ | Release from $V_o$ (C) | 1.61 | $8.77 \times 10^{-1}$ |
| | Enter in $V_o$ (C') | 0.34 | $1.89 \times 10^{10}$ |
| | Diffusion to another oxygen (F) | 0.03 | $5.64 \times 10^{12}$ |

According to Table 4, in $O_{(1)}$ and $O_{(3)}$, hydrogen enters $V_O$ with a high frequency but is unlikely to be released from $V_O$ at 350° C. That is, once hydrogen enters $V_O$, it is unlikely to be released. Thus, $V_OH$ exists stably.

<2-d: Transition Level of $V_OH$>

As described in Section 2-c, when $V_O$ and H coexist, they exist stably as $V_OH$. In view of this, the transition level of $V_OH$ was calculated. The ∈(+/0) transition level of $V_OH$ was 3.03 eV when $V_OH$ existed in $O_{(1)}$, and the ∈(+/0) transition level of $V_OH$ was 2.97 eV when $V_OH$ existed in $O_{(3)}$. The ∈(+/0) transition level of $V_OH$ in each site is located near the conduction band minimum. This indicates that $V_OH$ is a shallow-level donor. In addition, $V_OH$ acts as a donor; thus, IGZO including $V_OH$ has low resistivity and has conductivity.

Embodiment 8

The semiconductor device of one embodiment of the present invention can be used for display devices, personal computers, or image reproducing devices provided with recording media (typically, devices that reproduce the content of recording media such as digital versatile discs (DVDs) and have displays for displaying the reproduced images). Other examples of electronic appliances that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 17A to 17F illustrate specific examples of these electronic appliances.

Figure 17A:
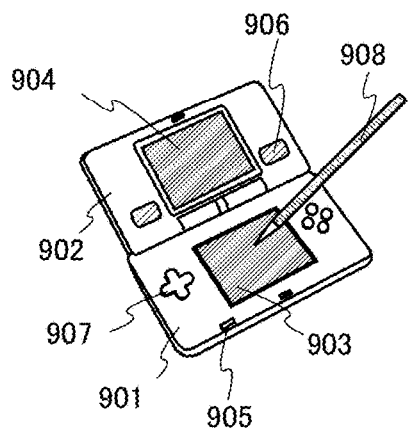
FIGS. 17A to 17F illustrate electronic appliances of an embodiment.

FIG. 17A illustrates a portable game console, which includes a housing 901, a housing 902, a display portion 903, a display portion 904, a microphone 905, a speaker 906, an operation key 907, a stylus 908, and the like. Although the portable game machine in FIG. 17A has the two display portions 903 and 904, the number of display portions included in a portable game machine is not limited to this.

Figure 17B:
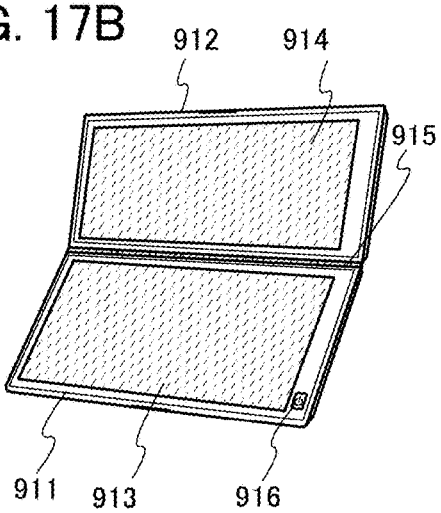

FIG. 17B illustrates a portable data terminal, which includes a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by providing a photoelectric conversion element called a photosensor in a pixel portion of a display device.

Figure 17C:
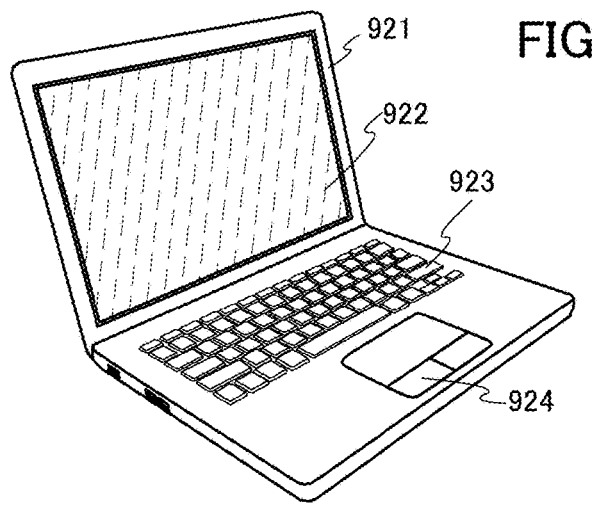

FIG. 17C illustrates a laptop personal computer, which includes a housing 921, a display portion 922, a keyboard 923, a pointing device 924, and the like.

Figure 17D:
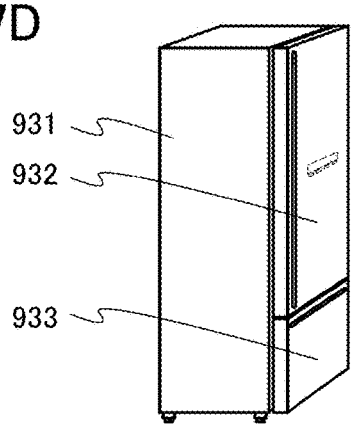

FIG. 17D illustrates an electric refrigerator-freezer, which includes a housing 931, a refrigerator door 932, a freezer door 933, and the like.

Figure 17E:
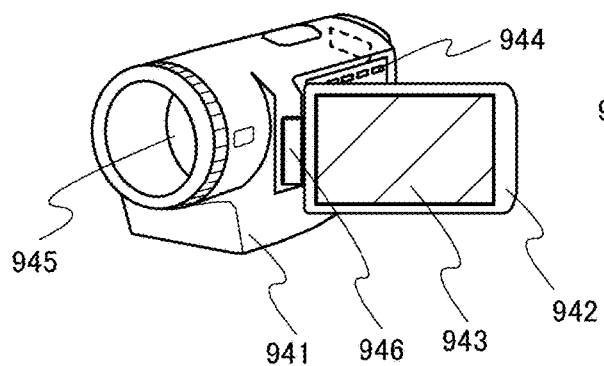

FIG. 17E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 17F:
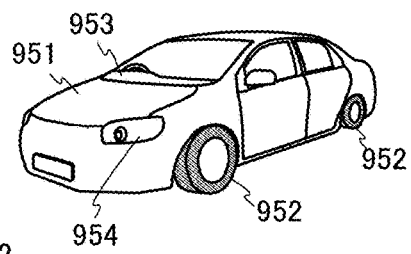

FIG. 17F illustrates a passenger car, which includes a car body 951, wheels 952, a dashboard 953, lights 954, and the like.

At least part of this embodiment can be implemented in combination with any of the other embodiments described in this specification as appropriate.

This application is based on Japanese Patent Application serial No. 2013-253473 filed with the Japan Patent Office on Dec. 6, 2013, Japanese Patent Application serial No. 2014-053865 filed with the Japan Patent Office on Mar. 17, 2014, and Japanese Patent Application serial No. 2014-135737 filed with the Japan Patent Office on Jul. 1, 2014, the entire contents of which are hereby incorporated by reference.

What is claimed is:

1. A semiconductor device comprising:
an oxide semiconductor film;
a gate electrode over the oxide semiconductor film;
a gate insulating film between the oxide semiconductor film and the gate electrode; and
a nitride insulating film over and in contact with the oxide semiconductor film,
wherein the oxide semiconductor film comprises a first region and a second region,
wherein the first region is in contact with the gate insulating film,
wherein the second region is in contact with the nitride insulating film,
wherein the second region contains hydrogen and a rare gas element,
wherein a concentration of the rare gas element in the second region is higher than a concentration of the rare gas element in the first region,
wherein the nitride insulating film contains one of silicon nitride and silicon nitride oxide,
wherein an end portion of the gate insulating film extends beyond an end portion of the gate electrode,
wherein the end portion of the gate insulating film is in contact with the nitride insulating film, and
wherein variation in resistivity of the second region at temperatures from 80 K to 290 K is more than −20% to less than +20%.

2. The semiconductor device according to claim 1, wherein the gate insulating film overlaps a part of the second region.

3. The semiconductor device according to claim 1, wherein the nitride insulating film is in contact with a side surface of the gate electrode.

4. The semiconductor device according to claim 1, wherein each of the first region and the second region contains the rare gas element.

5. The semiconductor device according to claim 1, wherein the rare gas element is argon.

6. The semiconductor device according to claim 1, wherein the gate electrode contains elements constituting the oxide semiconductor film.

7. The semiconductor device according to claim 1, wherein the gate electrode contains an oxide semiconductor.

8. The semiconductor device according to claim 1, wherein the oxide semiconductor film contains an In—Ga—Zn oxide.

9. The semiconductor device according to claim 1, wherein the oxide semiconductor film comprises a crystal whose c-axis is aligned in a direction substantially perpendicular to a top surface of the oxide semiconductor film, and
wherein the crystal is a non-single-crystal.

10. A semiconductor device comprising:
an oxide semiconductor film;
a gate electrode overlapping the oxide semiconductor film;
a gate insulating film between the oxide semiconductor film and the gate electrode;
a nitride insulating film in contact with the oxide semiconductor film; and
a conductive film in contact with the oxide semiconductor film, wherein the oxide semiconductor film comprises a first region and a second region,
wherein the first region is in contact with the gate insulating film,
wherein the second region is in contact with the nitride insulating film and the conductive film,
wherein the second region contains hydrogen and a rare gas element,
wherein a concentration of the rare gas element in the second region is higher than a concentration of the rare gas element in the first region,
wherein the gate electrode has a first taper shape,
wherein the gate insulating film has a second taper shape,
wherein an angle of the first taper shape is different from an angle of the second taper shape, and
wherein variation in resistivity of the second region at temperatures from 80 K to 290 K is more than −20% to less than +20%.

11. The semiconductor device according to claim 10,
wherein the gate insulating film overlaps a part of the second region.

12. The semiconductor device according to claim 10,
wherein the nitride insulating film is in contact with a side surface of the gate electrode.

13. The semiconductor device according to claim 10,
wherein each of the first region and the second region contains the rare gas element.

14. The semiconductor device according to claim 10,
wherein the rare gas element is argon.

15. The semiconductor device according to claim 10,
wherein the nitride insulating film is a silicon nitride film.

16. The semiconductor device according to claim 10,
wherein the gate electrode contains elements constituting the oxide semiconductor film.

17. The semiconductor device according to claim 10,
wherein the gate electrode contains an oxide semiconductor.

18. The semiconductor device according to claim 10,
wherein the oxide semiconductor film contains an In—Ga—Zn oxide.

19. The semiconductor device according to claim 10,
wherein the oxide semiconductor film comprises a crystal whose c-axis is aligned in a direction substantially perpendicular to a top surface of the oxide semiconductor film, and
wherein the crystal is a non-single-crystal.

20. A semiconductor device comprising:
an oxide semiconductor film comprising a source region, a drain region and a channel region between the source region and the drain region;
a gate electrode over the oxide semiconductor film;
a gate insulating film between the oxide semiconductor film and the gate electrode; and
an insulating film over the oxide semiconductor film,
wherein one of the source region and the drain region contains hydrogen and a rare gas element,
wherein a hydrogen concentration of the insulating film is higher than or equal to $1\times10^{22}$ atoms/cm$^3$,
wherein an end portion of the gate insulating film extends beyond an end portion of the gate electrode,
wherein the end portion of the gate insulating film is in contact with the insulating film, and
wherein variation in resistivity of the one of the source region and the drain region at temperatures from 80 K to 290 K is more than −20% to less than +20%.

21. The semiconductor device according to claim 20,
wherein the rare gas element is argon.

22. The semiconductor device according to claim 20,
wherein a hydrogen concentration of one of the source region and the drain region is higher than or equal to $5\times10^{20}$ atoms/cm$^3$.

* * * * *